US011792982B2

(12) United States Patent
Yang et al.

(10) Patent No.: US 11,792,982 B2
(45) Date of Patent: Oct. 17, 2023

(54) THREE-DIMENSIONAL SEMICONDUCTOR MEMORY DEVICE AND METHOD OF FABRICATING THE SAME

(71) Applicant: Samsung Electronics Co., Ltd., Suwon-si (KR)

(72) Inventors: Woosung Yang, Gwangmyeong-si (KR); Hojun Seong, Suwon-si (KR); Joonhee Lee, Seongnam-si (KR); Joon-Sung Lim, Seongnam-si (KR); Euntaek Jung, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 272 days.

(21) Appl. No.: 17/026,377

(22) Filed: Sep. 21, 2020

(65) Prior Publication Data

US 2021/0225870 A1    Jul. 22, 2021

(30) Foreign Application Priority Data

Jan. 22, 2020   (KR) .......................... 10-2020-0008895

(51) Int. Cl.
| | | |
|---|---|---|
| *H01L 27/11582* | (2017.01) | |
| *H10B 43/27* | (2023.01) | |
| *H01L 23/522* | (2006.01) | |
| *H10B 41/10* | (2023.01) | |
| *H10B 41/27* | (2023.01) | |
| *H10B 41/46* | (2023.01) | |
| *H10B 43/10* | (2023.01) | |
| *H10B 43/40* | (2023.01) | |

(52) U.S. Cl.
CPC .......... *H10B 43/27* (2023.02); *H01L 23/5226* (2013.01); *H10B 41/10* (2023.02); *H10B 41/27* (2023.02); *H10B 41/46* (2023.02); *H10B 43/10* (2023.02); *H10B 43/40* (2023.02)

(58) Field of Classification Search
CPC ......... H01L 27/11582; H01L 27/11565; H01L 27/1157; H01L 27/11573; H01L 27/11556; H10B 43/27; H10B 43/10; H10B 41/27; H10B 41/10; H10B 43/40
See application file for complete search history.

(56) References Cited

U.S. PATENT DOCUMENTS

| | | |
|---|---|---|
| 9,953,992 B1 | 4/2018 | Ogawa et al. |
| 10,269,620 B2 | 4/2019 | Yu et al. |
| 10,290,595 B2 | 5/2019 | Oshiki |

(Continued)

*Primary Examiner* — Tony Tran
(74) *Attorney, Agent, or Firm* — Muir Patent Law, PLLC

(57) ABSTRACT

Disclosed is a semiconductor memory device comprising a second substrate on a first substrate and including a lower semiconductor layer and an upper semiconductor layer on the lower semiconductor layer, an electrode structure on the upper semiconductor layer and including a plurality of stacked electrodes, a vertical channel structure that penetrates the electrode structure and is connected to the second substrate, an interlayer dielectric layer that covers the electrode structure, and a cutting structure that penetrates the interlayer dielectric layer and the upper semiconductor layer. The upper semiconductor layer has a first sidewall defined by the cutting structure. The lower semiconductor layer has a second sidewall adjacent to the first sidewall. The first sidewall and the second sidewall are horizontally offset from each other.

15 Claims, 41 Drawing Sheets

(56) References Cited

U.S. PATENT DOCUMENTS

| | | |
|---|---|---|
| 10,355,013 B2 | 7/2019 | Shim et al. |
| 10,381,373 B2 | 8/2019 | Okizumi et al. |
| 2018/0247951 A1 | 8/2018 | Fujii et al. |
| 2018/0323207 A1 | 11/2018 | Shim et al. |
| 2018/0366487 A1* | 12/2018 | Okizumi ............. H01L 27/1157 |
| 2019/0051599 A1 | 2/2019 | Zhang et al. |
| 2019/0057898 A1 | 2/2019 | Shim et al. |
| 2019/0067308 A1 | 2/2019 | Yun et al. |
| 2019/0198524 A1 | 6/2019 | Fujiki et al. |

* cited by examiner

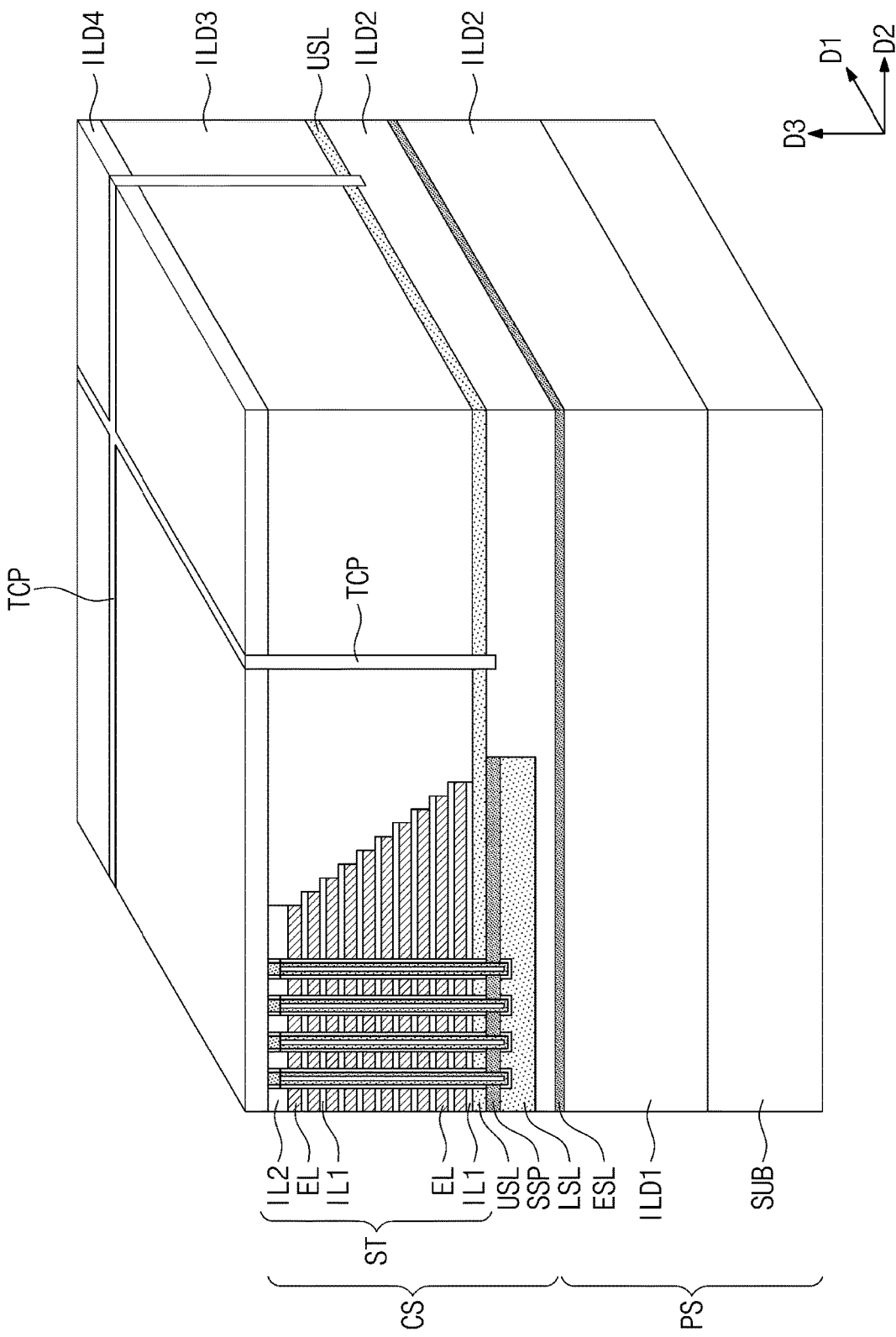

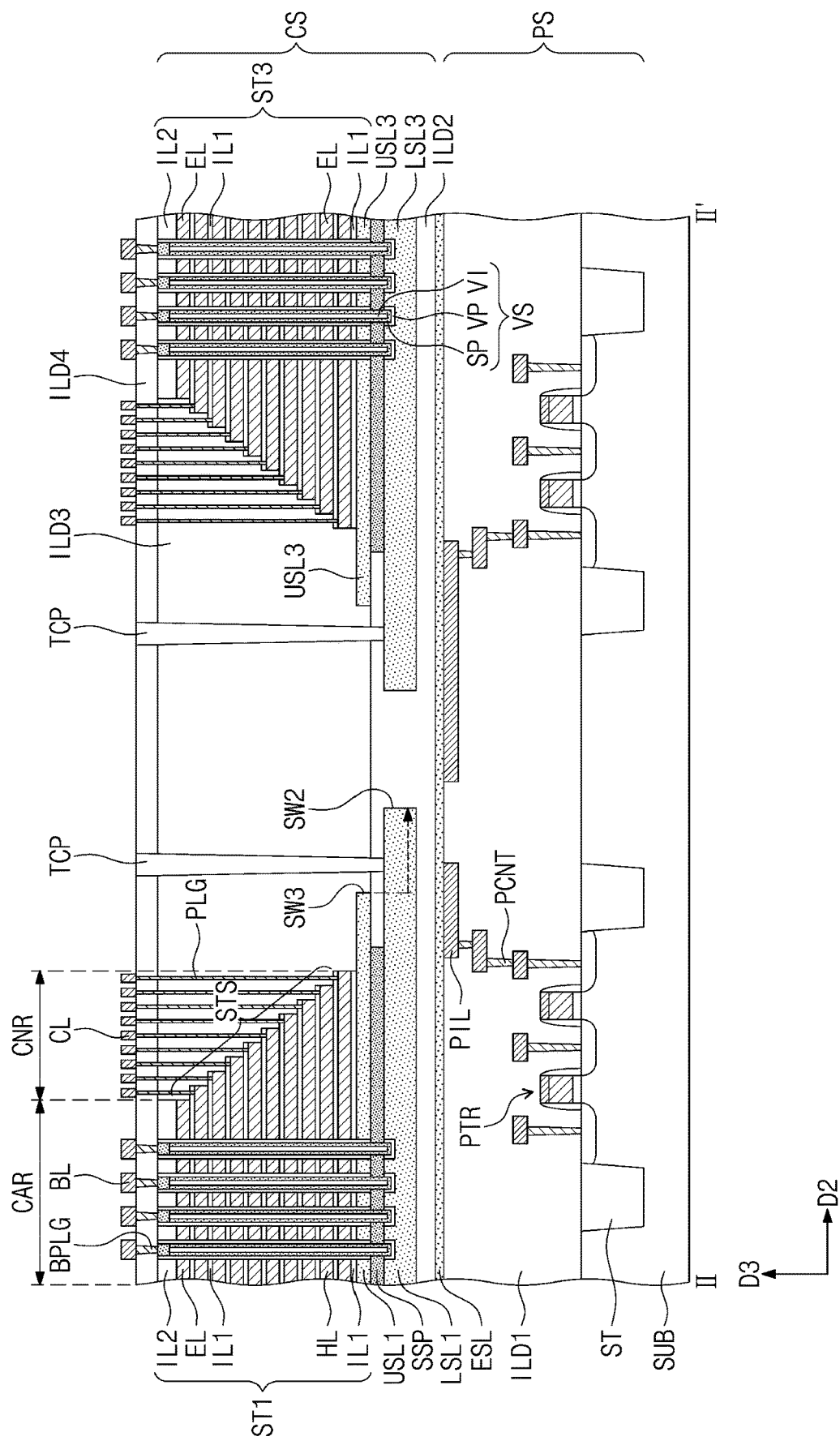

THREE-DIMENSIONAL SEMICONDUCTOR MEMORY DEVICE AND METHOD OF FABRICATING THE SAME

CROSS-REFERENCE TO RELATED APPLICATION

This U.S. nonprovisional application claims priority under 35 U.S.C § 119 to Korean Patent Application No. 10-2020-0008895, filed on Jan. 22, 2020, in the Korean Intellectual Property Office, the disclosure of which is hereby incorporated by reference in its entirety.

BACKGROUND

The present inventive concepts relate to a semiconductor device and a method of fabricating the same, and more particularly, to a three-dimensional semiconductor memory device with increased reliability and a method of fabricating the same.

Semiconductor devices have been highly integrated for satisfying high performance and low manufacture costs of semiconductor devices which are required by customers. Because integration of semiconductor devices is an important factor in determining product price, highly-integrated semiconductor devices are increasingly demanded. Integration of typical two-dimensional or planar semiconductor devices is primarily determined by the area occupied by a unit memory cell, such that it is greatly influenced by the level of technology for forming fine patterns. However, the extremely expensive processing equipment needed to increase pattern fineness may set a practical limitation on increasing the integration of the two-dimensional or planar semiconductor devices. Therefore, there have been proposed three-dimensional semiconductor memory devices having three-dimensionally arranged memory cells.

SUMMARY

Some example embodiments of the present inventive concepts provide a three-dimensional semiconductor memory device with increased reliability.

Some example embodiments of the present inventive concepts provide a method of fabricating a three-dimensional semiconductor memory device with increased reliability.

According to example embodiments of the present inventive concepts, a semiconductor memory device may comprise: a second substrate on a first substrate, the second substrate including a lower semiconductor layer and an upper semiconductor layer on the lower semiconductor layer; an electrode structure on the upper semiconductor layer, the electrode structure including a plurality of stacked electrodes; a vertical channel structure that penetrates the electrode structure and is connected to the second substrate; an interlayer dielectric layer that covers the electrode structure; and a cutting structure that penetrates the interlayer dielectric layer and the upper semiconductor layer. The upper semiconductor layer may have a first sidewall defined by the cutting structure. The lower semiconductor layer may have a second sidewall adjacent to the first sidewall. The first sidewall and the second sidewall may be horizontally offset from each other.

According to example embodiments of the present inventive concepts, a semiconductor memory device may comprise: a second substrate on a first substrate; a cutting structure that separates the second substrate into a first semiconductor layer and a second semiconductor layer; a first electrode structure and a second electrode structure on the first semiconductor layer and the second semiconductor layer, respectively, each of the first and second semiconductor layers including a plurality of stacked electrodes; a mold structure between the first and second electrode structures, the mold structure including a plurality of stacked sacrificial layers; and a first vertical channel structure and a second vertical channel structure that penetrate the first electrode structure and the second electrode structure, respectively. The stacked sacrificial layers may be located at levels the same as levels of corresponding stacked electrodes. The cutting structure may penetrate the mold structure and the second substrate below the mold structure.

According to example embodiments of the present inventive concepts, a semiconductor memory device may comprise: a peripheral circuit structure on a substrate, the peripheral circuit structure including a peripheral transistor on the substrate, a peripheral line on the peripheral transistor, and a peripheral contact that electrically connects the peripheral transistor to the peripheral line; a lower semiconductor layer on the peripheral circuit structure; an upper semiconductor layer on the lower semiconductor layer; a cutting structure that penetrates the upper semiconductor layer, a bottom surface of the cutting structure being at a vertical level between a bottom surface of the upper semiconductor layer and a bottom surface of the lower semiconductor layer; a source semiconductor layer between the lower semiconductor layer and the upper semiconductor layer; an electrode structure on the upper semiconductor layer, the electrode structure including a plurality of stacked electrodes; a vertical channel structure that penetrates the electrode structure and is electrically connected to the source semiconductor layer; an interlayer dielectric layer that covers the electrode structure; and a through contact that penetrates the interlayer dielectric layer and is electrically connected to the peripheral line. The upper semiconductor layer may have a first sidewall defined by the cutting structure. The through contact may be spaced apart from the first sidewall.

According to example embodiments of the present inventive concepts, a method of fabricating a semiconductor memory device may comprise: forming on a first substrate a first lower semiconductor layer and a second lower semiconductor layer that are spaced apart from each other; forming an upper semiconductor layer on the first and second lower semiconductor layers; forming a mold structure by alternately stacking a plurality of dielectric layers and a plurality of sacrificial layers on the upper semiconductor layer; forming an interlayer dielectric layer that covers the mold structure; forming a vertical channel structure that penetrates the mold structure; forming a first trench that penetrates the mold structure and extends in one direction; allowing a plurality of electrodes to replace the sacrificial layers exposed to the first trench; and forming a cutting structure that penetrates the interlayer dielectric layer and the upper semiconductor layer and separates the upper semiconductor layer into a first upper semiconductor layer and a second upper semiconductor layer. The first upper semiconductor layer may have a first sidewall defined by the cutting structure. The first lower semiconductor layer may have a second sidewall adjacent to the first sidewall. The first sidewall and the second sidewall may be horizontally offset from each other.

BRIEF DESCRIPTION OF THE DRAWINGS

FIG. 7 illustrates a simplified perspective view showing a three-dimensional semiconductor memory device, according to example embodiments of the present inventive concepts.

FIGS. 21A and 21B illustrate cross-sectional views respectively taken along lines I-I' and II-II' of FIG. 20.

DETAILED DESCRIPTION OF EMBODIMENTS

Figure 1:
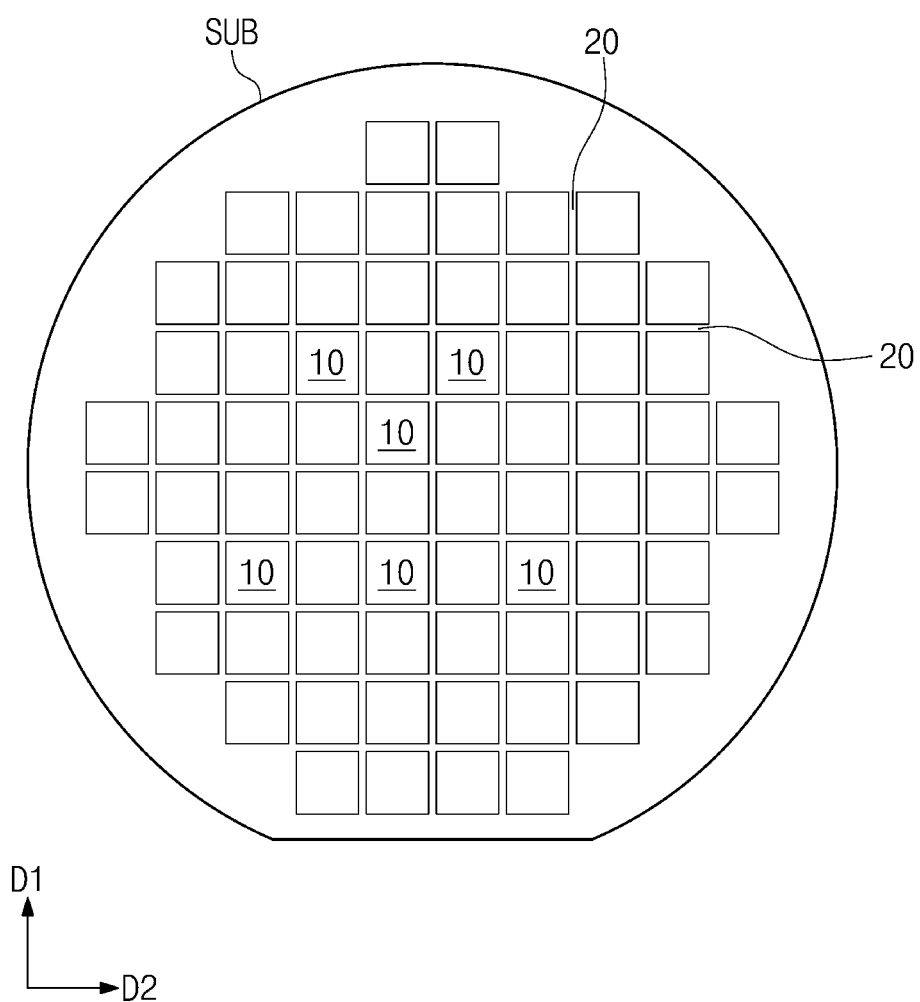
FIG. 1 illustrates a plan view showing a first substrate on which are integrated three-dimensional semiconductor memory devices, according to example embodiments of the present inventive concepts.

FIG. 1 illustrates a plan view showing a first substrate on which are integrated three-dimensional semiconductor memory devices, according to example embodiments of the present inventive concepts. In the drawings, like numbers refer to like elements throughout.

Referring to FIG. 1, a first substrate SUB (e.g., a wafer) may include chip regions 10 on which semiconductor chips are formed and a scribe line region 20 between the chip regions 10. The chip regions 10 may be two-dimensionally arranged along a first direction D1 and a second direction D2 that intersect each other. The scribe line region 20 may surround each of the chip regions 10. For example, the scribe line region 20 may be disposed between the chip regions 10 adjacent to each other in the first direction D1 and between the chip regions 10 adjacent to each other in the second direction D2. The scribe line region 20 may serve as the boundary between adjacent chip regions 10. For example, the scribe line region 20 may be the area in which a semiconductor substrate SUB is cut, thereby allowing the chip regions 10 to be physically separated from one another (e.g., to form separate semiconductor chips).

According to some example embodiments of the present inventive concepts, each of the chip regions 10 included in the first substrate SUB may be provided thereon with a three-dimensional semiconductor memory device including three-dimensionally arranged memory cells.

Figure 2:
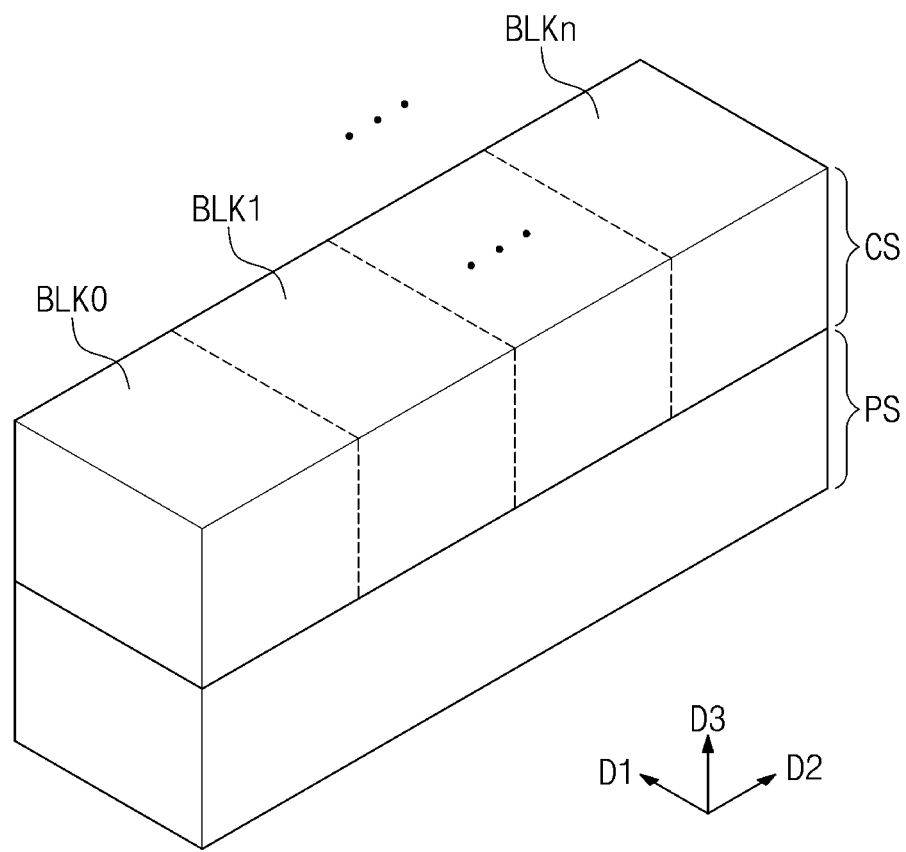
FIG. 2 illustrates a simplified perspective view showing a three-dimensional semiconductor memory device, according to example embodiments of the present inventive concepts.

FIG. 2 illustrates a simplified perspective view showing a three-dimensional semiconductor memory device, according to example embodiments of the present inventive concepts. In example embodiments, the three-dimensional semiconductor device of FIG. 2 may be provided on a chip region 10 of a semiconductor substrate SUB, such as disclosed above in connection with FIG. 1.

Referring to FIG. 2, a three-dimensional semiconductor memory device according to example embodiments of the present inventive concepts may include a peripheral circuit structure PS, a cell array structure CS on the peripheral circuit structure PS, and a through contact (not shown) that vertically penetrates the cell array structure CS and the peripheral circuit structure PS. When viewed in plan, the cell array structure CS and the through contact may overlap the peripheral circuit structure PS.

In some example embodiments of the present inventive concepts, the peripheral circuit structure PS may include row and column decoders, a page buffer, control circuits, and peripheral logic circuits. The peripheral logic circuits of the peripheral circuit structure PS may be integrated on a semiconductor substrate, such as the first substrate SUB of FIG. 1.

The cell array structure CS may include a cell array including a plurality of three-dimensionally arranged memory cells. For example, the cell array structure CS may include a plurality of memory blocks BLK0 to BLKn. Each of the memory blocks BLK0 to BLKn may be a data erase unit (e.g., the smallest unit of memory that can be erased in a single erase operation). Each of the memory blocks BLK0 to BLKn may include three-dimensionally arranged memory cells.

Figure 3:
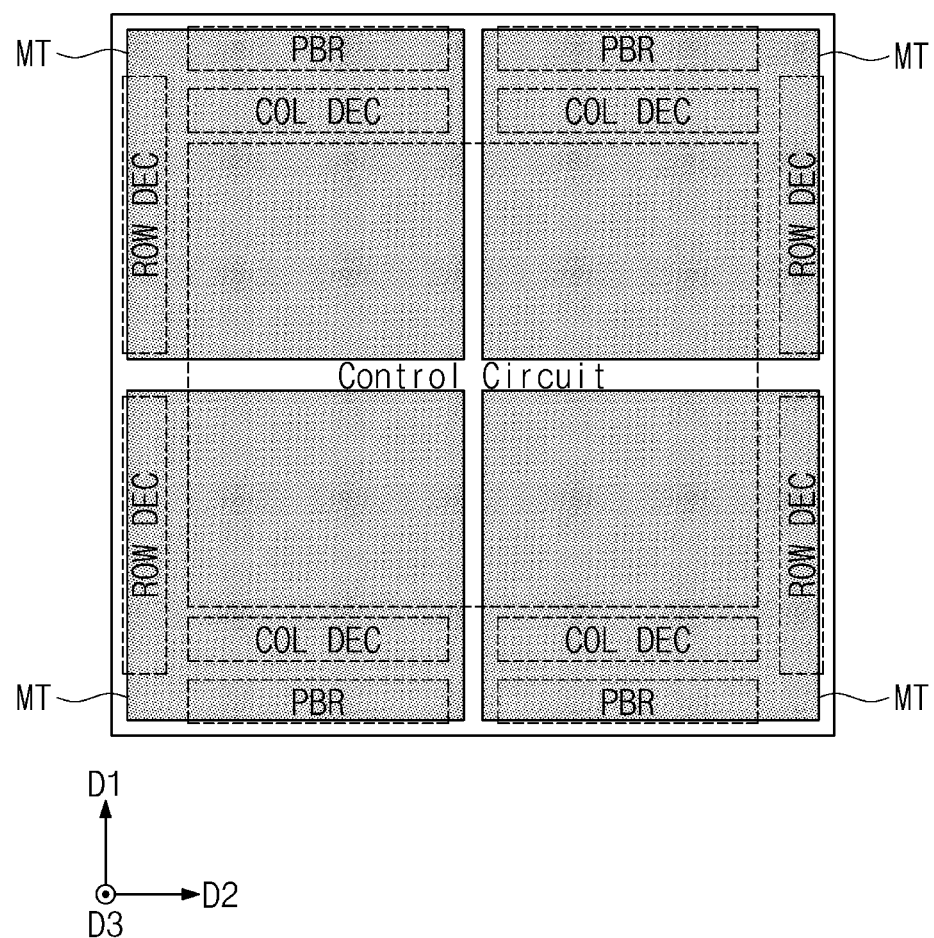
FIG. 3 illustrates a simplified plan view showing a three-dimensional semiconductor memory device, according to example embodiments of the present inventive concepts.

FIG. 3 illustrates a simplified plan view showing a three-dimensional semiconductor memory device, according to example embodiments of the present inventive concepts.

Referring to FIGS. 1 and 3, each of the chip regions 10 of the first substrate SUB may be provided thereon with the peripheral circuit structure PS and the cell array structure CS that are discussed above with reference to FIG. 2.

Each of the chip regions 10 may be provided thereon with the peripheral circuit structure (see peripheral circuit structure PS of FIG. 2) constituted by row and column decoders ROW DEC and COL DEC, page buffers PBR, and control circuits CTRL.

The chip region 10 may be provided thereon with a plurality of mats MT that constitute the cell array structure (see cell array structure CS of FIG. 2). The plurality of mats MT may be arranged along the first and second directions D1 and D2. Each of the mats MT may include the memory blocks BLK0 to BLKn discussed above with reference to FIG. 2.

A plurality of mats MT may be disposed to overlap the peripheral circuit structure (see peripheral circuit structure PS of FIG. 2). According to some example embodiments of the present inventive concepts, peripheral logic circuits of the peripheral circuit structure (see peripheral circuit structure PS of FIG. 2) may be freely disposed below the mats MT.

Figure 4:
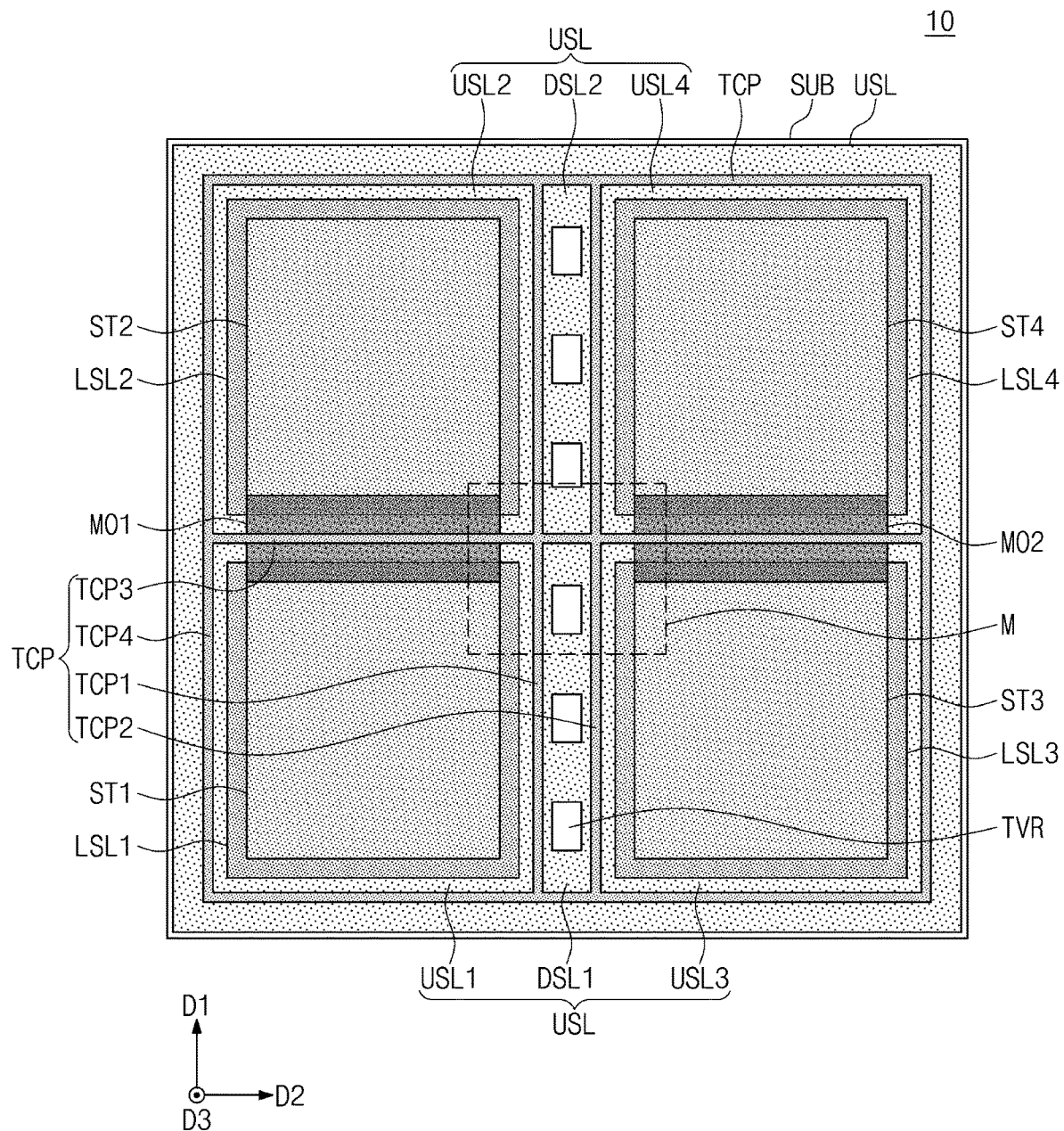
FIG. 4 illustrates a simplified plan view showing a cell array structure of a three-dimensional semiconductor memory device, according to example embodiments of the present inventive concepts.

FIG. 4 illustrates a simplified plan view showing a cell array structure of a three-dimensional semiconductor memory device according to example embodiments of the present inventive concepts.

Referring to FIG. 4, first to fourth lower semiconductor layers LSL1 to LSL4 may be provided on the first substrate SUB of the chip region 10. The first to fourth lower semiconductor layers LSL1 to LSL4 may be two-dimensionally arranged in the first and second directions D1 and D2. The first to fourth lower semiconductor layers LSL1 to LSL4 may be spaced apart from each other.

For example, the second lower semiconductor layer LSL2 may be adjacent in the first direction D1 to the first lower semiconductor layer LSL1. The third lower semiconductor layer LSL3 may be adjacent in the second direction D2 to the first lower semiconductor layer LSL1. The fourth lower semiconductor layer LSL4 may be adjacent in the second direction D2 to the second lower semiconductor layer LSL2. The fourth lower semiconductor layer LSL4 may be adjacent in the first direction D1 to the third lower semiconductor layer LSL3.

An upper semiconductor layer USL may be provided on the first to fourth lower semiconductor layers LSL1 to LSL4. The upper semiconductor layer USL may include first to fourth upper semiconductor layers USL1 to USL4 that are respectively provided on the first to fourth lower semiconductor layers LSL1 to LSL4. A cutting structure TCP may divide the upper semiconductor layer USL into the first to fourth upper semiconductor layers USL1 to USL4. The first to fourth upper semiconductor layers USL1 to USL4 may be insulated from each other.

For example, the cutting structure TCP may include a fourth cutting structure TCP4 that defines an outer circumference of the first to fourth upper semiconductor layers USL1 to USL4. The cutting structure TCP may further include a first cutting structure TCP1 and a second cutting structure TCP2 that run in the first direction D1 across an inside of the fourth cutting structure TCP4. The first and second cutting structures TCP1 and TCP2 may extend in parallel to each other between the first and third upper semiconductor layers USL1 and USL3. The first and second cutting structures TCP1 and TCP2 may extend in parallel to each other between the second and fourth upper semiconductor layers USL2 and USL4. The cutting structure TCP may further include a third cutting structure TCP3 that runs in the second direction D2 across the inside of the fourth cutting structure TCP4. The third cutting structure TCP3 may extend in the second direction D2 between the first and second upper semiconductor layers USL1 and USL2. The third cutting structure TCP3 may extend in the second direction D2 between the third and fourth upper semiconductor layers USL3 and USL4.

The upper semiconductor layer USL may further include a first dummy semiconductor layer DSL1 and a second dummy semiconductor layer DSL2 that are defined by the cutting structure TCP. The first dummy semiconductor layer DSL1 may be interposed between the first and third upper semiconductor layers USL1 and USL3. For example, the first dummy semiconductor layer DSL1 may be adjacent to the first and third upper semiconductor layers USL1 and USL3. The second dummy semiconductor layer DSL2 may be interposed between the second and fourth upper semiconductor layers USL2 and USL4. For example, the second dummy semiconductor layer DSL2 may be adjacent to the second and fourth upper semiconductor layers USL2 and USL4.

First to fourth electrode structures ST1 to ST4 may be provided on the upper semiconductor layer USL. The first to fourth electrode structures ST1 to ST4 may be respectively provided on the first to fourth upper semiconductor layers USL1 to USL4. Each of the first to fourth electrode structures ST1 to ST4 may be a memory structure including three-dimensionally arranged memory cells. Each of the first to fourth electrode structures ST1 to ST4 may constitute a single mat MT discussed above with reference to FIG. 3. In the example of FIG. 4, the chip region 10 includes four mats MT, but embodiments are not limited thereto.

A first mold structure MO1 may be interposed between the first and second electrode structures ST1 and ST2 that are adjacent to each other in the first direction D1. A second mold structure MO2 may be interposed between the third and fourth electrode structures ST3 and ST4 that are adjacent to each other in the first direction D1.

Through contact regions TVR may be provided between the first and third electrode structures ST1 and ST3 and between the second and fourth electrode structures ST2 and ST4. The through contact regions TVR may be arranged along the first direction D1. The through contact regions TVR may be provided between the first cutting structure TCP1 and the second cutting structure TCP2.

Figure 5:
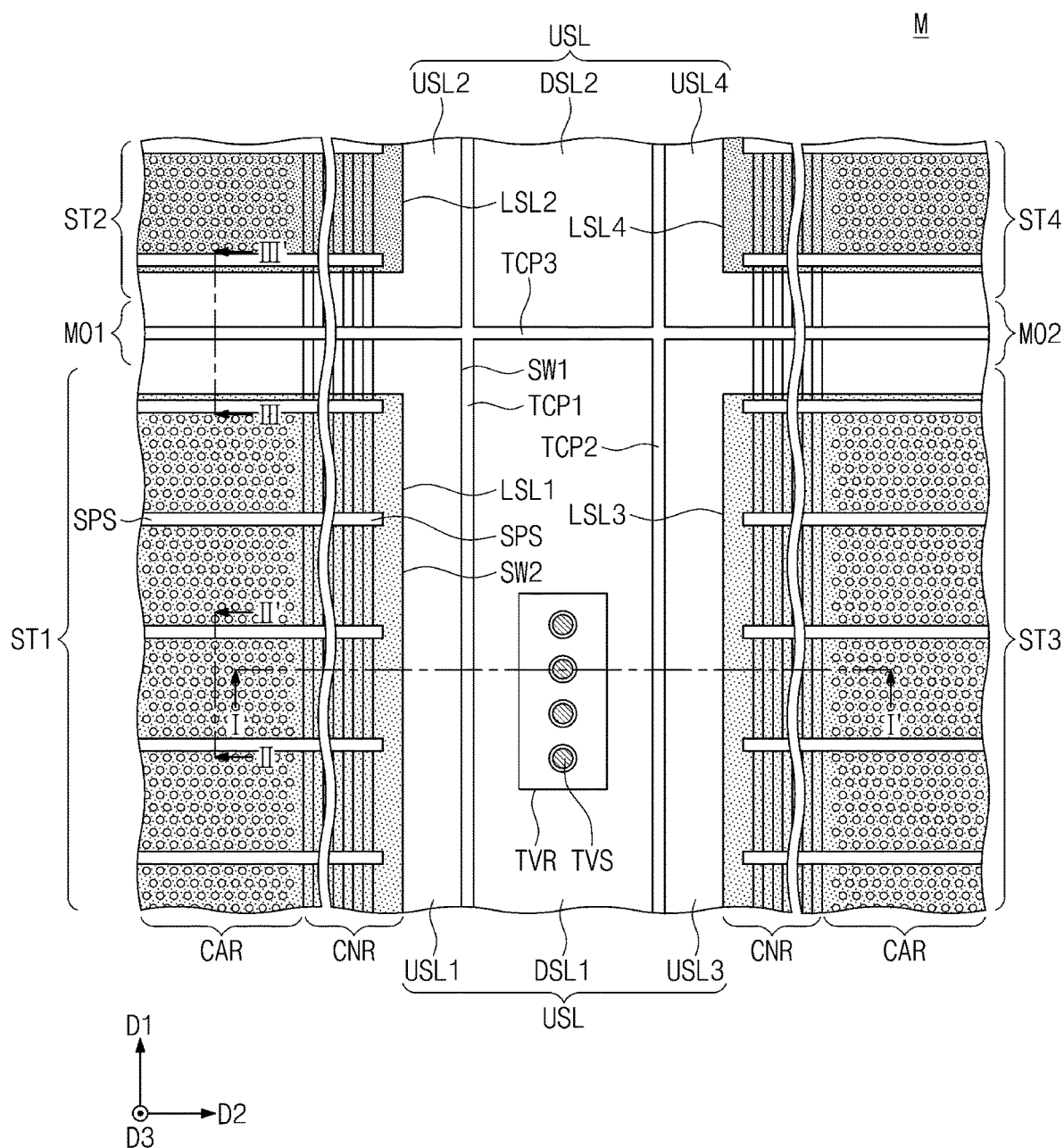
FIG. 5 illustrates an enlarged plan view of section M in FIG. 4, showing a three-dimensional semiconductor memory device, according to example embodiments of the present inventive concepts.
Figure 6A:
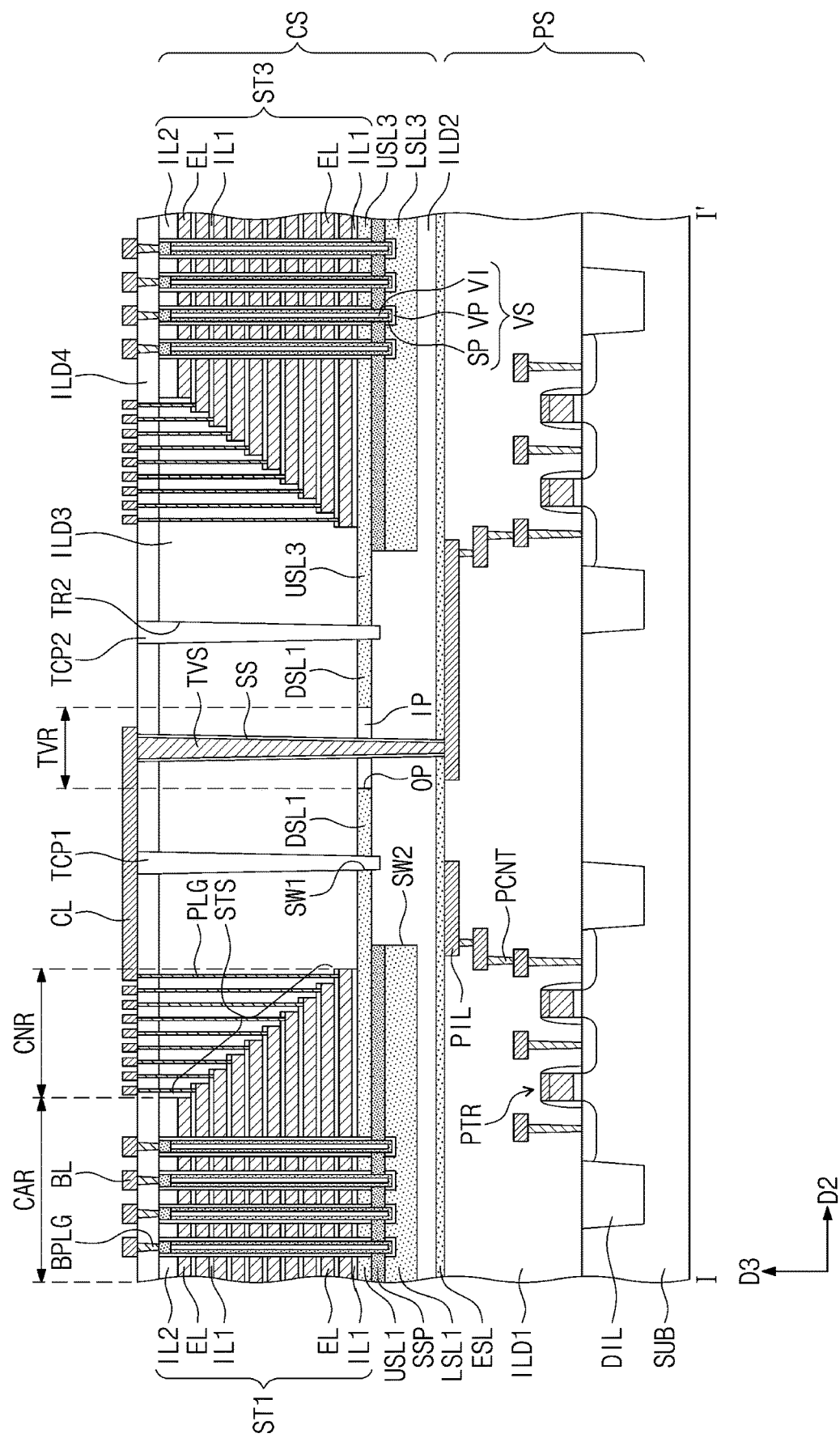
FIGS. 6A, 6B, and 6C illustrate cross-sectional views respectively taken along lines I-I', II-II', and III-III' of FIG. 5.
Figure 6B:
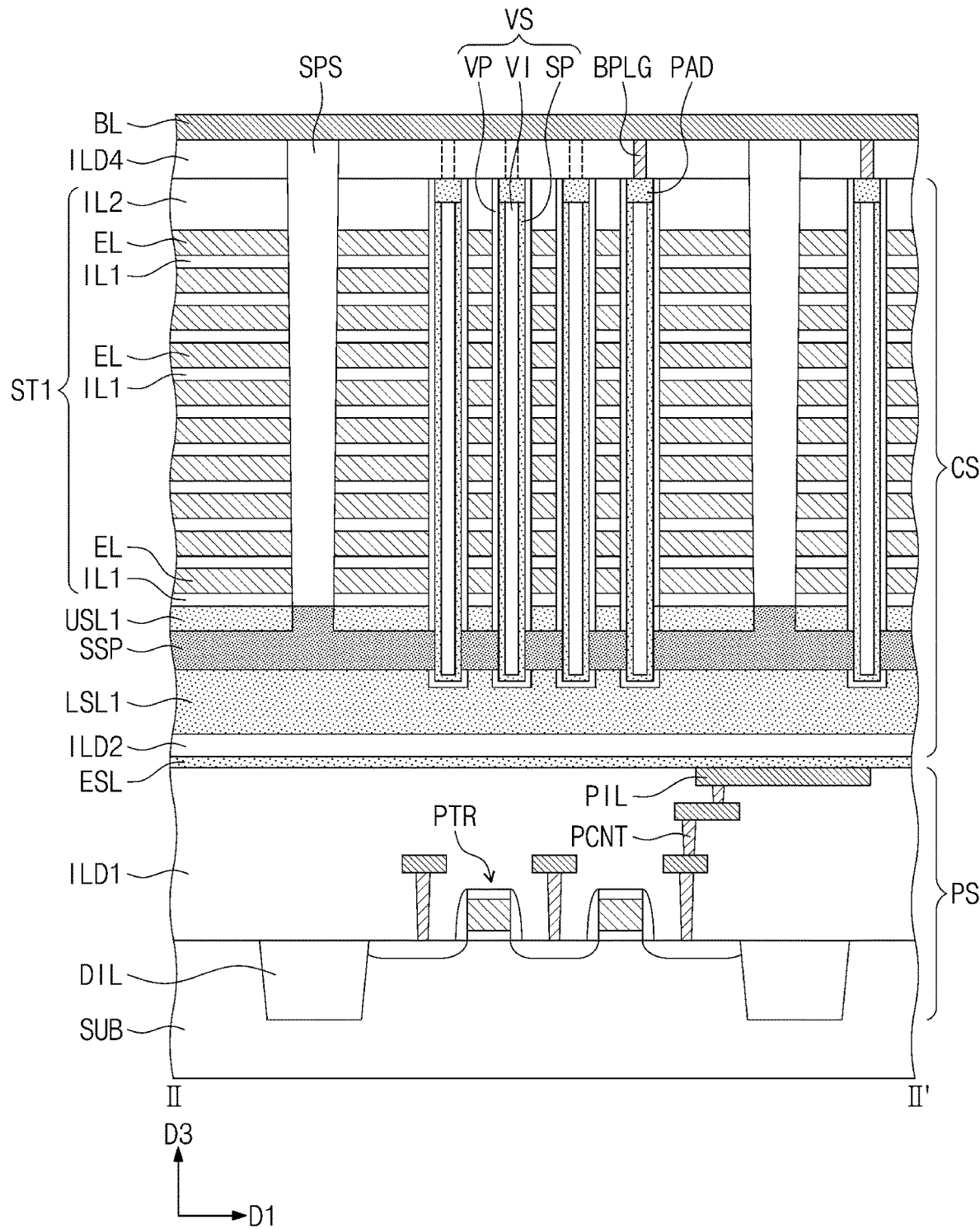
Figure 6C:
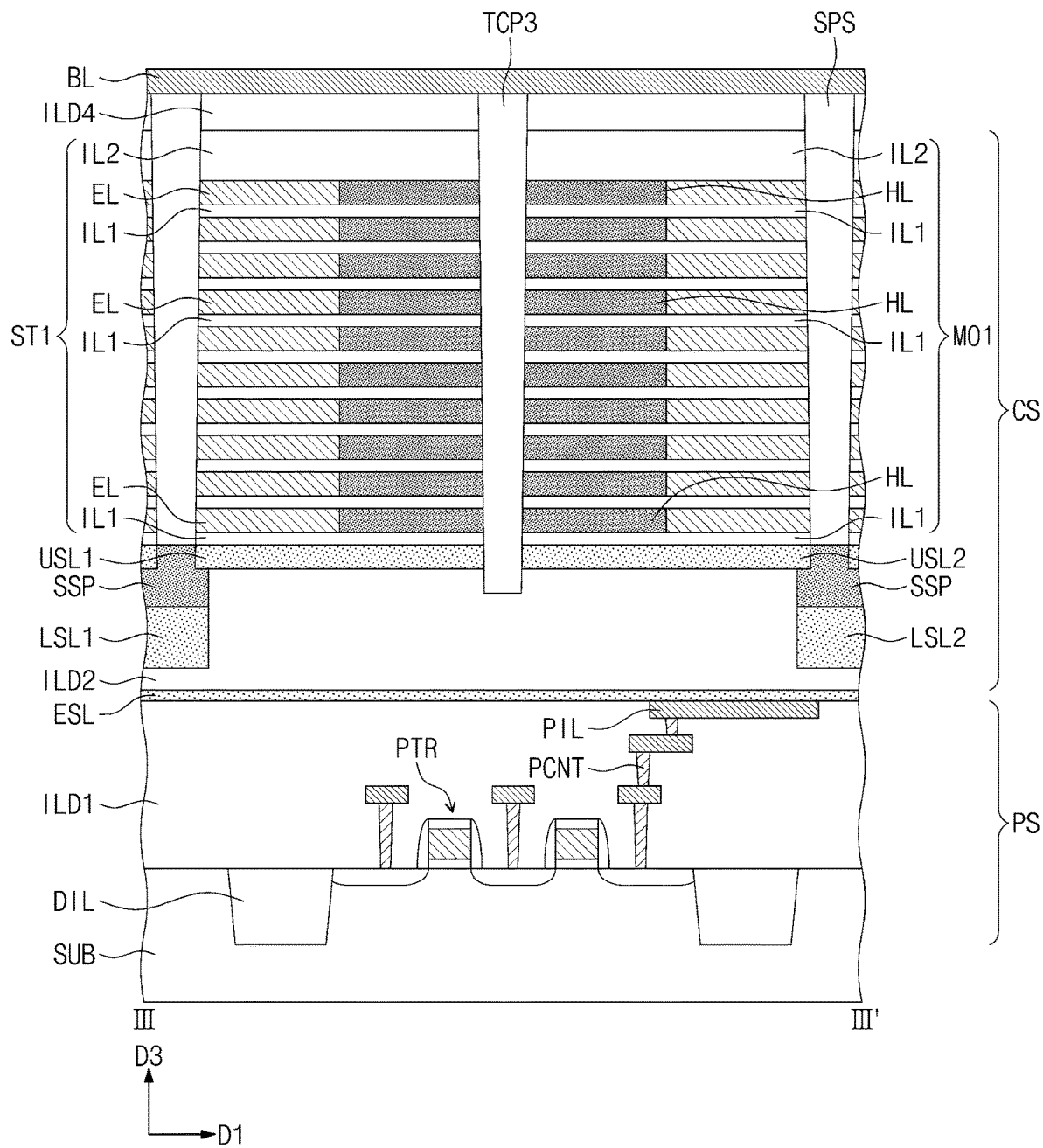

FIG. 5 illustrates an enlarged plan view of section M in FIG. 4, showing a three-dimensional semiconductor memory device according to example embodiments of the present inventive concepts. FIGS. 6A, 6B, and 6C illustrate cross-sectional views respectively taken along lines I-I', II-II', and III-III' of FIG. 5. FIG. 7 illustrates a simplified perspective view showing a three-dimensional semiconductor memory device according to example embodiments of the present inventive concepts.

Referring to FIGS. 5, 6A, 6B, and 6C, the first substrate SUB may be provided thereon with the peripheral circuit structure PS including peripheral transistors PTR. The peripheral circuit structure PS may be provided thereon with the cell array structure CS including the first to fourth electrode structures ST1 and ST4. The first substrate SUB may be a silicon substrate, a silicon-germanium substrate, a germanium substrate, or a single-crystalline epitaxial layer grown on a single-crystalline silicon substrate. The first substrate SUB may include active regions defined by a device isolation layer DIL.

The peripheral circuit structure PS may include a plurality of peripheral transistors PTR disposed on the active regions of the first substrate SUB. The peripheral circuit structure PS may further include a first interlayer dielectric layer ILD1 that covers the peripheral transistors PTR.

The peripheral transistors PTR, as discussed above, may constitute row and column decoders, a page buffer, a control circuit, and a peripheral logic circuit. Peripheral lines PIL may be electrically connected to the peripheral transistors PTR through peripheral contacts PCNT.

The first interlayer dielectric layer ILD1 may cover the peripheral transistors PTR, the peripheral contacts PCNT, and the peripheral lines PIL. In some embodiments, a top surface of an uppermost one of the peripheral lines PIL may be coplanar with a top surface of the first interlayer dielectric layer ILD1. The first interlayer dielectric layer ILD1 may include a plurality of stacked dielectric layers. For example, the first interlayer dielectric layer ILD1 may include one or more of a silicon oxide layer, a silicon nitride layer, a silicon oxynitride layer, and a low-k dielectric layer.

An etch stop layer ESL may be provided on the first interlayer dielectric layer ILD1 of the peripheral circuit structure PS. The etch stop layer ESL may be provided thereon with a second interlayer dielectric layer ILD2 and the cell array structure CS. The following will describe in detail the cell array structure CS.

The first to fourth lower semiconductor layers LSL1 to LSL4 may be provided on the etch stop layer ESL. The first to fourth lower semiconductor layers LSL1 to LSL4 may be provided in the second interlayer dielectric layer ILD2. The second interlayer dielectric layer ILD2 may insulate the first to fourth lower semiconductor layers LSL1 to LSL4 from each other. For example, a top surface of the second interlayer dielectric layer ILD2 may be at a higher vertical level than top surfaces of the first to fourth lower semiconductor layers LSL1 to LSL4.

The first to fourth lower semiconductor layers LSL1 to LSL4 may include a semiconductor material, for example, silicon (Si), germanium (Ge), silicon germanium (SiGe), gallium arsenic (GaAs), indium gallium arsenic (InGaAs), aluminum gallium arsenic (AlGaAs), or a mixture thereof. The first to fourth lower semiconductor layers LSL1 to LSL4 may each have at least one selected from a single-crystalline structure, an amorphous structure, and a polycrystalline structure. For example, the first to fourth lower semiconductor layers LSL1 to LSL4 may include a polysilicon layer doped with n-type impurities. As another example, the first to fourth lower semiconductor layers LSL1 to LSL4 may further include a conductive material, such as metal.

The upper semiconductor layer USL may be provided on the first to fourth lower semiconductor layers LSL1 to LSL4 and the second interlayer dielectric layer ILD2. The upper semiconductor layer USL may include the first to fourth upper semiconductor layers USL1 to USL4 that are respectively provided on the first to fourth lower semiconductor layers LSL1 to LSL4. The upper semiconductor layer USL may further include the first and second dummy semiconductor layers DSL1 and DSL2.

The upper semiconductor layer USL may include a semiconductor material, and a description of the semiconductor material may be substantially the same as that of the first to fourth lower semiconductor layers LSL1 to LSL4. For example, the upper semiconductor layer USL may include a polysilicon layer doped with n-type impurities. An impurity concentration of the upper semiconductor layer USL may be different from those of the first to fourth lower semiconductor layers LSL1 to LSL4.

The first to fourth electrode structures ST1 to ST4 may be respectively provided on the first to fourth upper semiconductor layers USL1 to USL4. The following will describe in detail the first electrode structure ST1 selected as a representative of the first to fourth electrode structures ST1 to ST4. A description of the first electrode structure ST1 may also be applicable to the second, third, and fourth electrode structures ST2, ST3, and ST4.

The first electrode structure ST1 may include electrodes EL that are stacked in a vertical direction (e.g., a third direction D3) on the first upper semiconductor layer USL1. The first electrode structure ST1 may further include first dielectric layers IL1 that separate the stacked electrodes EL from each other. The first electrode structure ST1 may be configured such that the first dielectric layers IL1 and the electrodes EL are alternately stacked on each other in the third direction D3.

The first electrode structure ST1 may extend from a cell array region CAR of the first lower semiconductor layer LSL1 toward a connection region CNR of the first lower semiconductor layer LSL1. The first electrode structure ST1 may have a stepwise structure STS on the connection region CNR. For example, the stepwise structure STS of the first electrode structure ST1 may be adjacent in the second direction D2 to the stepwise structure STS of the third electrode structure ST3. The stepwise structure STS of the first electrode structure ST1 may face the stepwise structure STS of the third electrode structure ST3.

A lowermost electrode EL of the first electrode structure ST1 may be a lower selection line. An uppermost electrode EL of the first electrode structure ST1 may be an upper selection line. Word lines may be defined to indicate remaining electrodes EL other than the lower and upper selection lines.

The electrodes EL may include a conductive material selected from doped semiconductors (e.g., doped silicon), metals (e.g., tungsten, copper, or aluminum), conductive metal nitrides (e.g., titanium nitride or tantalum nitride), and transition metals (e.g., titanium or tantalum). The first dielectric layers IL1 may include a silicon oxide layer.

The first electrode structure ST1 on the cell array region CAR may further include a second dielectric layer IL2. The second dielectric layer IL2 may be selectively provided on the cell array region CAR, but not on the connection region CNR. For example, a side surface of the second dielectric layer IL2 may be vertically aligned with a side surface of an uppermost electrode EL. The second dielectric layer IL2 may have a thickness greater than that of the first dielectric layer IL1. The second dielectric layer IL2 may include the same dielectric material as that of the first dielectric layer IL1. For example, the second dielectric layer IL2 may include a silicon oxide layer. Thickness may refer to the thickness or height measured in a direction perpendicular to a top surface of the substrate SUB.

On the cell array region CAR, a plurality of vertical channel structures VS may be provided to penetrate the first electrode structure ST1. When viewed in plan, the vertical channel structures VS may be arranged in a straight or zigzag fashion. Each of the vertical channel structures VS may include a vertical dielectric pattern VP, a vertical semiconductor pattern SP, and a buried dielectric pattern VI.

The vertical dielectric pattern VP may be interposed between the first electrode structure ST1 and the vertical semiconductor pattern SP, and may extend toward the first lower semiconductor layer LSL1. The vertical dielectric pattern VP may have a pipe shape whose top end is opened. The vertical semiconductor pattern SP may cover an inner wall of the vertical dielectric pattern VP and may, together with the vertical dielectric pattern VP, extend toward the first lower semiconductor layer LSL1. The vertical semiconductor pattern SP may also have a pipe shape whose top end is opened. The buried dielectric pattern VI may fill an inside of the vertical semiconductor pattern SP.

The vertical dielectric pattern VP may be formed of a single thin layer or a plurality of thin layers. In some example embodiments of the present inventive concepts, the vertical dielectric pattern VP may include a data storage layer. For example, the vertical dielectric pattern VP may include a tunnel dielectric layer, a charge storage layer, and a blocking dielectric layer, which layers constitute a data storage layer of a NAND Flash memory device.

The charge storage layer may be, for example, a trap dielectric layer, a floating gate electrode, or a dielectric layer including conductive nano-dots. The charge storage layer may include at least one selected from a silicon nitride layer, a silicon oxynitride layer, a silicon-rich nitride layer, a nano-crystalline silicon layer, and a laminated trap layer. The tunnel dielectric layer may include a material whose bandgap is greater than that of the charge storage layer. The tunnel dielectric layer may include either a silicon oxide layer or a high-k dielectric layer such as an aluminum oxide layer and a hafnium oxide layer. The blocking dielectric layer may include a silicon oxide layer.

The vertical semiconductor pattern SP may include a semiconductor material, such as silicon (Si), germanium (Ge), or a mixture thereof. Additionally or alternatively, the vertical channel structures VS may be an impurity-doped semiconductor or an undoped intrinsic semiconductor. The vertical semiconductor patterns SP including a semiconductor material may be used as channels of transistors that constitute a NAND cell string.

A conductive pad PAD may be provided on an upper portion of each of the vertical channel structures VS. The conductive pad PAD may cover a top surface of the vertical semiconductor pattern SP and a top surface of the buried dielectric pattern VI. The conductive pad PAD may include one or more of an impurity-doped semiconductor material and a conductive material. A bit-line contact plug BPLG may be electrically connected through the conductive pad PAD to the vertical semiconductor pattern SP.

A source semiconductor layer SSP may be interposed between the first lower semiconductor layer LSL1 and the first upper semiconductor layer USL1. The source semiconductor layer SSP may electrically connect the first lower semiconductor layer LSL1 to the first upper semiconductor layer USL1. The source semiconductor layer SSP may be in direct contact with a lower sidewall of each of the vertical semiconductor patterns SP. The source semiconductor layer SSP may electrically connect a plurality of vertical semiconductor patterns SP to each other. In some embodiments, a top surface of the source semiconductor layer SSP may contact a bottom surface of the first upper semiconductor layer USL1, and a bottom surface of the source semiconductor layer SSP may contact a top surface of the first lower semiconductor layer LSL1. A top surface of the source semiconductor layer SSP may be coplanar with a top surface of the second interlayer dielectric layer ILD2. Side surfaces of the source semiconductor layer SSP may be vertically aligned with side surfaces of the first lower semiconductor layer LSL1. As used herein, the term "contact" refers to a direct connection (i.e., touching) unless the context indicates otherwise.

In conclusion, an electrical connection may be provided between the vertical semiconductor patterns SP, the source semiconductor layer SSP, the first lower semiconductor layer LSL1, and the first upper semiconductor layer USL1. The first lower semiconductor layer LSL1, the source semiconductor layer SSP, and the first upper semiconductor layer USL1 may serve as a source of memory cells. The source semiconductor layer SSP may include a semiconductor layer doped with n-type impurities.

A second substrate may be constituted by the lower semiconductor layers LSL1 to LSL4, the source semiconductor layer SSP, and the upper semiconductor layer USL. The first substrate SUB may support the peripheral circuit structure PS, and the second substrate may support the cell array structure CS. The second substrate may include one or more of a semiconductor layer and a conductive layer. For example, referring to FIG. 16 which will be discussed below, the second substrate may further include a metal pattern MP below each of the first to fourth lower semiconductor layers LSL1 to LSL4.

Referring to FIGS. 5, 6B, and 6C, a plurality of separation structures SPS may penetrate the first electrode structure ST1. The separation structures SPS may extend lengthwise in parallel to each other in the second direction D2. For example, the first electrode structure ST1 may be configured such that the separation structures SPS horizontally separate a single electrode EL into a plurality of electrodes EL. The plurality of electrodes EL separated by the separation structures SPS may extend in parallel to each other in the second direction D2. Bottom surfaces of the separations structures SPS may contact top surfaces of the source semiconductor layer SSP. The separation structures SPS may include a dielectric material, such as silicon oxide.

A NAND Flash memory device may be adopted as a three-dimensional semiconductor memory device according to some example embodiments of the present inventive concepts. A plurality of NAND cell strings may be integrated into the first electrode structure ST1 on the first lower semiconductor layer LSL1. For example, the first electrode structure ST1 and the vertical channel structures VS that penetrate therethrough may constitute memory cells that are three-dimensionally arranged on the first lower semiconductor layer LSL1. The electrodes EL of the first electrode structure ST1 may be used as gate electrodes of transistors.

Referring to FIG. 5, the first mold structure MO1 may be provided between the first and second electrode structures ST1 and ST2, and the second mold structure MO2 may be provided between the third and fourth electrode structures ST3 and ST4. When viewed in plan, the first mold structure MO1 may be provided between the first and second lower semiconductor layers LSL1 and LSL2, and the second mold structure MO2 may be provided between the third and fourth lower semiconductor layers LSL3 and LSL4. The following will describe in detail the first mold structure MO1 selected as a representative of the first and second mold structures MO1 and MO2.

Referring to FIG. 6C, the first mold structure MO1 may include sacrificial layers HL that are stacked in the third direction D3 on the second interlayer dielectric layer ILD2. The first mold structure MO1 may further include first dielectric layers IL1 that separate the stacked sacrificial layers HL from each other. The first mold structure MO1 may be configured such that the first dielectric layers IL1 and the sacrificial layers HL are alternately stacked on each other in the third direction D3.

The sacrificial layers HL may be provided at the same level as that of corresponding electrodes EL of the first electrode structure ST1. The sacrificial layers HL may be provided at the same level as that of corresponding electrodes EL of the second electrode structure ST2. In this configuration, the sacrificial layer HL of the first mold structure MO1 may physically connect the electrode EL of the first electrode structure ST1 to the electrode EL of the second electrode structure ST2. The sacrificial layers HL may include a dielectric material, such as a silicon oxide layer or a silicon oxynitride layer. Since the sacrificial layers HL of the first mold structure MO1 include a dielectric material, the first mold structure MO1 may insulate the first and second electrode structures ST1 and ST2 from each other.

Referring back to FIG. 6A, a third interlayer dielectric layer ILD3 may be provided on the upper semiconductor layer USL. The third interlayer dielectric layer ILD3 may cover the stepwise structure STS of each of the first to fourth electrode structures ST1 to ST4. A top surface of the third interlayer dielectric layer ILD3 may be coplanar with a top surface of the second dielectric layer IL2. A fourth interlayer dielectric layer ILD4 may be provided on the second dielectric layer IL2 and on the third interlayer dielectric layer ILD3.

A plurality of bit-line contact plugs BPLG may penetrate the fourth interlayer dielectric layer ILD4 and may be coupled to corresponding conductive pads PAD on the upper portions of the vertical channel structures VS. A plurality of bit lines BL may be disposed on the fourth interlayer dielectric layer ILD4. The bit lines BL may extend in parallel to each other in the first direction D1. Each of the bit lines BL may be electrically connected through the bit-line contact plug BPLG to the vertical semiconductor pattern SP.

A plurality of cell contact plugs PLG may penetrate the third and fourth interlayer dielectric layers ILD3 and ILD4 and may be coupled to corresponding electrodes EL that constitute the stepwise structure STS. A plurality of connection lines CL may be disposed on the fourth interlayer dielectric layer ILD4. Each of the connection lines CL may be electrically connected through the cell contact plug PLG to the electrode EL.

Referring to FIGS. 4, 5, and 6A, the cutting structure TCP may be provided. For example, the cutting structure TCP may be formed to fill a second trench TR2. The cutting structure TCP may penetrate the upper semiconductor layer USL and the third and fourth interlayer dielectric layers ILD3 and ILD4 and vertically extend to the second interlayer dielectric layer ILD2. The cutting structure TCP may separate the upper semiconductor layer USL into the first to fourth upper semiconductor layers USL1 to USL4 and into the first and second dummy semiconductor layers DSL1 and DSL2. The cutting structure TCP may have a bottom surface lower than that of the upper semiconductor layer USL. For example, the bottom surface of the cutting structure TCP may be at a lower vertical level than a top surface of the second interlayer dielectric layer ILD2. The cutting structure TCP may include a dielectric material, such as a silicon oxide layer.

The cutting structure TCP may include, for example, the first cutting structure TCP1 extending in the first direction D1, the second cutting structure TCP2 extending in the first direction D1, and the third cutting structure TCP3 extending in the second direction D2. When viewed in plan, the first, second, and third cutting structures TCP1, TCP2, and TCP3 may each have a linear shape. As shown in FIG. 4, the cutting structure TCP may further include the fourth cutting structure TCP4 that defines an outer circumference of the first to fourth upper semiconductor layers USL1 to USL4.

Referring to FIGS. 5 and 6A, the first cutting structure TCP1 and the second cutting structure TCP2 may be provided between the first electrode structure ST1 and the third electrode structure ST3. The first cutting structure TCP1 and the second cutting structure TCP2 may divide the upper semiconductor layer USL into the first upper semiconductor layer USL1 and the second upper semiconductor layer USL2. The first and second cutting structures TCP1 and TCP2 may insulate the first and second upper semiconductor layers USL1 and USL2 from each other. The upper semiconductor layer USL may have a portion that remains between the first and second cutting structures TCP1 and TCP2, and the portion of the upper semiconductor layer USL that remains may be defined as the first dummy semiconductor layer DSL1.

Referring to FIGS. 5 and 6C, the third cutting structure TCP3 may penetrate the first and second mold structures MO1 and MO2. For example, the third cutting structure TCP3 may penetrate the sacrificial layers HL of the first mold structure MO1 and may also penetrate the upper semiconductor layer USL below the first mold structure MO1. The third cutting structure TCP3 may divide the upper semiconductor layer USL below the first mold structure MO1 into the first upper semiconductor layer USL1 and the second upper semiconductor layer USL2.

Referring to FIG. 6A, the first upper semiconductor layer USL1 may have a first sidewall SW1 defined by the first cutting structure TCP1. The first lower semiconductor layer LSL1 below the first upper semiconductor layer USL1 may have a second sidewall SW2 adjacent to the first sidewall SW1. When viewed in the second direction D2, the second sidewall SW2 of the first lower semiconductor layer LSL1 may face the third lower semiconductor layer LSL3. The first sidewall SW1 may not be aligned with the second sidewall SW2. The first sidewall SW1 may be offset in the second direction D2 from the second sidewall SW2. The first sidewall SW1 may protrude in the second direction D2 beyond the second sidewall SW2. The first sidewall SW1 may be at an angle with respect to a top surface of the substrate SUB. The second sidewall SW2 may be perpendicular to the top surface of the substrate SUB.

A dielectric pattern IP may be provided on the through contact region TVR of the upper semiconductor layer USL. The dielectric pattern IP may be provided in the first dummy semiconductor layer DSL1 of the upper semiconductor layer USL. For example, the dielectric pattern IP may be formed to fill an opening OP in the first dummy semiconductor layer DSL1. The dielectric pattern IP may penetrate the first dummy semiconductor layer DSL1. The dielectric pattern IP may have top and bottom surfaces that are coplanar with respective top and bottom surfaces of the first dummy semiconductor layer DSL1. The dielectric pattern IP may have a bottom surface in contact with a top surface of the second interlayer dielectric layer ILD2. The dielectric pattern IP may have a top surface in contact with a bottom surface of the third interlayer dielectric layer ILD3.

At least one through contact TVS may be provided which penetrates the fourth interlayer dielectric layer ILD4, the third interlayer dielectric layer ILD3, the dielectric pattern IP, the second interlayer dielectric layer ILD2, and the etch stop layer ESL and which is electrically connected to the peripheral line PIL of the peripheral circuit structure PS. When viewed in plan, the through contact TVS may be provided in the through contact region TVR. For example, the through contact TVS may be provided between the first and third electrode structures ST1 and ST3. The through contact TVS may be surrounded by a spacer SS including a dielectric material.

At least one connection line CL may extend onto the through contact TVS. The connection line CL may be electrically connected via the through contact TVS to the peripheral line PIL. For example, the electrode EL may be electrically connected through the connection line CL and the through contact TVS to the peripheral line PIL of the peripheral circuit structure PS.

Referring to FIG. 7, according to example embodiments of the present inventive concepts, the cutting structure TCP may separate the cell array structure CS into a plurality of pieces. For example, the cutting structure TCP may divide the upper semiconductor layer USL into a plurality of sections, which upper semiconductor layer USL is formed as a single plate shape on an entire surface of the first substrate SUB. When viewed in plan, the upper semiconductor layer USL divided by the cutting structure TCP may be shaped like a tile. A single mat MT discussed above with reference to FIG. 3 may include a plurality of tiles.

FIGS. 8A, 9A, 10A, 11A, and 12A illustrate cross-sectional views taken along line I-I' of FIG. 5, showing a method of fabricating a three-dimensional semiconductor memory device according to example embodiments of the present inventive concepts. FIGS. 8B, 9B, 10B, 11B, and 12B illustrate cross-sectional views taken along line II-II' of FIG. 5, showing a method of fabricating a three-dimensional semiconductor memory device according to example embodiments of the present inventive concepts.

Figure 8A:
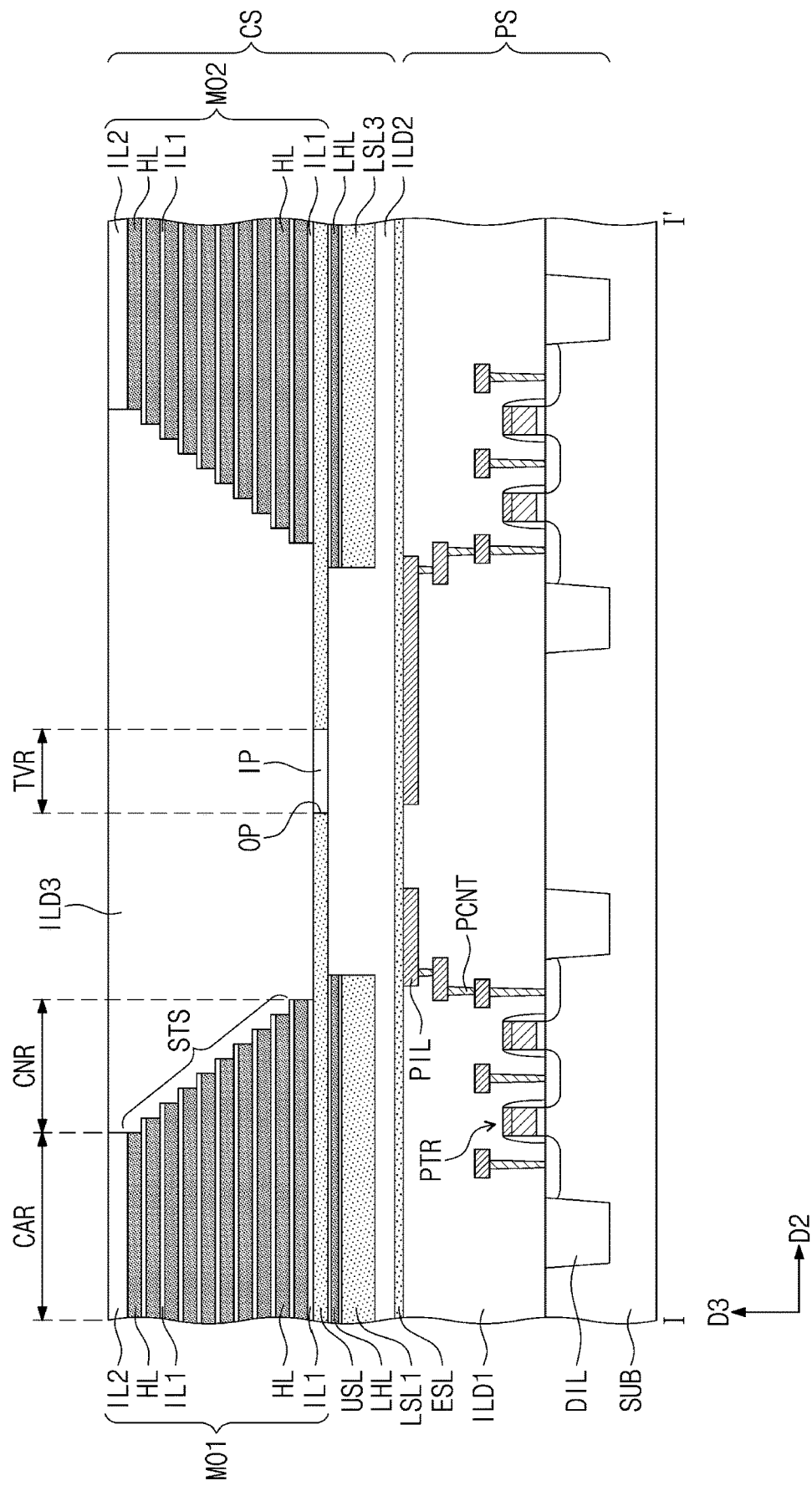
FIGS. 8A, 9A, 10A, 11A, and 12A illustrate cross-sectional views taken along line I-I' of FIG. 5, showing a method of fabricating a three-dimensional semiconductor memory device, according to example embodiments of the present inventive concepts.
Figure 8B:
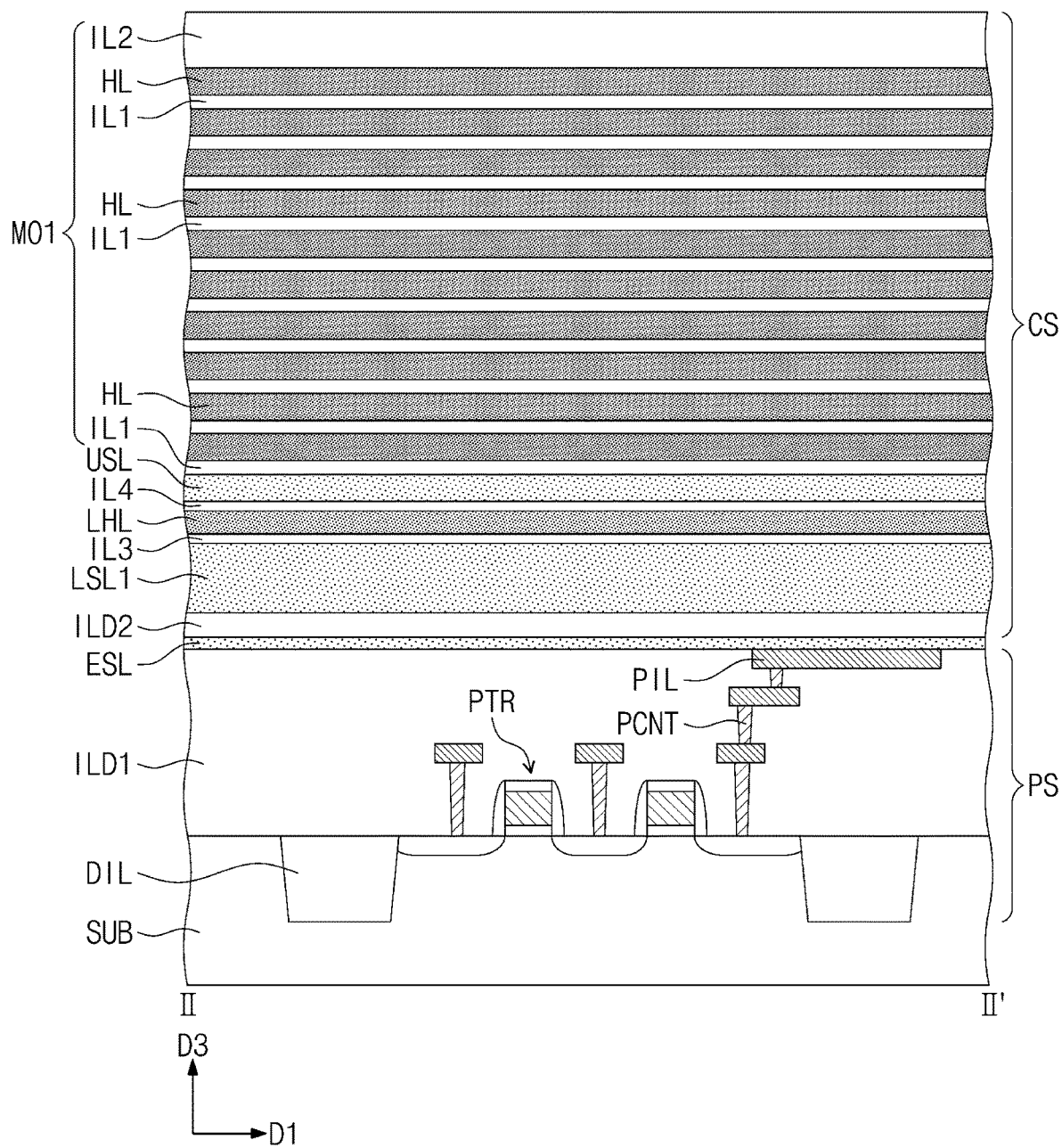
FIGS. 8B, 9B, 10B, 11B, and 12B illustrate cross-sectional views taken along line II-II' of FIG. 5, showing a method of fabricating a three-dimensional semiconductor memory device, according to example embodiments of the present inventive concepts.

Referring to FIGS. 5, 8A, and 8B, a peripheral circuit structure PS may be formed on a first substrate SUB. The formation of the peripheral circuit structure PS may include forming peripheral transistors PTR on the first substrate SUB, forming peripheral lines PIL on the peripheral transistors PTR, forming peripheral contacts PCNT that connect the peripheral transistors PTR to the peripheral lines PIL, and forming a first interlayer dielectric layer ILD1.

For example, the formation of the peripheral transistors PTR may include forming on the first substrate SUB a device isolation layer DIL that defines active regions, forming on the active regions a gate dielectric layer and a gate electrode, and implanting the active regions with impurities to form source/drain regions.

An etch stop layer ESL may be formed on the first interlayer dielectric layer ILD1. A second interlayer dielectric layer ILD2 may be formed on the etch stop layer ESL. First to fourth lower semiconductor layers LSL1 to LSL4 may be formed on the second interlayer dielectric layer ILD2.

The formation of the first to fourth lower semiconductor layers LSL1 to LSL4 may include forming a first semiconductor layer on the entire surface of the first substrate SUB and performing a patterning process on the first semiconductor layer. The patterning process may divide the first semiconductor layer into four sections, and the four sections may be correspondingly defined as the first to fourth lower semiconductor layers LSL1 to LSL4.

A third dielectric layer IL3, a lower sacrificial layer LHL, and a fourth dielectric layer IL4 may be formed on each of the first to fourth lower semiconductor layers LSL1 to LSL4. When viewed in plan, the lower sacrificial layer LHL may overlap a corresponding one of the first to fourth lower semiconductor layers LSL1 to LSL4. For example, the third and fourth dielectric layers IL3 and IL4 may include a silicon oxide layer, and the lower sacrificial layer LHL may include a silicon nitride layer or a silicon oxynitride layer.

An upper semiconductor layer USL may be formed on the entire surface of the first substrate SUB. The upper semiconductor layer USL may be formed to have a plate shape on the entire surface of the first substrate SUB. For example, when viewed in plan, the upper semiconductor layer USL may cover a plurality of chip regions (see chip regions 10 of FIG. 1). The upper semiconductor layer USL may include at least one through contact region TVR.

For example, the upper semiconductor layer USL may be formed by depositing a polysilicon layer to cover the entire surface of the first substrate SUB. As an embodiment, impurities may be in-situ doped while the upper semiconductor layer USL is deposited. As another embodiment, the upper semiconductor layer USL may be doped with impurities after the upper semiconductor layer USL is deposited.

The through contact region TVR of the upper semiconductor layer USL may be selectively etched to form an opening OP. A dielectric pattern IP may be formed to fill the opening OP. The dielectric pattern IP may include a dielectric material, such as a silicon oxide layer.

First and second mold structures MO1 and MO2 may be formed on the upper semiconductor layer USL. For example, first dielectric layers IL1 and sacrificial layers HL may be vertically and alternately formed on the upper semiconductor layer USL, thereby forming a mold structure. A second dielectric layer IL2 may be formed at top of the mold structure.

The first dielectric layers IL, the sacrificial layers HL, and the second dielectric layer IL2 may be deposited by using thermal chemical vapor deposition (CVD), plasma enhanced CVD, physical CVD process, or atomic layer deposition (ALD). The first dielectric layers IL1 may include a silicon oxide layer, and the sacrificial layers HL may include a silicon nitride layer or a silicon oxynitride layer.

The mold structure may be patterned to form the first mold structure MO1 and the second mold structure MO2 that are spaced apart from each other in a second direction D2. The first mold structure MO1 may be formed on the first and second lower semiconductor layers LSL1 and LSL2. The second mold structure MO2 may be formed on the third and fourth lower semiconductor layers LSL3 and LSL4.

Each of the first and second mold structures MO1 and MO2 may be formed to have a stepwise structure STS. The first mold structure MO1 will be exemplarily discussed below. The first lower semiconductor layer LSL1 may include a cell array region CAR and a connection region CNR. The first mold structure MO1 may experience a cyclic process to form the stepwise structure STS on the connection region CNR. For example, the formation of the stepwise structure STS may include forming a mask pattern (not shown) on the first mold structure MO1 and repeatedly performing the cyclic process that uses the mask pattern. The cyclic process may include using the mask pattern as an etching mask to etch a portion of the first mold structure MO1 and performing a trimming process to reduce the mask pattern.

A third interlayer dielectric layer ILD3 may be formed on the first and second mold structures MO1 and MO2. The formation of the third interlayer dielectric layer ILD3 may include forming a thick dielectric layer to cover the first and second mold structures MO1 and MO2, and performing a planarization process on the dielectric layer until the second dielectric layer IL2 is exposed.

Figure 9A:
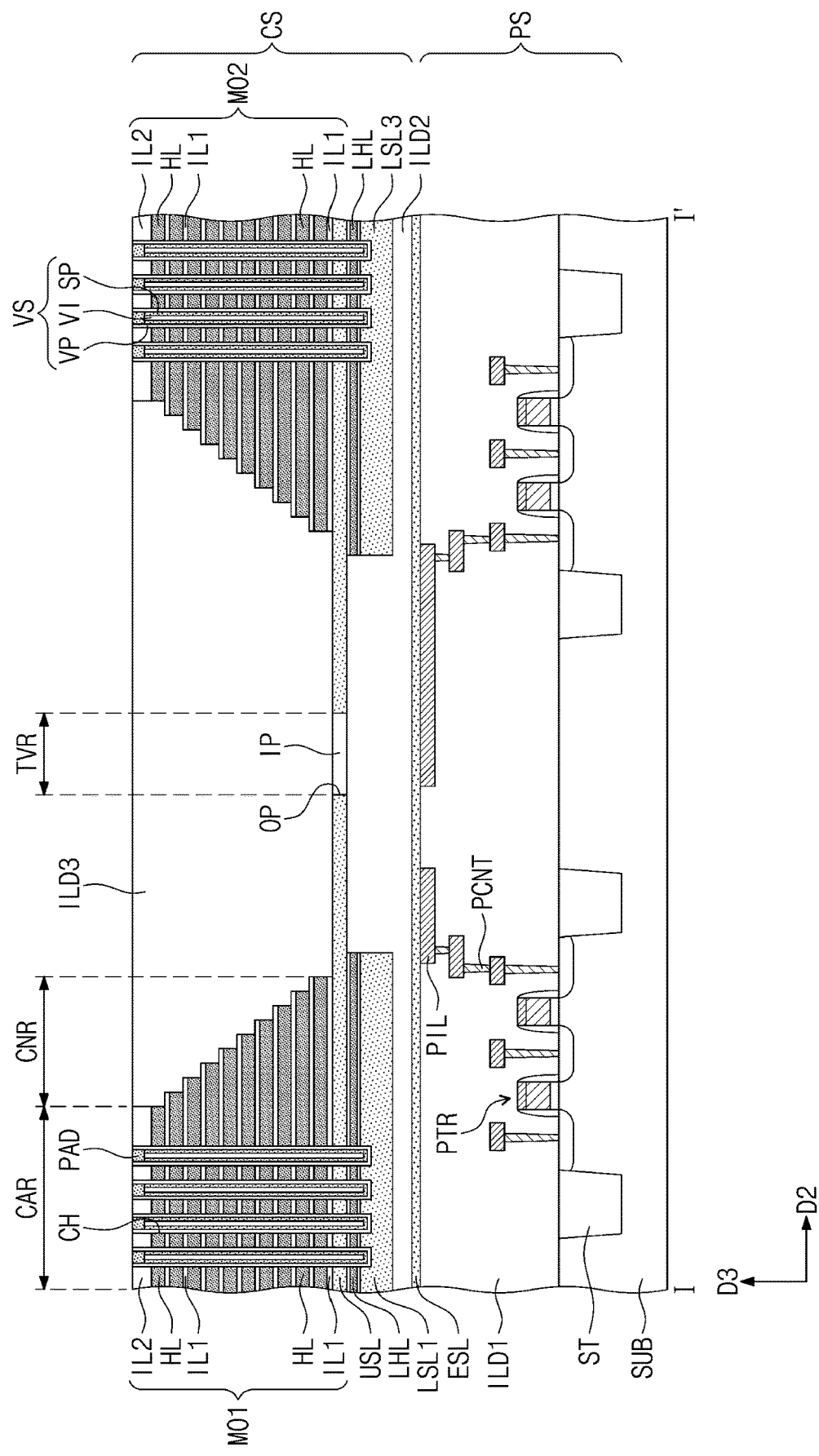
Figure 9B:
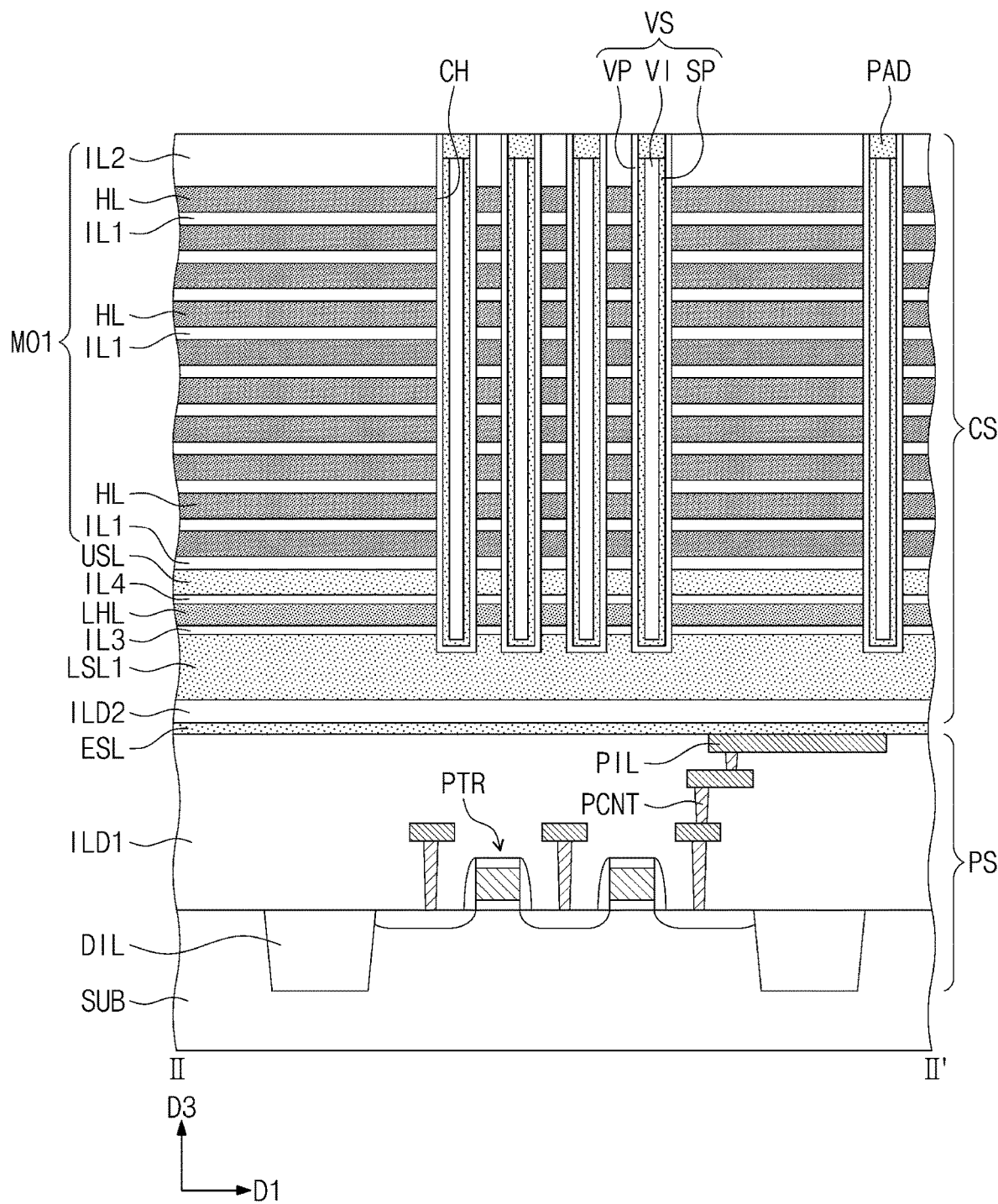

Referring to FIGS. 5, 9A, and 9B, channel holes CH may be formed to penetrate each of the first and second mold structures MO1 and MO2. For example, a plurality of channel holes CH penetrating the first mold structure MO1 may be formed on the cell array region CAR of the first lower semiconductor layer LSL1. Each of the channel holes CH may have a bottom surface at a vertical level between bottom and top surfaces of the first lower semiconductor layer LSL1.

Figure 19:
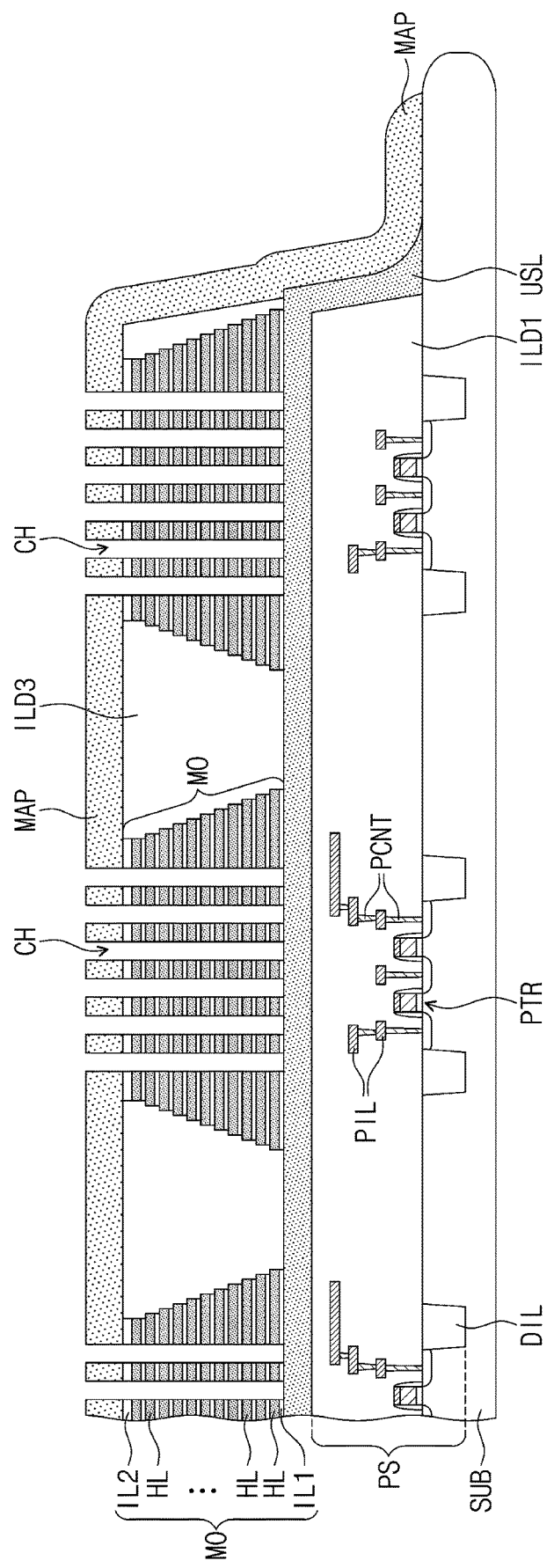
FIG. 19 illustrates a cross-sectional view showing a process for forming a channel hole of FIGS. 9A and 9B.

With reference to FIG. 19, the following will describe in detail the formation of the channel holes CH on the entire surface of the first substrate SUB, or on an entire surface of a wafer. The formation of the channel holes CH may include forming on a mold structure MO a hardmask layer MAP with openings that define regions where the channel holes CH will be formed, and using the hardmask layer MAP as an etching mask used for an anisotropic etching process that anisotropically etches the mold structure MO.

The hardmask layer MAP may include a silicon-containing material such as silicon oxide, silicon nitride, silicon oxynitride, or polysilicon; a carbon-containing material such as an amorphous carbon layer (ACL) or a spin-on-hardmask (SOH) layer; a metal-containing material such as tungsten; or an organic material. The hardmask layer MAP may be formed to cover the entire surface of the first substrate SUB. On an edge of the first substrate SUB, the hardmask layer MAP may directly contact the upper semiconductor layer USL and a top surface of the edge of the first substrate SUB.

When viewed in plan, the channel holes CH may be arranged along one direction or arrayed in a zigzag fashion. For example, the anisotropic etching process for forming the channel holes CH may be a plasma etching process, a reactive ion etching (RIE) process, a radio-frequency inductively coupled plasma reactive ion etching (ICP-RIE) process, or an ion beam etching (IBE) process.

When the anisotropic etching process is performed using high-power plasma, ions included in plasma and/or positive charges induced from radicals may be charged or accumulated on a surface of the upper semiconductor layer USL exposed to the channel holes CH.

During the fabrication of a three-dimensional semiconductor memory device according to some example embodiments of the present inventive concepts, the first substrate SUB may be placed on a supporter (not shown) of a semiconductor manufacturing apparatus. While the anisotropic etching process is performed to form the channel holes CH, the first substrate SUB may be supplied with a ground voltage from the supporter.

The upper semiconductor layer USL may be formed in the shape of a plate that covers the entire surface of the first substrate SUB. Therefore, on the edge of the first substrate SUB, the upper semiconductor layer USL may directly contact the first substrate SUB. As such, during the anisotropic etching process, the upper semiconductor layer USL may be supplied with the ground voltage through the supporter and the first substrate SUB. As a result, during the anisotropic etching process using the plasma (e.g., during the formation of the channel holes CH), positive charges accumulated on the upper semiconductor layer USL may be discharged to the outside.

Additionally, when the hardmask layer MAP includes an amorphous carbon layer (ACL), negative charges may be charged or accumulated on the amorphous carbon layer during the anisotropic etching process using plasma. As shown in FIG. 19, on the edge of the first substrate SUB, the hardmask layer MAP may also directly contact the first substrate SUB, such that negative charges accumulated on the hardmask layer MAP may be discharged through the first substrate SUB.

According to some example embodiments of the present inventive concepts, the formation of the channel holes CH may be performed before the upper semiconductor layer USL is divided into a plurality of tiles (e.g., the first to fourth upper semiconductor layers USL1 to USL4 of FIG. 4). Therefore, while the channel holes CH are formed, the upper semiconductor layer USL on the first substrate SUB may be electrically grounded at an entire surface thereof. As a result, arcing may be prevented during the formation of the channel holes CH.

Referring back to FIGS. 5, 9A, and 9B, vertical channel structures VS may be formed in corresponding channel holes CH. The formation of the vertical channel structure VS may include sequentially forming a vertical dielectric layer, a vertical semiconductor layer, and a buried dielectric layer on an inner wall of the channel hole CH, and performing a planarization process until a top surface of the second dielectric layer IL2 is exposed. The vertical dielectric layer and the vertical semiconductor layer may be conformally formed.

For example, a vertical dielectric pattern VP may be formed to cover the inner wall of the channel hole CH. The vertical dielectric pattern VP may have a pipe shape whose top end is opened and whose bottom end is closed. The vertical dielectric pattern VP may include a data storage layer. A vertical semiconductor pattern SP may be formed to cover an inner wall of the vertical dielectric pattern VP. The vertical semiconductor pattern SP may have a pipe shape whose top end is opened and whose bottom end is closed. A buried dielectric pattern VI may be formed to fill an inside of the vertical semiconductor pattern SP. The vertical dielectric pattern VP, the vertical semiconductor pattern SP, and the buried dielectric pattern VI may constitute the vertical channel structure VS. A conductive pad PAD may be formed on an upper portion of each of the vertical channel structures VS.

Figure 10A:
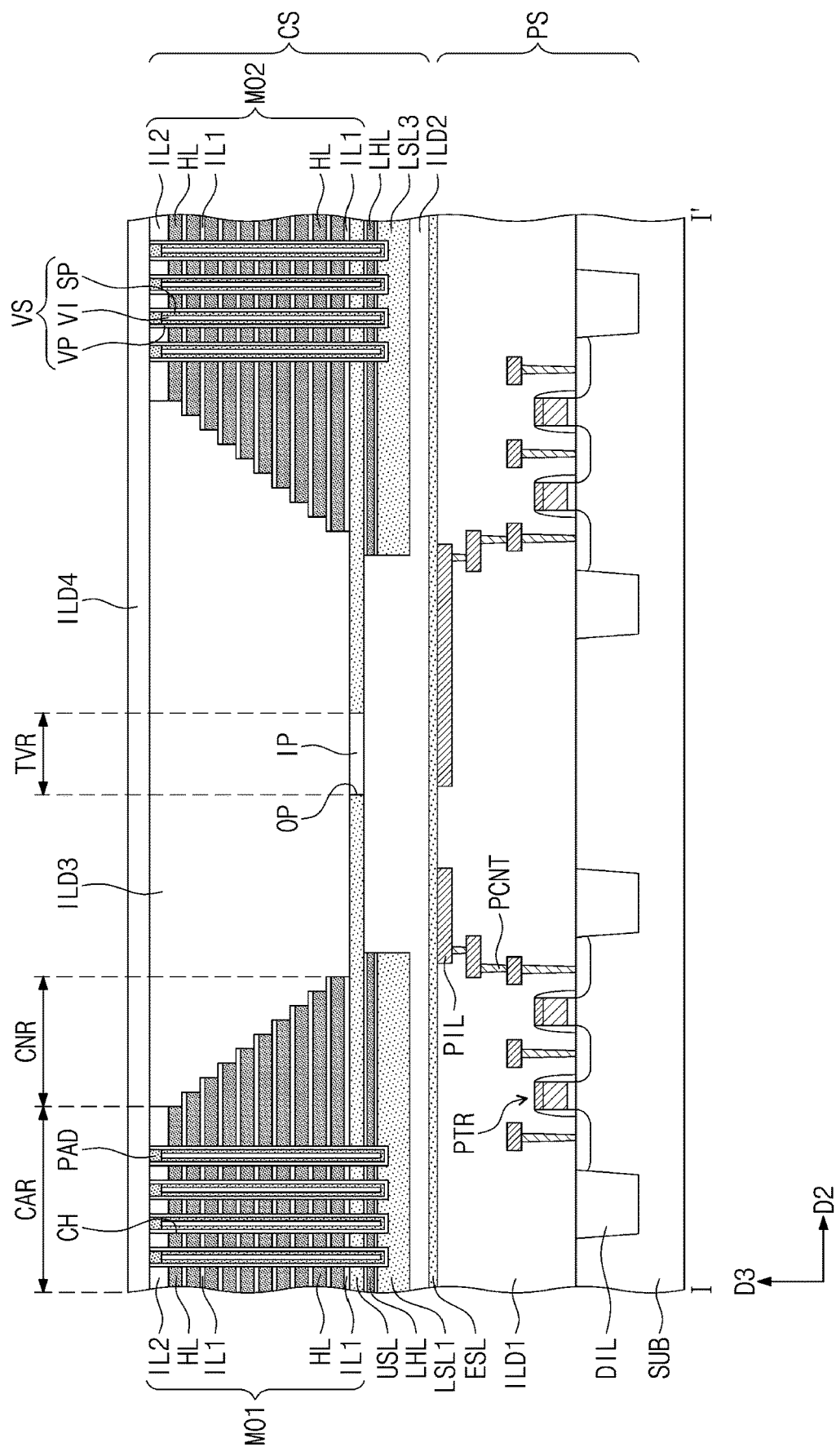
Figure 10B:
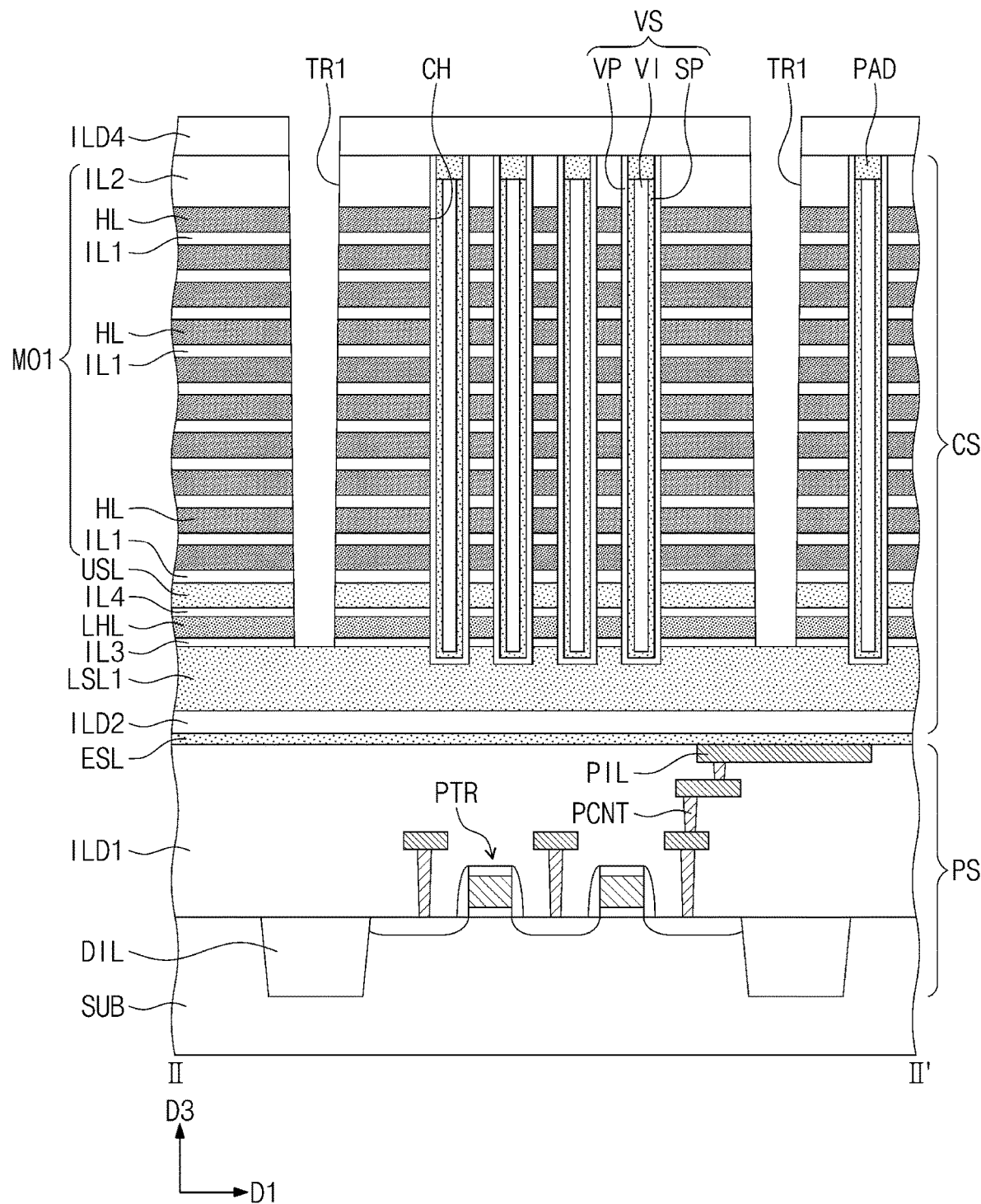

Referring to FIGS. 5, 10A, and 10B, a fourth interlayer dielectric layer ILD4 may be formed on the first and second mold structures MO1 and MO2 and on the third interlayer dielectric layer ILD3. The first and second mold structures MO1 and MO2 may be patterned to form first trenches TR1 that penetrate each of the first and second mold structures MO1 and MO2. The first trenches TR1 may extend in parallel to each other in a first direction D1.

The first trenches TR1 may expose the first to fourth lower semiconductor layers LSL1 to LSL4. Each of the first trenches TR1 may expose sidewalls of the sacrificial layers HL. Each of the first trenches TR1 may expose a sidewall of the third dielectric layer IL3, a sidewall of the lower sacrificial layer LHL, and a sidewall of the fourth dielectric layer IL4.

Like the formation of the channel holes CH, the formation of the first trenches TR1 may employ an anisotropic etching process using high-energy plasma. Therefore, positive charges may be accumulated on a surface of the upper semiconductor layer USL, and thereby generate arching. In contrast, as discussed above with reference to FIG. 19, because a ground voltage is applied to the upper semiconductor layer USL shaped like a plate, it may be possible to suppress the generation of arcing in a process for forming the first trenches TR1.

Figure 11A:
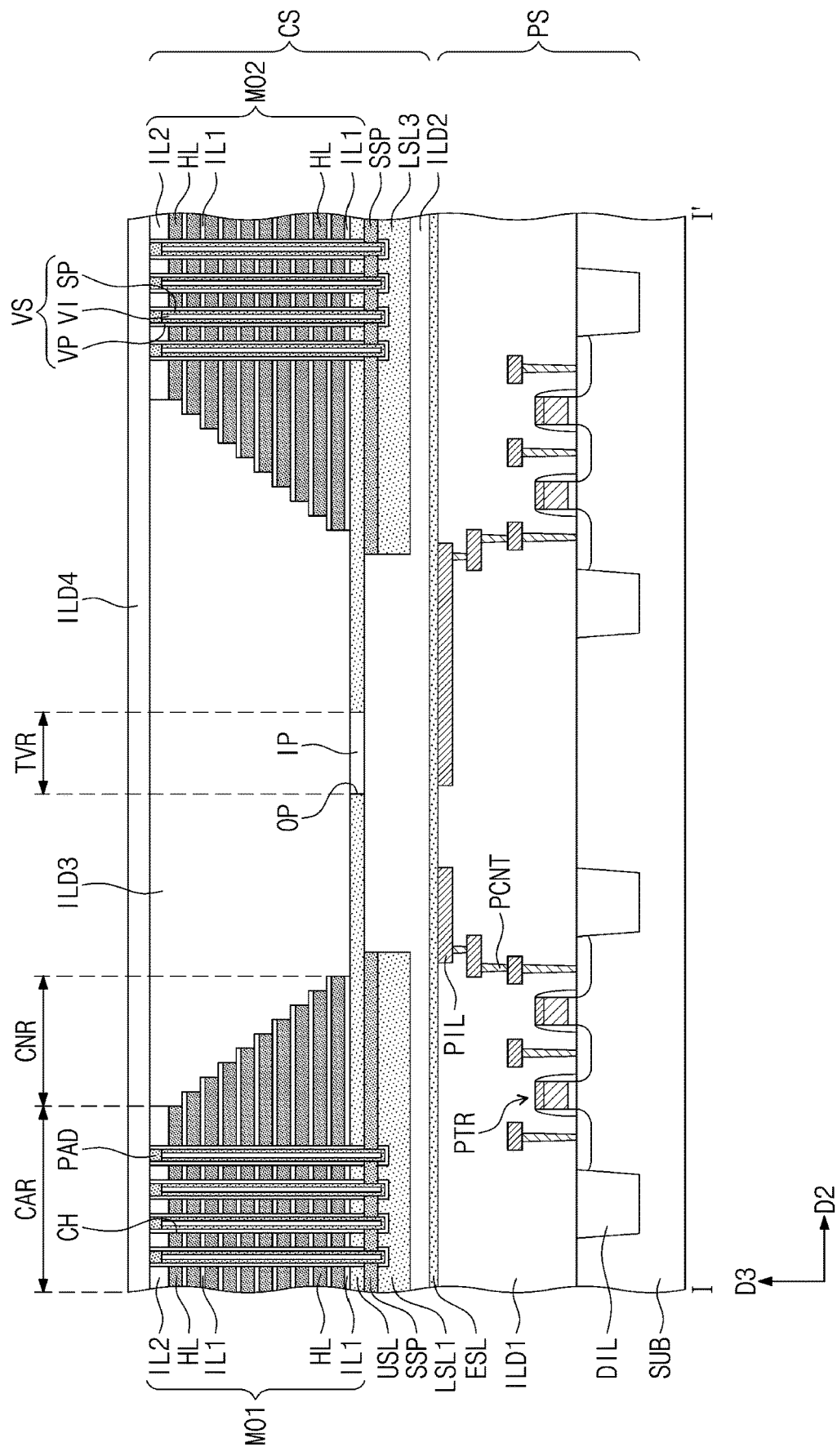
Figure 11B:
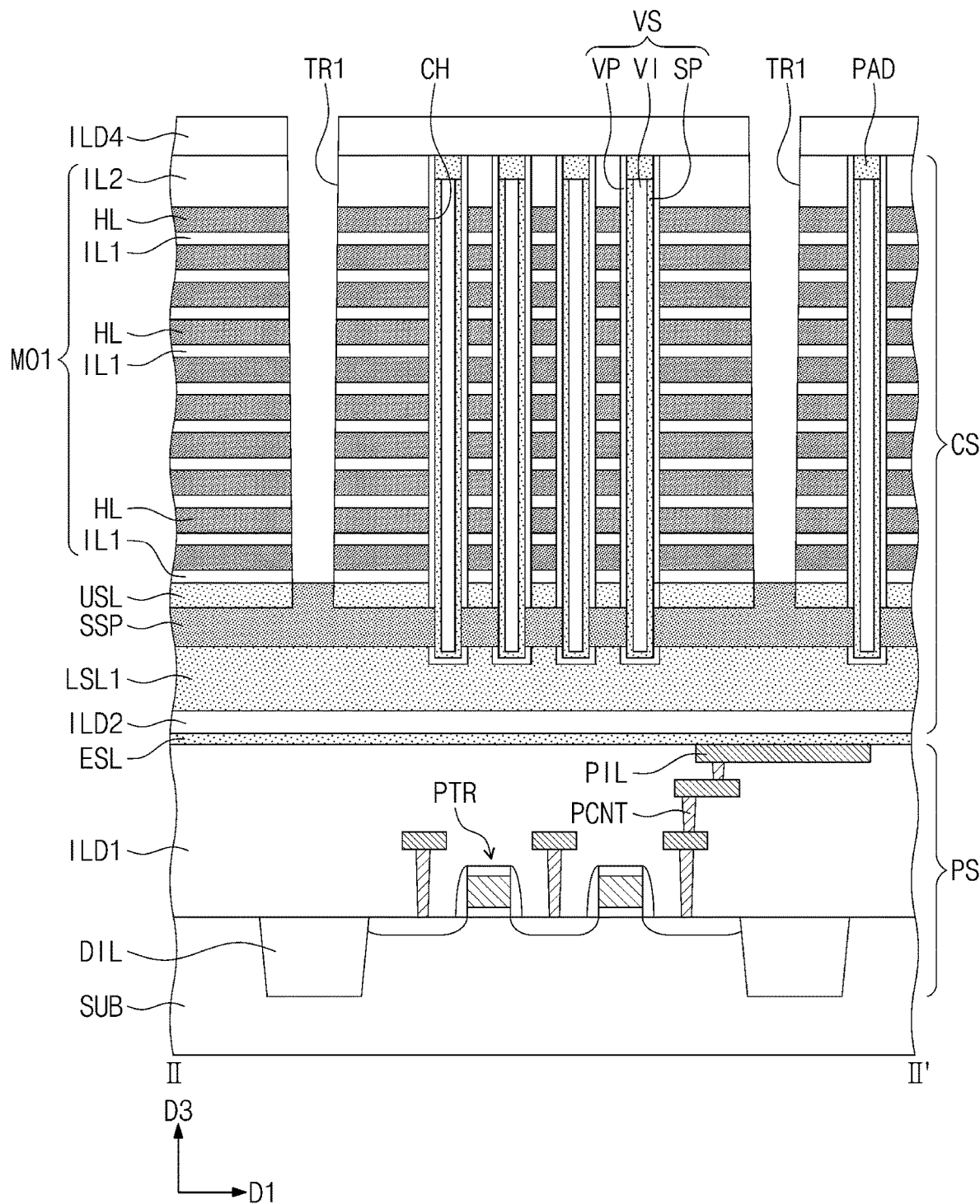

Referring to FIGS. 5, 11A, and 11B, a source semiconductor layer SSP may replace the lower sacrificial layer LHL exposed to the first trenches TR1. For example, the lower sacrificial layer LHL exposed to the first trenches TR1 may be selectively removed. The removal of the lower sacrificial layer LHL may expose a lower portion of the vertical dielectric pattern VP of each of the vertical channel structures VS.

The exposed lower portion of the vertical dielectric pattern VP may be selectively removed. Therefore, a lower portion of the vertical semiconductor pattern SP may be exposed. While the lower portion of the vertical dielectric pattern VP is removed, the third and fourth dielectric layers IL3 and IL4 may also be removed.

The source semiconductor layer SSP may be formed in a space from which are removed the third dielectric layer IL3, the lower sacrificial layer LHL, and the fourth dielectric layer IL4. The source semiconductor layer SSP may directly contact the exposed lower portion of the vertical semiconductor pattern SP. The source semiconductor layer SSP may directly contact one of the first to fourth lower semiconductor layers LSL1 to LSL4 that underlie the source semiconductor layer SSP. The source semiconductor layer SSP may directly contact the upper semiconductor layer USL that overlies the source semiconductor layer SSP.

Figure 12A:
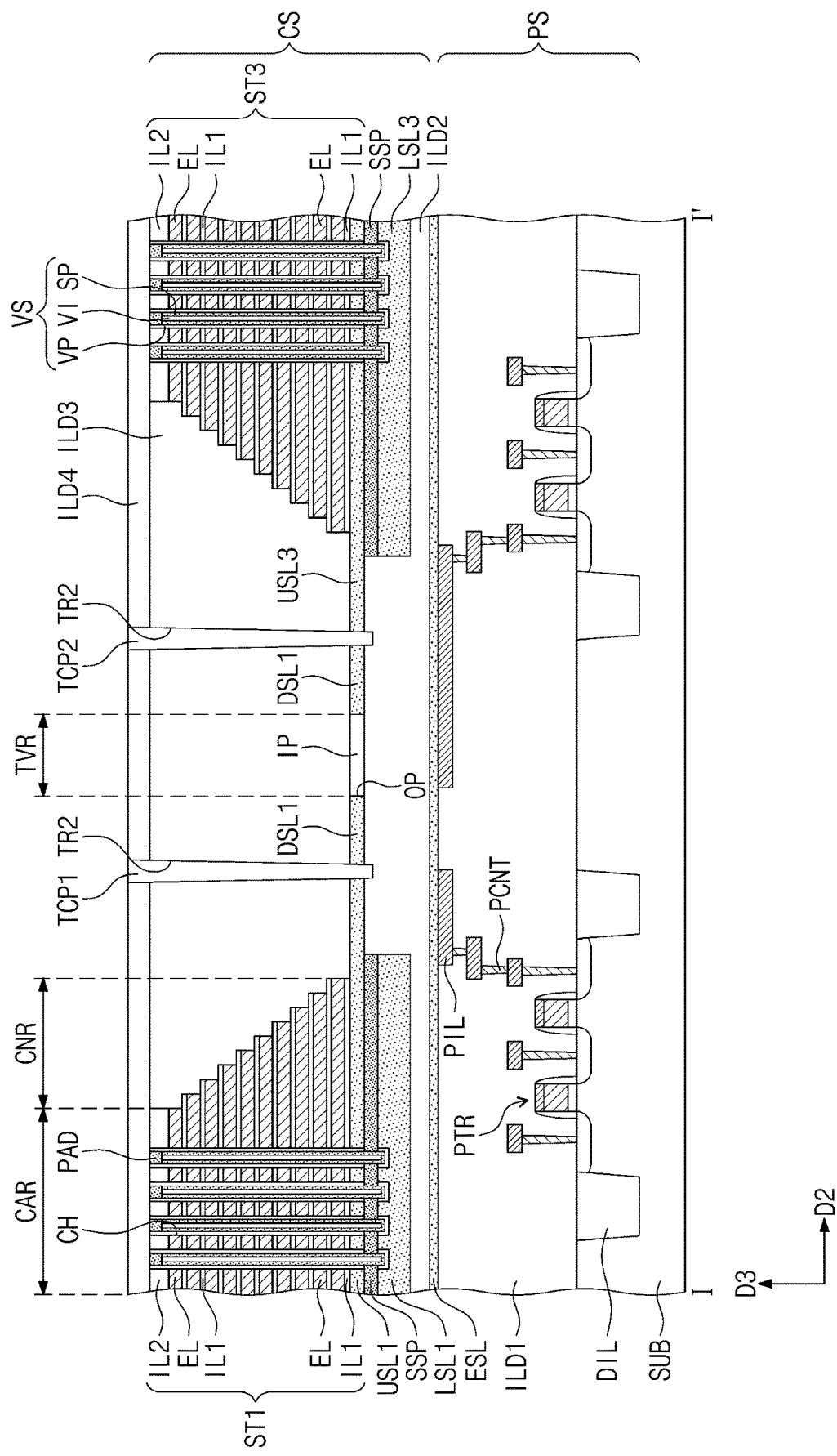
Figure 12B:
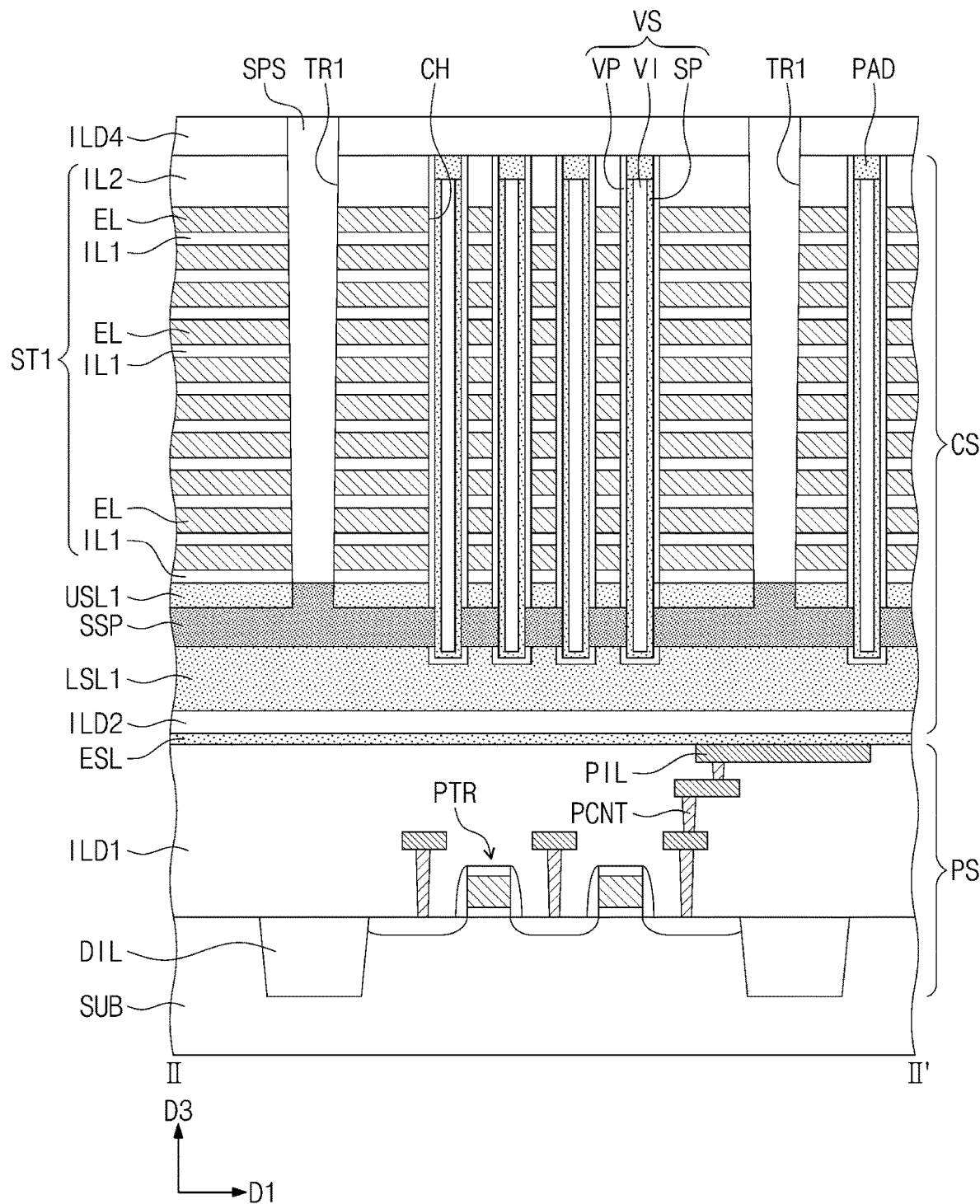

Referring to FIGS. 5, 12A, and 12B, electrodes EL may replace corresponding sacrificial layers HL exposed to the first trenches TR1. For example, the sacrificial layers HL exposed to the first trenches TR1 may be selectively removed. The electrode EL may be formed in each of spaces where the sacrificial layers HL are removed.

A second trench TR2 may be formed to penetrate the fourth interlayer dielectric layer ILD4, the third interlayer dielectric layer ILD3, and the upper semiconductor layer USL. When viewed in plan, the second trench TR2 may include a portion that extends in the first direction D1 and a portion that extends in the second direction D2.

The second trench TR2 may divide the upper semiconductor layer USL into a plurality of sections. For example, the upper semiconductor layer USL may be divided into first to fourth upper semiconductor layers USL1 to USL4 and into first and second dummy semiconductor layers DSL1 and DSL2. The second trench TR2 may separate and insulate the first to fourth upper semiconductor layers USL1 to USL4 from each other. The first to fourth upper semiconductor layers USL1 to USL4 may be respectively disposed on the first to fourth lower semiconductor layers LSL1 to LSL4.

A cutting structure TCP may be formed to fill the second trench TR2. The formation of the cutting structure TCP may include forming a dielectric layer to fill the second trench TR2 and performing a planarization process until a top surface of the fourth interlayer dielectric layer ILD4 is exposed. For example, the cutting structure TCP may include a first cutting structure TCP1 and a second cutting structure TCP2 that are provided between the first electrode structure ST1 and the third electrode structure ST3.

The cutting structure TCP may separate the upper semiconductor layer USL into the first to fourth upper semiconductor layers USL1 to USL4. The first to fourth upper semiconductor layers USL1 to USL4 may be insulated from each other. Accordingly, the first to fourth electrode structures ST1 to ST4 respectively on the first to fourth upper semiconductor layers USL1 to USL4 may operate independently of each other.

Referring back to FIGS. 5, 6A, 6B, and 6C, at least one through contact TVS may be formed which penetrates the fourth interlayer dielectric layer ILD4, the third interlayer dielectric layer ILD3, the dielectric pattern IP, the second interlayer dielectric layer ILD2, and the etch stop layer ESL and which is electrically connected to the peripheral line PIL of the peripheral circuit structure PS. The through contact TVS may be formed on the through contact region TVR.

The formation of the through contact TVS may include forming a through hole that extends from the fourth interlayer dielectric layer ILD4 to the peripheral line PIL of the peripheral circuit structure PS, and filling the through hole with a conductive material. Before the through hole is filled with a conductive material, a spacer SS may be formed on an inner wall of the through hole.

Bit-line contact plugs BPLG may be formed which penetrate the fourth interlayer dielectric layer ILD4 and which are coupled to corresponding vertical channel structures VS. Cell contact plugs PLG may be formed which penetrate the third and fourth interlayer dielectric layers ILD3 and ILD4 and which are coupled to corresponding electrodes EL. On the fourth interlayer dielectric layer ILD4, bit lines BL may be formed to have electrical connection with the bit-line contact plugs BPLG, and connection lines CL may be formed to have electrical connection with the cell contact plugs PLG.

Figure 13A:
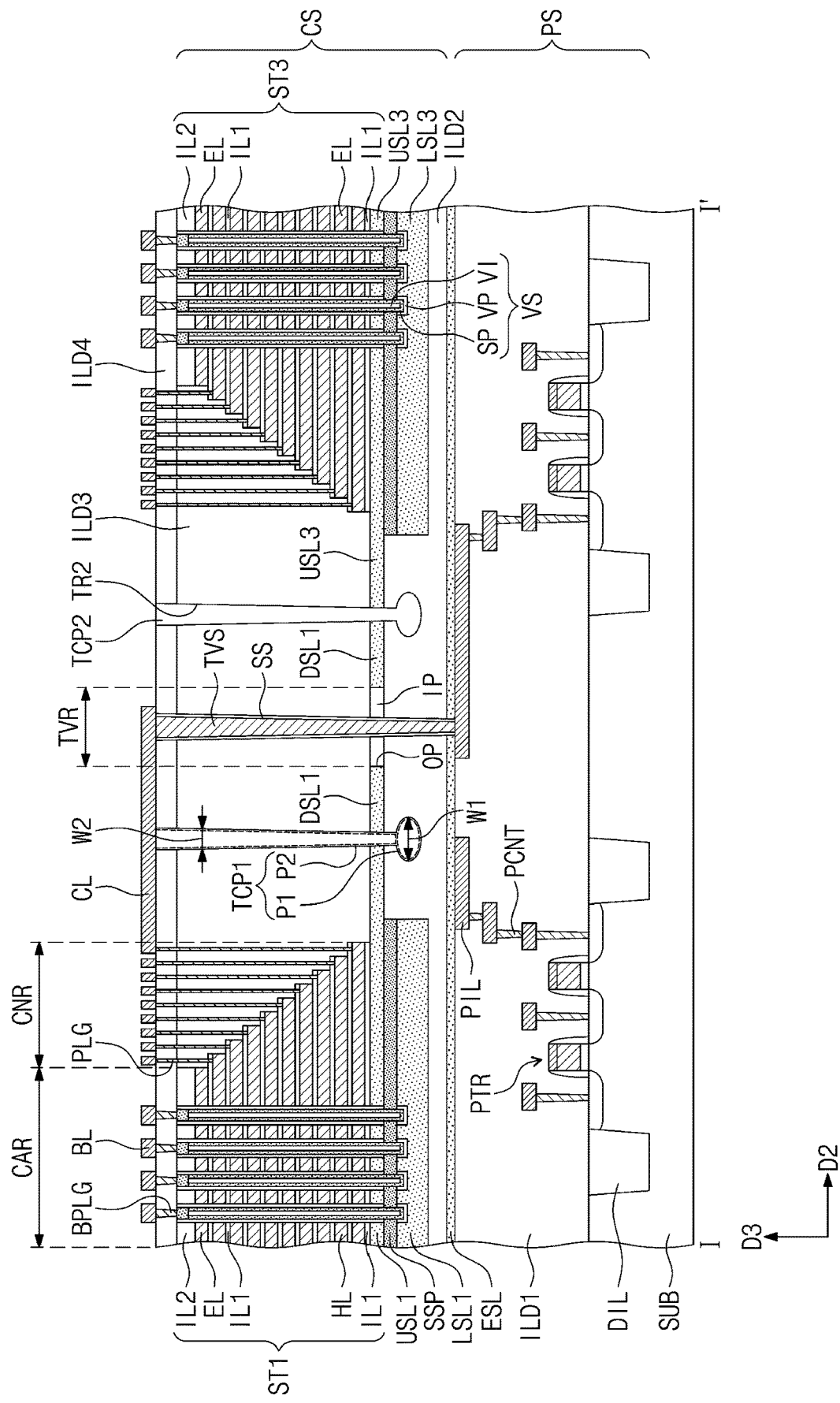
FIGS. 13A and 13B illustrate cross-sectional views respectively taken along lines I-I' and III-III' of FIG. 5, showing a three-dimensional semiconductor memory device, according to example embodiments of the present inventive concepts.
Figure 13B:
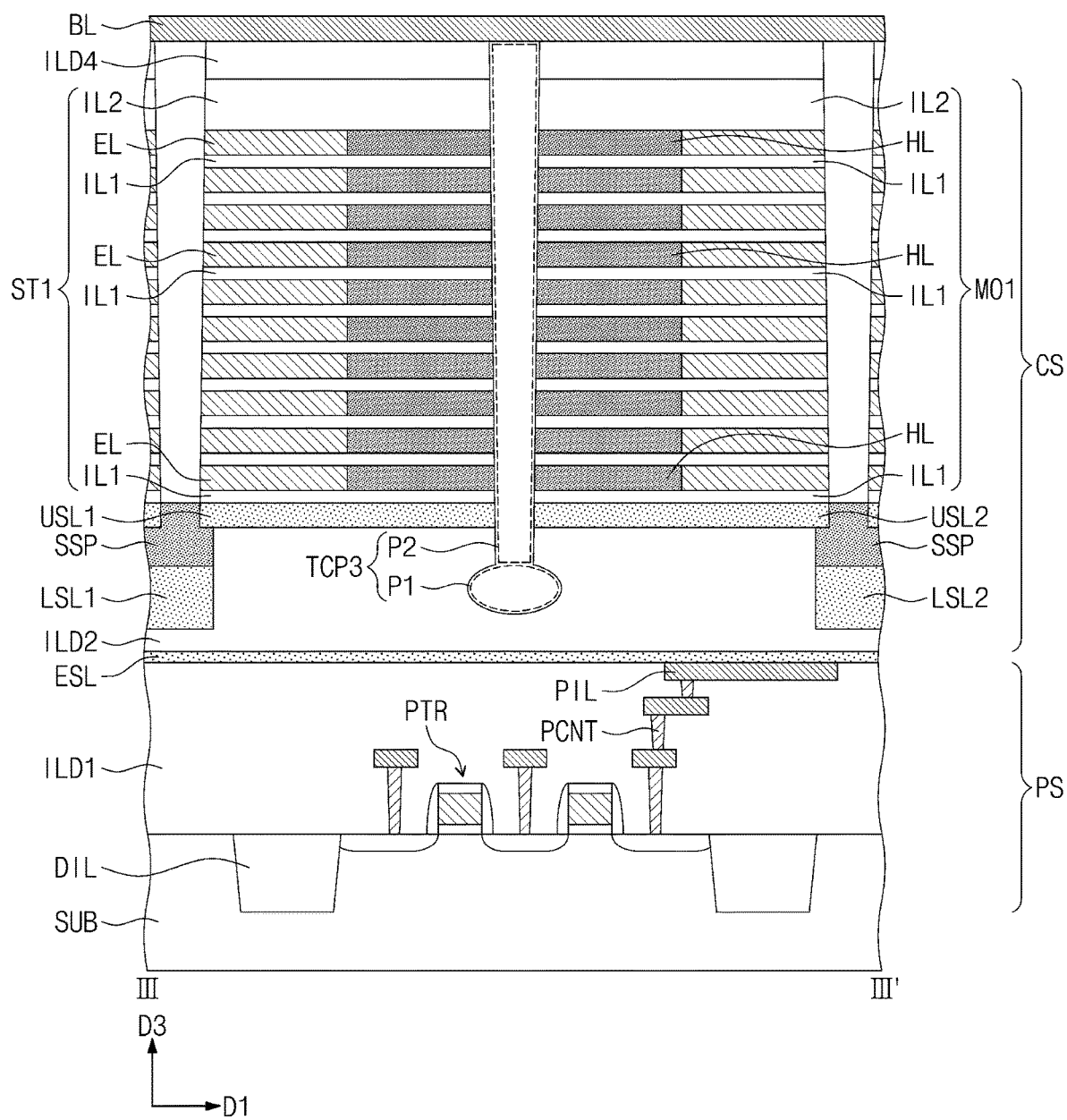

FIGS. 13A and 13B illustrate cross-sectional views respectively taken along lines I-I' and III-III' of FIG. 5, showing a three-dimensional semiconductor memory device according to some example embodiments of the present inventive concepts. In the embodiment that follows, a detailed description of technical features repetitive to those discussed above with reference to FIGS. 5, 6A, 6B, and 6C will be omitted, and a difference thereof will be discussed in detail.

Referring to FIGS. 5, 13A, and 13B, the cutting structure TCP may include an expansion part at a lower portion thereof. For example, the first cutting structure TCP1 may include an expansion part P1 at a lower portion thereof and an extension part P2 on the expansion part P1. The extension part P2 may penetrate the upper semiconductor layer USL. The expansion part P1 may be provided in the second interlayer dielectric layer ILD2.

The expansion part P1 of the first cutting structure TCP may have a first width W1 in the second direction D2. As approaching a lower portion of the expansion part P1 from an upper portion of the expansion part P1, the first width W1 may progressively increase up to a maximum value and then may gradually decrease. For example, the expansion part P1 may have an oval shape when viewed in cross-section The extension part P2 of the first cutting structure TCP1 may have a second width W2 in the second direction D2. The second width W2 may progressively decrease as approaching a lower portion of the extension part P2 from an upper portion of the extension part P2.

The maximum value of the first width W1 of the expansion part P1 may be greater than that of the second width W2 of the extension part P2. The first cutting structure TCP1 may have a width that abruptly changes at a boundary between the expansion part P1 and the extension part P2. The boundary between the expansion part P1 and the extension part P2 may be located at a level between a bottom surface of the first lower semiconductor layer LSL1 and a bottom surface of the first upper semiconductor layer USL1.

Figure 14A:
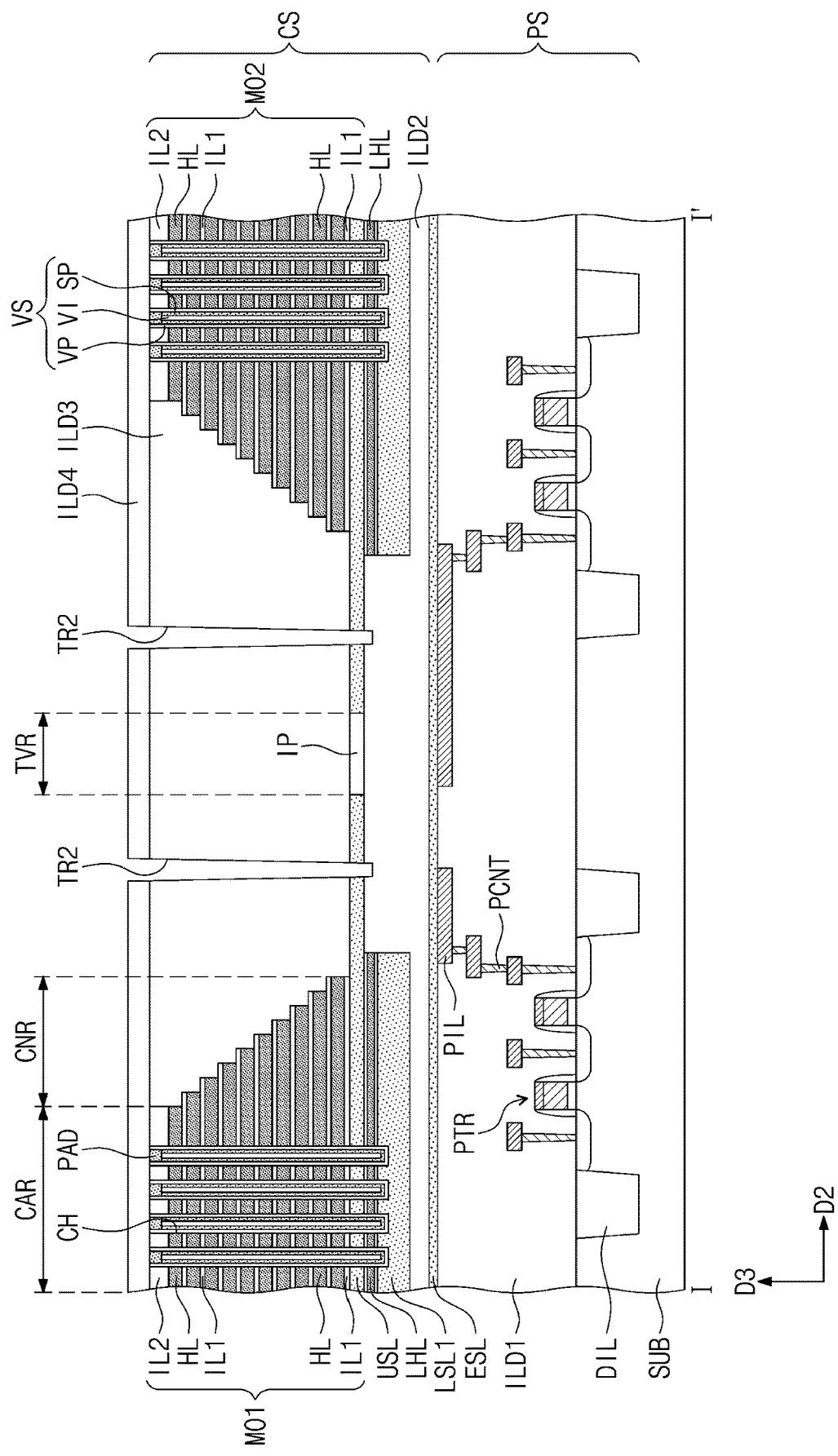
FIGS. 14A and 15A illustrate cross-sectional views taken along line I-I' of FIG. 5, showing a method of fabricating a three-dimensional semiconductor memory device, according to example embodiments of the present inventive concepts.
Figure 14B:
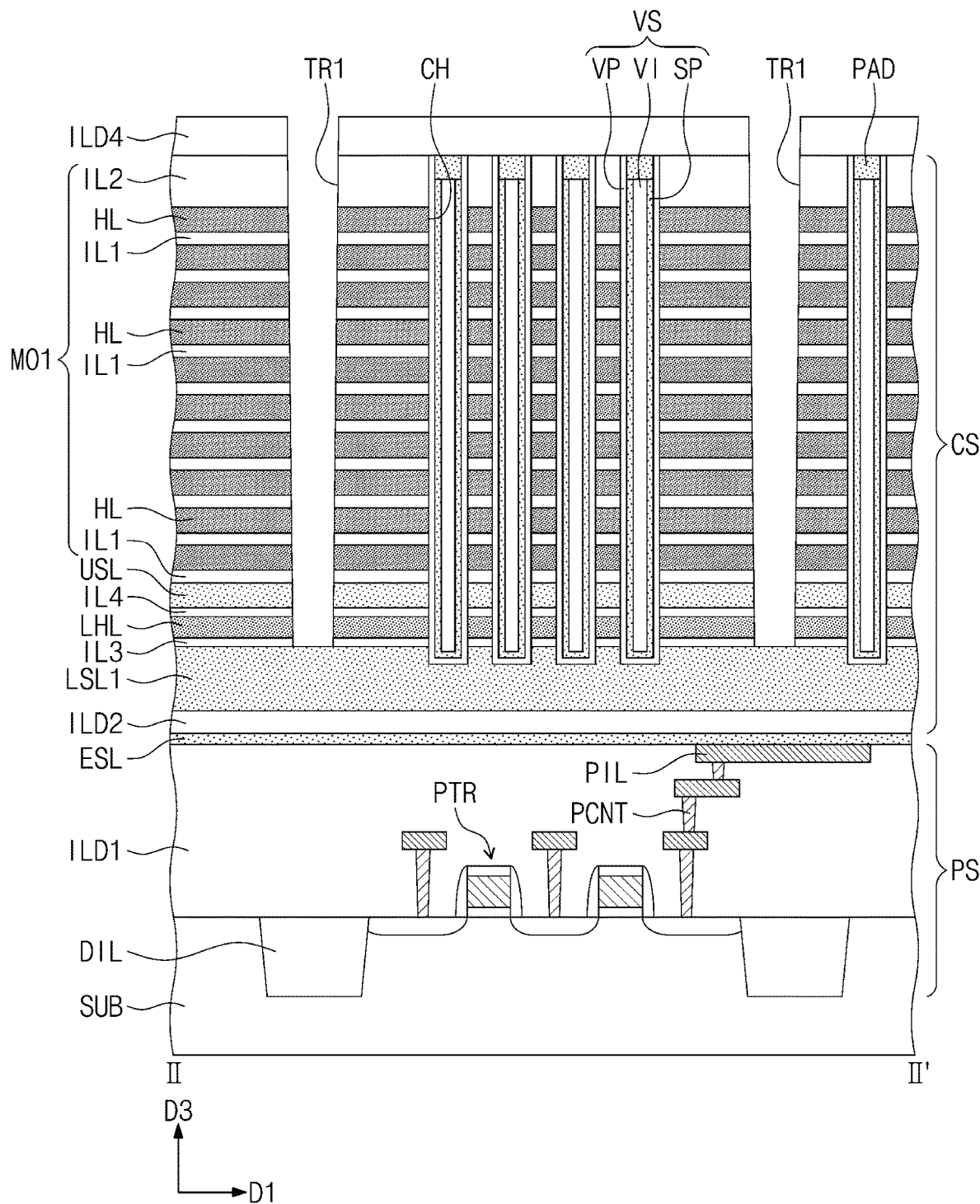
FIGS. 14B and 15B illustrate cross-sectional views taken along line II-II' of FIG. 5, showing a method of fabricating a three-dimensional semiconductor memory device, according to example embodiments of the present inventive concepts.
Figure 15A:
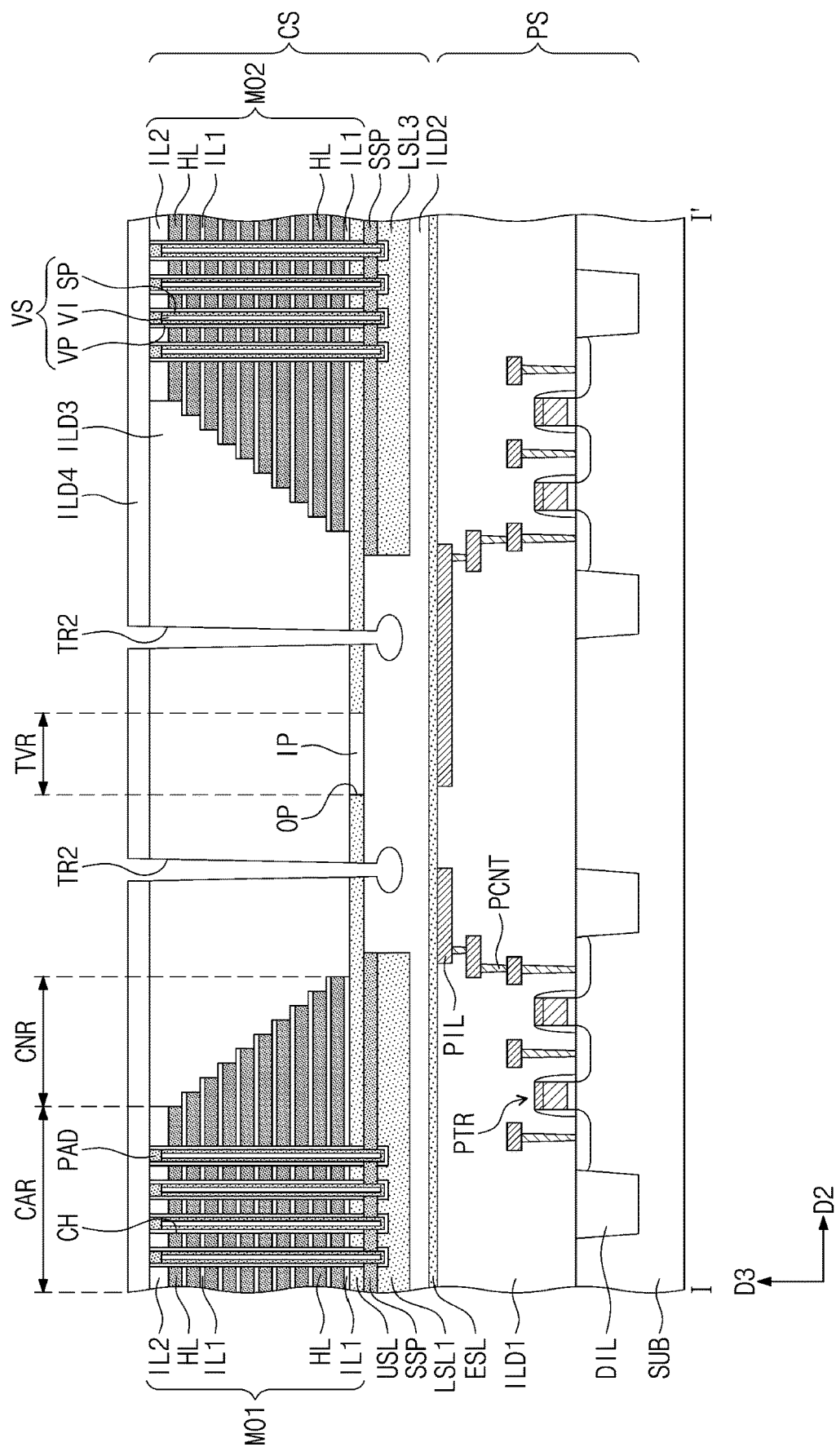
Figure 15B:
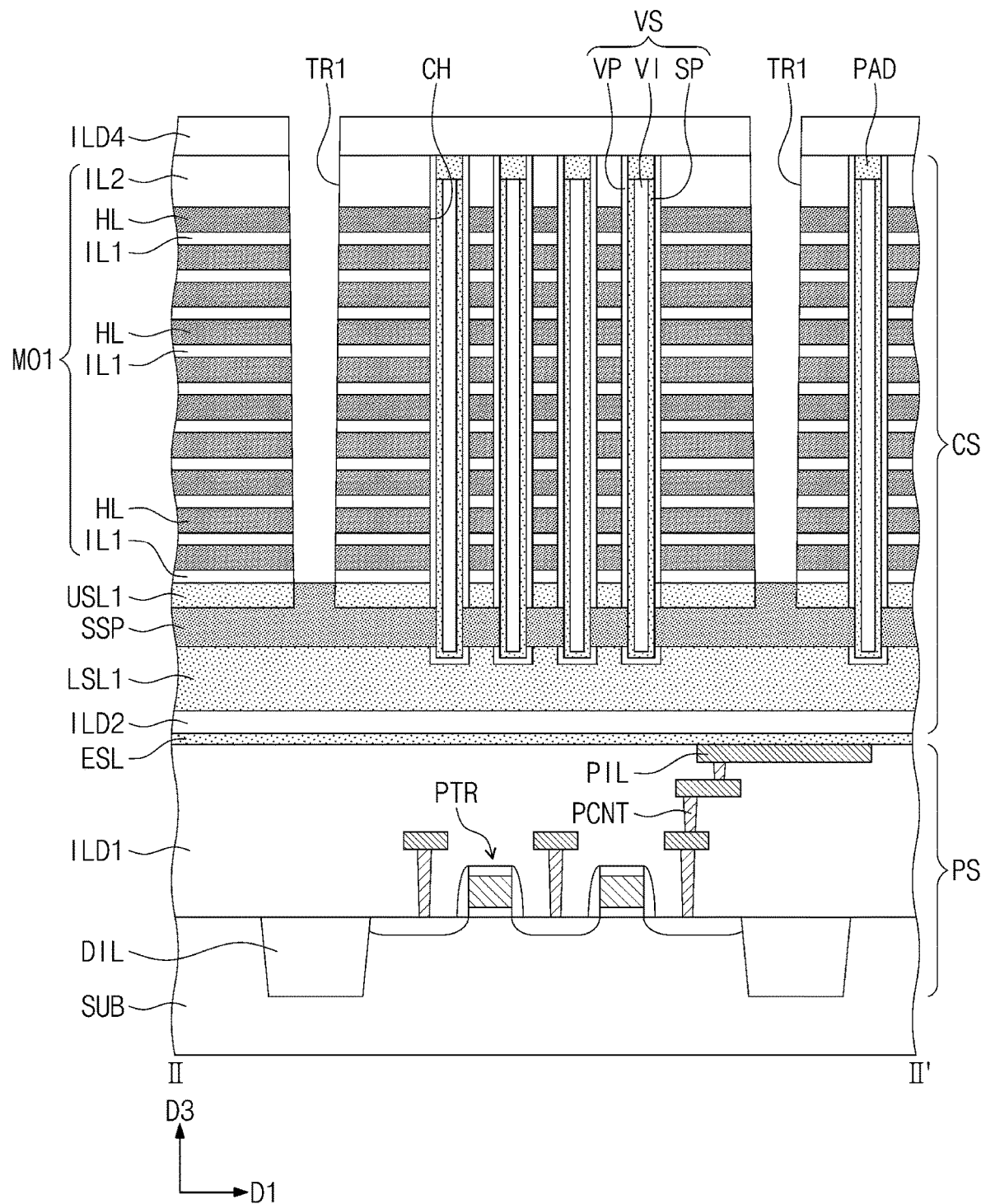

FIGS. 14A and 15A illustrate cross-sectional views taken along line I-I' of FIG. 5, showing a method of fabricating a three-dimensional semiconductor memory device according to example embodiments of the present inventive concepts. FIGS. 14B and 15B illustrate cross-sectional views taken along line II-II' of FIG. 5, showing a method of fabricating a three-dimensional semiconductor memory device according to example embodiments of the present inventive concepts. In the embodiment that follows, a detailed description of technical features repetitive to those discussed with reference to FIGS. 8A to 12B will be omitted, and a difference thereof will be discussed in detail.

Referring to FIGS. 5, 14A, and 14B, on a result structure of FIGS. 10A and 10B, a second trench TR2 may be formed to penetrate the third interlayer dielectric layer ILD3 and the upper semiconductor layer USL. As an example embodiment of the present inventive concepts, the second trench TR2 may be formed simultaneously with the first trenches TR1. As another example embodiment of the present inventive concepts, the first trenches TR1 may be formed, and thereafter the second trench TR2 may be formed. The second trench TR2 may expose a portion of the second interlayer dielectric layer ILD2.

Referring to FIGS. 5, 15A, and 15B, a source semiconductor layer SSP may replace the lower sacrificial layer LHL exposed to the first trenches TR1. During the replacement of the source semiconductor layer SSP, the second interlayer dielectric layer ILD2 may be etched at its portion exposed to the second trench TR2. For example, the replacement of the source semiconductor layer SSP may include a process that etches a lower portion of the vertical dielectric pattern VP, and the second interlayer dielectric layer ILD2 may be etched at its portion exposed by the etching process. Therefore, an expansion space may be formed in a lower portion of the second trench TR2. Subsequently, the second trench TR2 may be filled with a dielectric material to form a cutting structure TCP.

Figure 16:
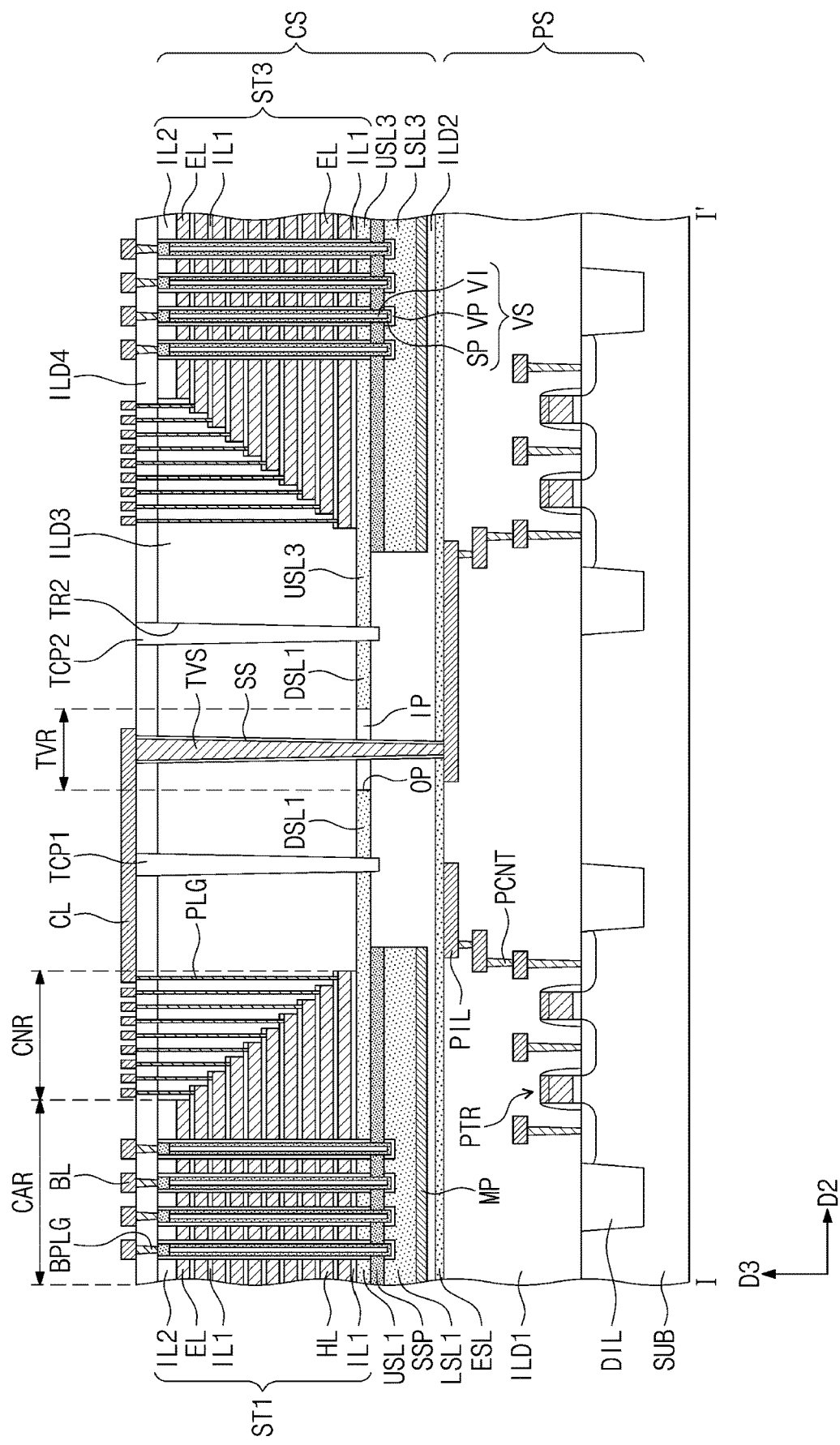
FIG. 16 illustrates a cross-sectional view taken along line I-I' of FIG. 5, showing a three-dimensional semiconductor memory device, according to example embodiments of the present inventive concepts.

FIG. 16 illustrates a cross-sectional view taken along line I-I' of FIG. 5, showing a three-dimensional semiconductor memory device according to example embodiments of the present inventive concepts. In the embodiment that follows, a detailed description of technical features repetitive to those discussed above with reference to FIGS. 5, 6A, 6B, and 6C will be omitted, and a difference thereof will be discussed in detail.

Referring to FIGS. 5 and 16, a metal pattern MP may be provided below each of the first to fourth lower semiconductor layers LSL1 to LSL4. The metal pattern MP may directly contact a bottom surface of each of the first to fourth lower semiconductor layers LSL1 to LSL4. Side surfaces of the metal pattern MP may be vertically aligned with side surfaces of each of the first to fourth lower semiconductor layers LSL1 to LSL4. When viewed in plan, the metal pattern MP may overlap its overlying one of the first to fourth lower semiconductor layers LSL1 to LSL4.

The metal pattern MP may include at least one selected from metals (e.g., tungsten, copper, or aluminum), conductive metal nitrides (e.g., titanium nitride or tantalum nitride), and transition metals (e.g., titanium or tantalum). According to some example embodiments of the present inventive concepts, when a three-dimensional semiconductor memory device operates, the metal pattern MP may be supplied with a voltage generated from a voltage generator.

Figure 17:
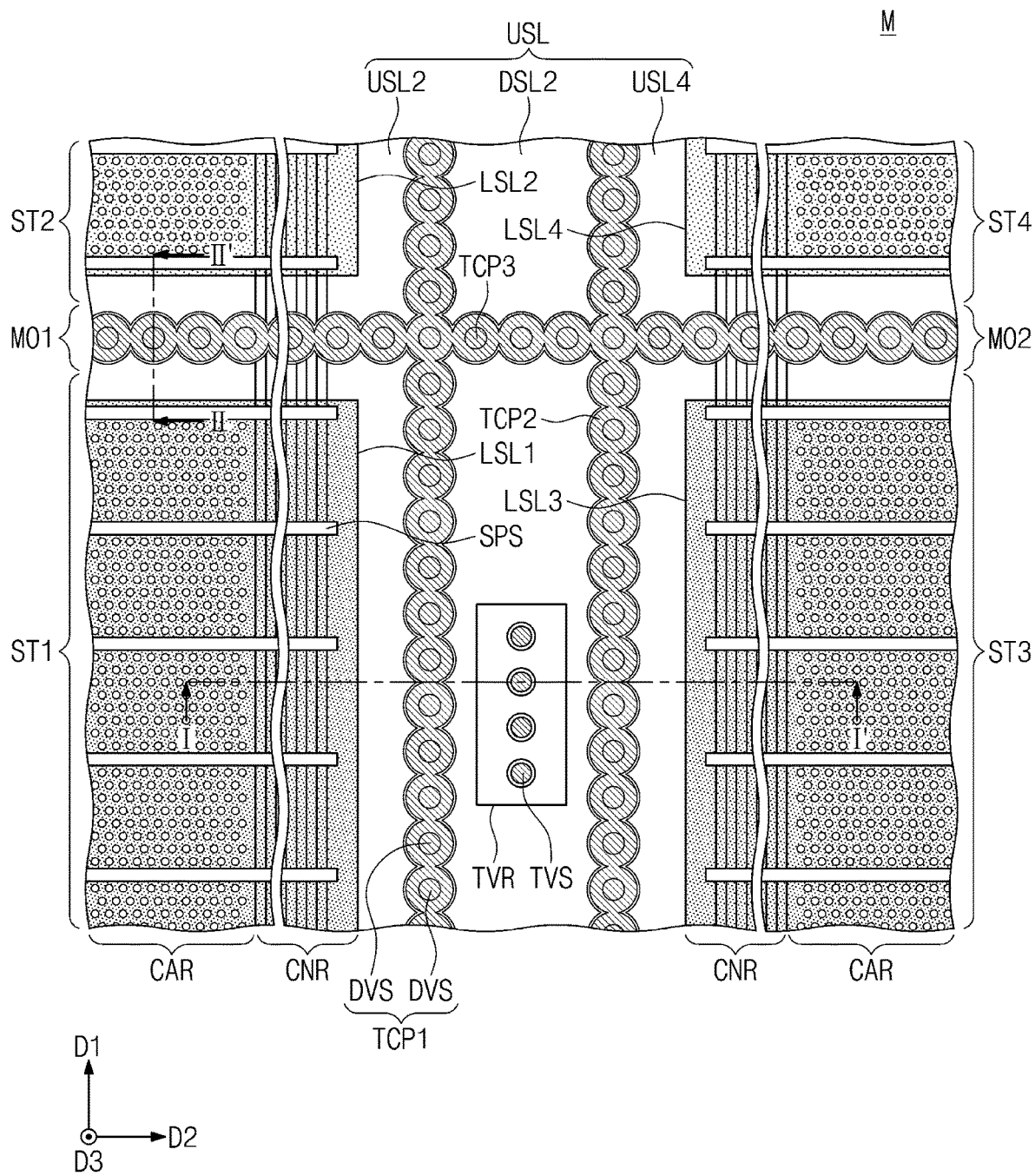
FIG. 17 illustrates an enlarged plan view of section M in FIG. 4, showing a three-dimensional semiconductor memory device, according to example embodiments of the present inventive concepts.
Figure 18A:
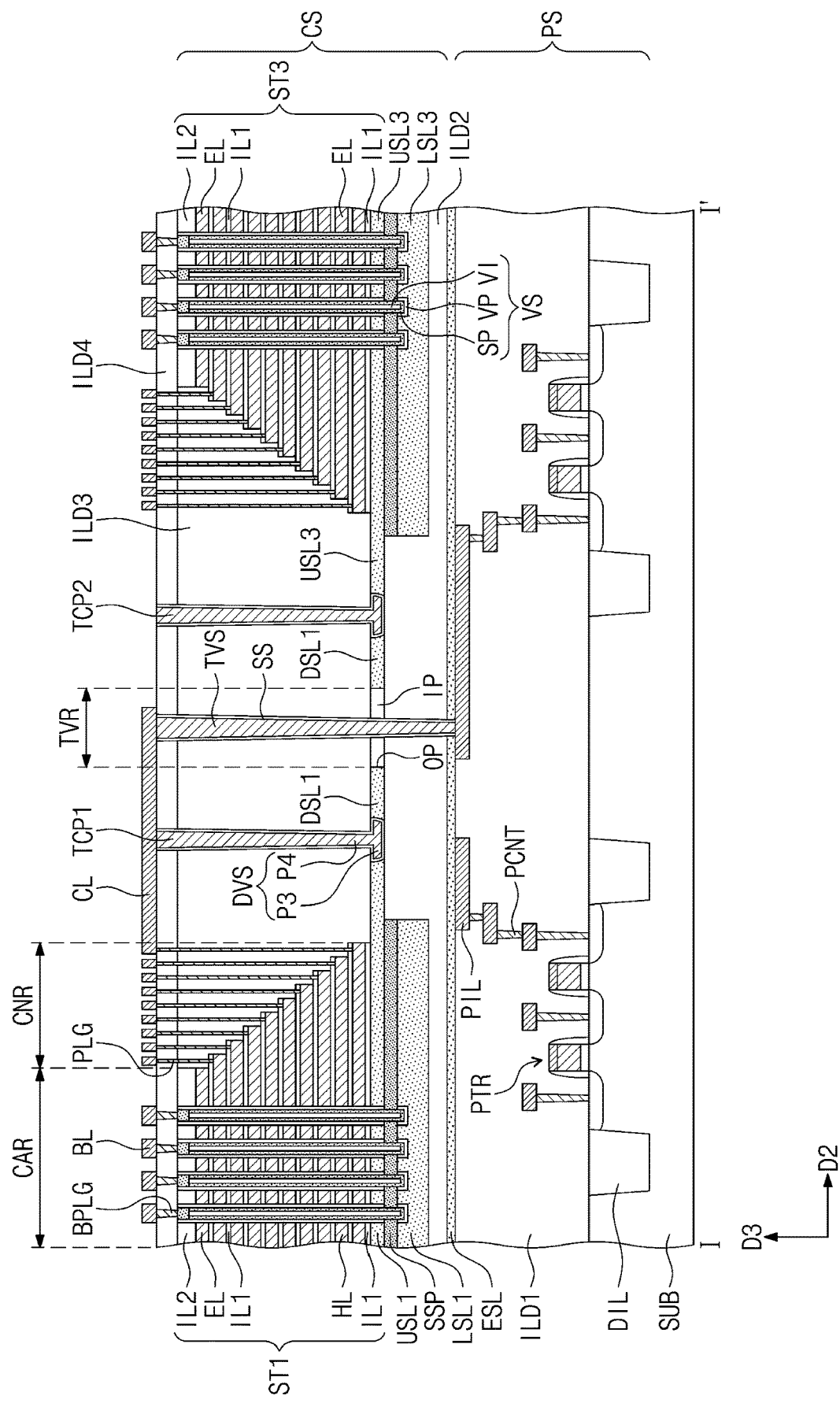
FIGS. 18A and 18B illustrate cross-sectional views respectively taken along lines I-I' and II-II' of FIG. 17.
Figure 18B:
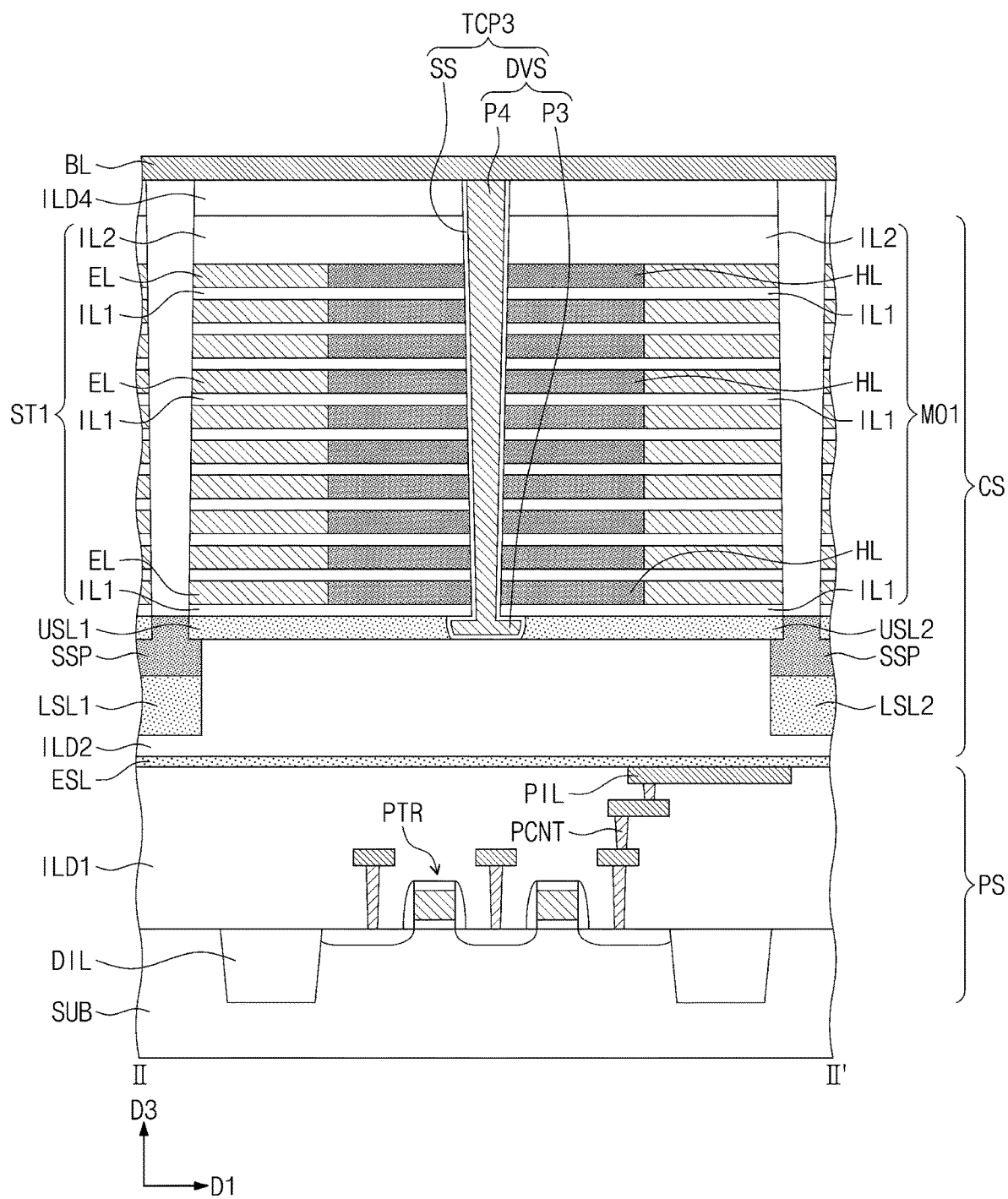

FIG. 17 illustrates an enlarged plan view of section M in FIG. 4, showing a three-dimensional semiconductor memory device according to example embodiments of the present inventive concepts. FIGS. 18A and 18B illustrate cross-sectional views respectively taken along lines I-I' and II-II' of FIG. 17. In the embodiment that follows, a detailed description of technical features repetitive to those discussed above with reference to FIGS. 5, 6A, 6B, and 6C will be omitted, and a difference thereof will be discussed in detail.

Referring to FIGS. 17, 18A, and 18B, the cutting structure TCP may include a plurality of dummy contacts DVS. For example, each of the first and second cutting structures TCP1 and TCP2 may include a plurality of dummy contacts DVS arranged in the first direction D1. The third cutting structure TCP3 may include a plurality of dummy contacts DVS arranged in the second direction D2. For example, the dummy contacts DVS arranged in one direction may be connected to each other. Accordingly, when viewed in plan, the dummy contacts DVS arranged in one direction may each be shaped like a conductive line that extends in the one direction.

Each of the dummy contacts DVS may include a horizontal part P3 at a lower portion thereof and a vertical part P4 on the horizontal part P3. The horizontal part P3 may be provided in the upper semiconductor layer USL. For example, the horizontal part P3 may penetrate the upper semiconductor layer USL. The horizontal part P3 may have a diameter greater than that of the vertical part P4.

As an example of the present inventive concepts, the horizontal parts P3 of the dummy contacts DVS may be arranged in one direction and connected to each other. As another example embodiment of the present inventive concepts, the horizontal parts P3 of the dummy contacts DVS may be arranged spaced apart from each other in one direction.

The cutting structure TCP may further include a spacer SS that surrounds each of the dummy contacts DVS. For example, the spacer SS may be interposed between the upper semiconductor layer USL and the horizontal part P3 of the dummy contact DVS. The spacer SS may surround the horizontal parts P3 arranged in one direction. Accordingly, the upper semiconductor layer USL may be divided into a plurality of sections that are insulated from each other.

For example, the first upper semiconductor layer USL1 and the first dummy semiconductor layer DSL1 may be insulated from each other through the spacer SS of the first cutting structure TCP1 interposed between the first upper semiconductor layer USL1 and the first dummy semiconductor layer DSL1. The third upper semiconductor layer USL3 and the first dummy semiconductor layer DSL1 may be insulated from each other by the spacer SS of the second cutting structure TCP2 interposed between the third upper semiconductor layer USL3 and the first dummy semiconductor layer DSL1. The first upper semiconductor layer USL1 and the second upper semiconductor layer USL2 may be insulated from each other through the spacer SS of the third cutting structure TCP3 interposed between the first upper semiconductor layer USL1 and the second upper semiconductor layer USL2.

Figure 20:
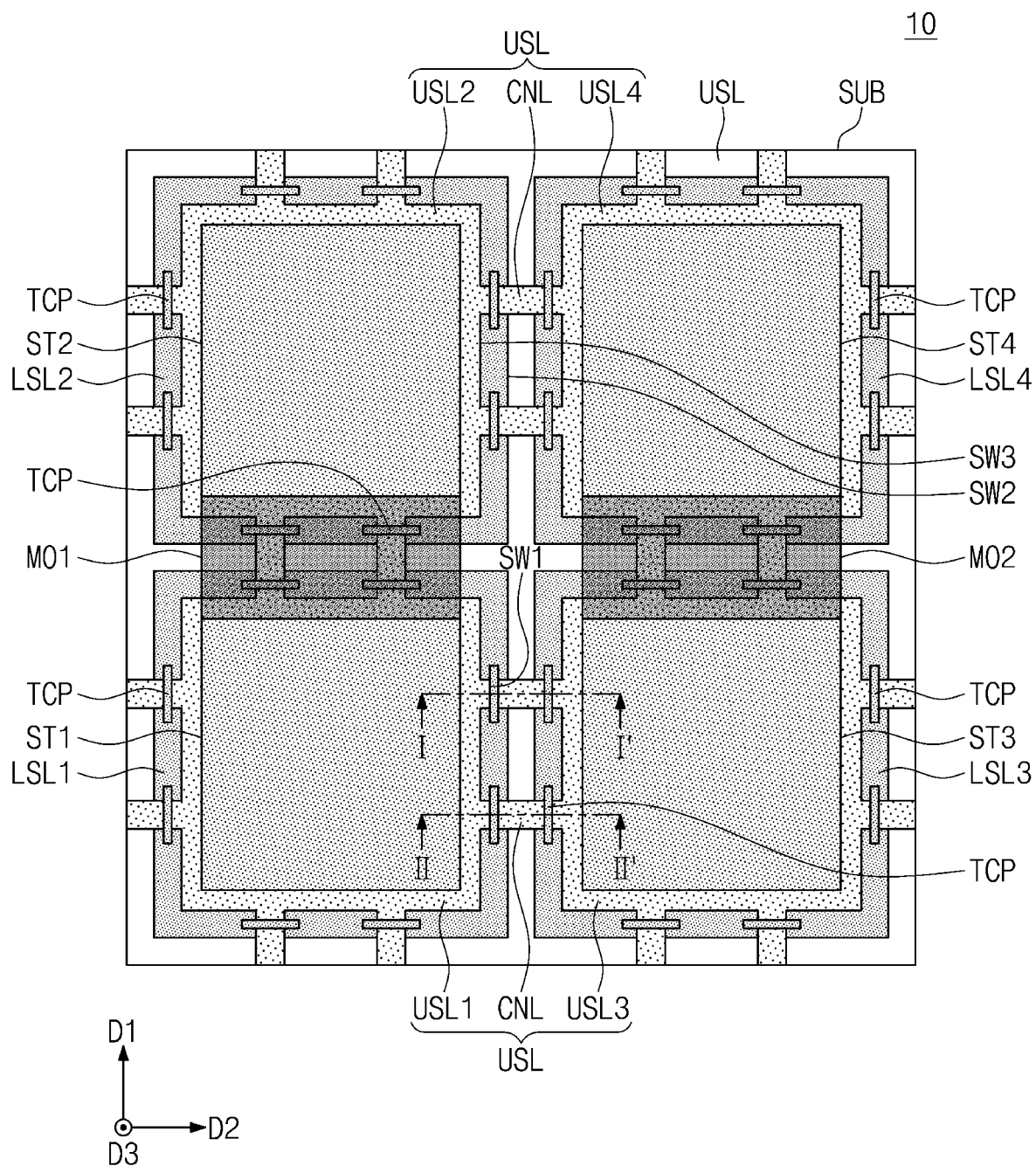
FIG. 20 illustrates a simplified plan view showing a cell array structure of a three-dimensional semiconductor memory device, according to example embodiments of the present inventive concepts.
Figure 21A:
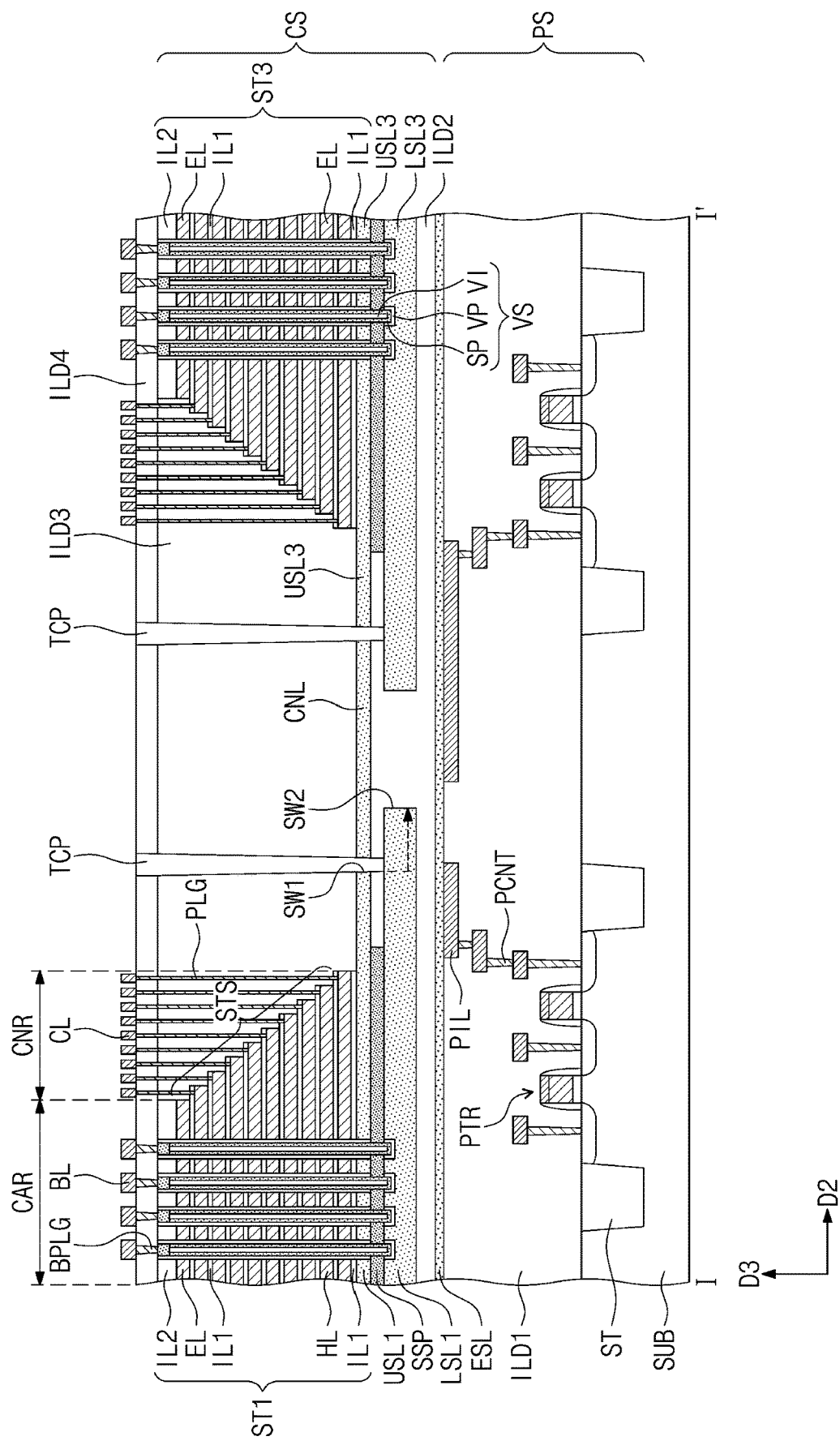

FIG. 20 illustrates a simplified plan view showing a cell array structure of a three-dimensional semiconductor memory device according to example embodiments of the present inventive concepts. FIGS. 21A and 21B illustrate cross-sectional views respectively taken along lines I-I' and II-II' of FIG. 20. In the embodiment that follows, a detailed description of technical features repetitive to those discussed above with reference to FIGS. 5, 6A, 6B, and 6C will be omitted, and a difference thereof will be discussed in detail.

Referring to FIGS. 20, 21A, and 21B, the first to fourth lower semiconductor layers LSL1 to LSL4 may be provided. When viewed in plan, each of the first to fourth lower semiconductor layers LSL1 to LSL4 may have a tetragonal tile shape. The first to fourth lower semiconductor layers LSL1 to LSL4 may be arranged two-dimensionally.

The upper semiconductor layer USL may be provided on the first to fourth lower semiconductor layers LSL1 to LSL4. The upper semiconductor layer USL may include the first to fourth upper semiconductor layers USL1 to USL4 that are respectively provided on the first to fourth lower semiconductor layers LSL1 to LSL4.

The upper semiconductor layer USL may further include connection patterns CNL between adjacent ones of the first to fourth upper semiconductor layers USL1 to USL4. For example, two connection patterns CNL may be interposed between the first upper semiconductor layer USL1 and the second upper semiconductor layer USL2 that are adjacent to each other.

The upper semiconductor layer USL discussed above with reference to FIGS. 5, 6A, 6B, and 6C may have a plate shape on the entire surface of the first substrate SUB. In contrast, according to the present embodiment, the first to fourth upper semiconductor layers USL1 to USL4 may each be shaped like a tile, and the upper semiconductor layer USL may have a shape that is a combination of tiles. The connection patterns CNL may be provided between the first to fourth upper semiconductor layers USL1 to USL4.

At least one cutting structure TCP may be provided on each of the connection patterns CNL of the upper semiconductor layer USL. For example, a pair of cutting structures TCP may be provided on the connection pattern CNL between the first and second upper semiconductor layers USL1 and USL2. The cutting structure TCP according to the present embodiment may have a bar shape with a major axis in one direction.

The cutting structures TCP may penetrate the connection patterns CNL. The cutting structures may separate the connection patterns CNL from the first to fourth upper semiconductor layers USL1 to USL4, electrically isolating the connection patterns CNL from the first to fourth upper semiconductor layers USL1 to USL4. Therefore, none of the first to fourth upper semiconductor layers USL1 to USL4 may be connected to each other through the connection patterns CNL. The cutting structures TCP may separate the first to fourth upper semiconductor layers USL1 to USL4 from each other.

The first upper semiconductor layer USL1 may have a first sidewall SW1 defined by the cutting structure TCP. The first lower semiconductor layer LSL1 may have a second sidewall SW2 that extends in the first direction D1. The first upper semiconductor layer USL1 may have a third sidewall SW3 that extends in the first direction D1. The third sidewall SW3 may be positioned between a pair of connection patterns CNL.

The second sidewall SW2 may be offset in the second direction D2 from the first and third sidewalls SW1 and SW3. The second sidewall SW2 may protrude in the second direction D2 beyond the first and third sidewalls SW1 and SW3.

The further protrusion of the second sidewall SW2 may allow the first lower semiconductor layer LSL1 to have thereon the cutting structure TCP that penetrates the connection pattern CNL. The cutting structure TCP may not penetrate the first lower semiconductor layer LSL1. The cutting structure TCP may have a bottom surface higher than that of the first lower semiconductor layer LSL1. In some embodiments, a bottom surface of the cutting structures TCP may contact a top surface of the first lower semiconductor layer LSL1.

The first lower semiconductor layer LSL1 may serve as an etch stop layer when the cutting structure TCP is formed. When the first lower semiconductor layer LSL1 is not provided below the cutting structure TCP, the cutting structure TCP may extend to the peripheral circuit structure PS and thus may damage the peripheral line PIL at top of the peripheral circuit structure PS. According to some example embodiments of the present inventive concepts, one or more of the lower semiconductor layers LSL1 to LSL4 may prevent the cutting structure TCP from being over-etched, and thus it may be possible to avoid process defects and to increase device reliability.

Figure 22A:
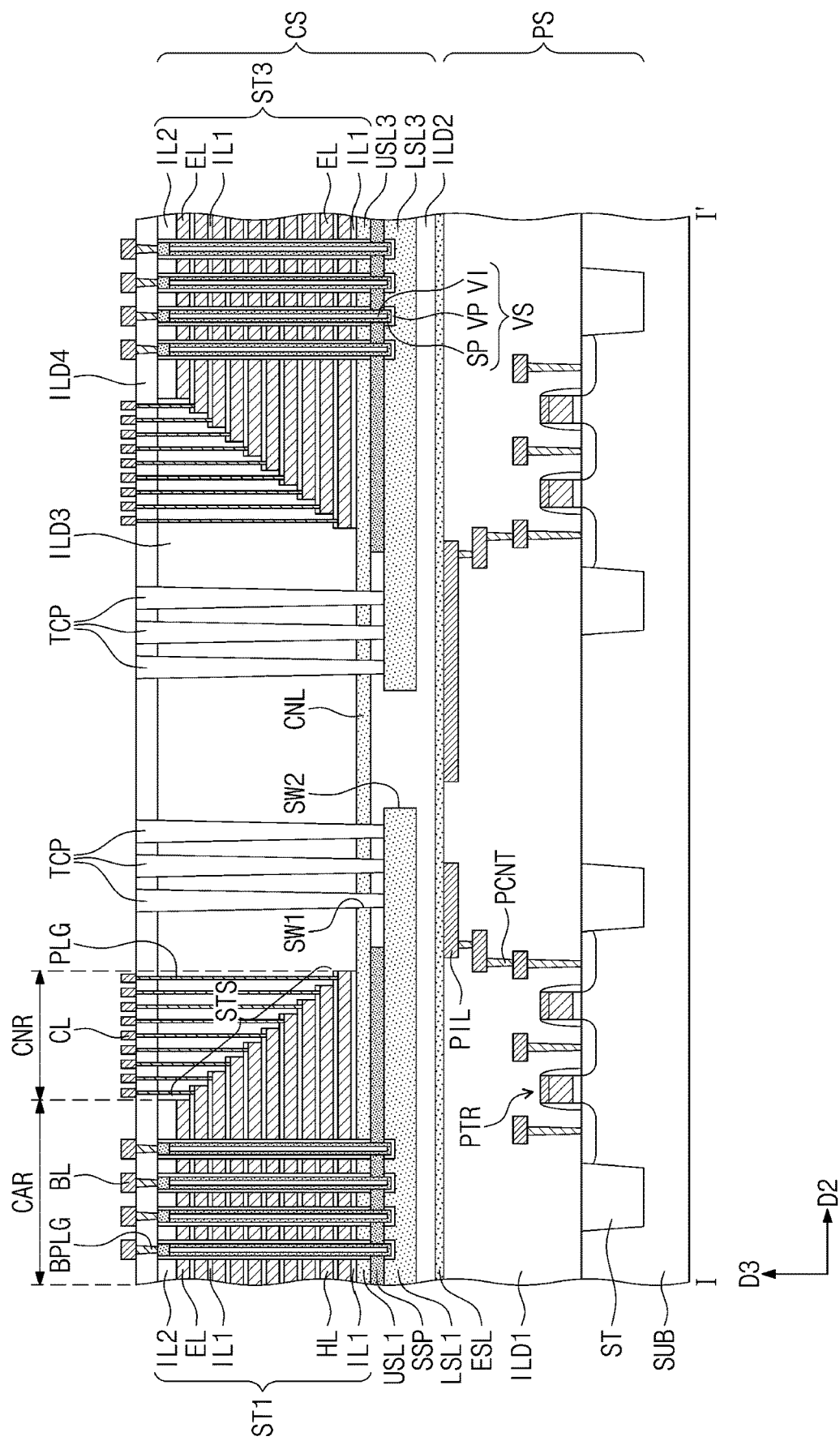
FIGS. 22A and 22B illustrate cross sectional views respectively taken along lines I-I' and II-II' of FIG. 20, showing a three-dimensional semiconductor memory device, according to example embodiments of the present inventive concepts.
Figure 22B:
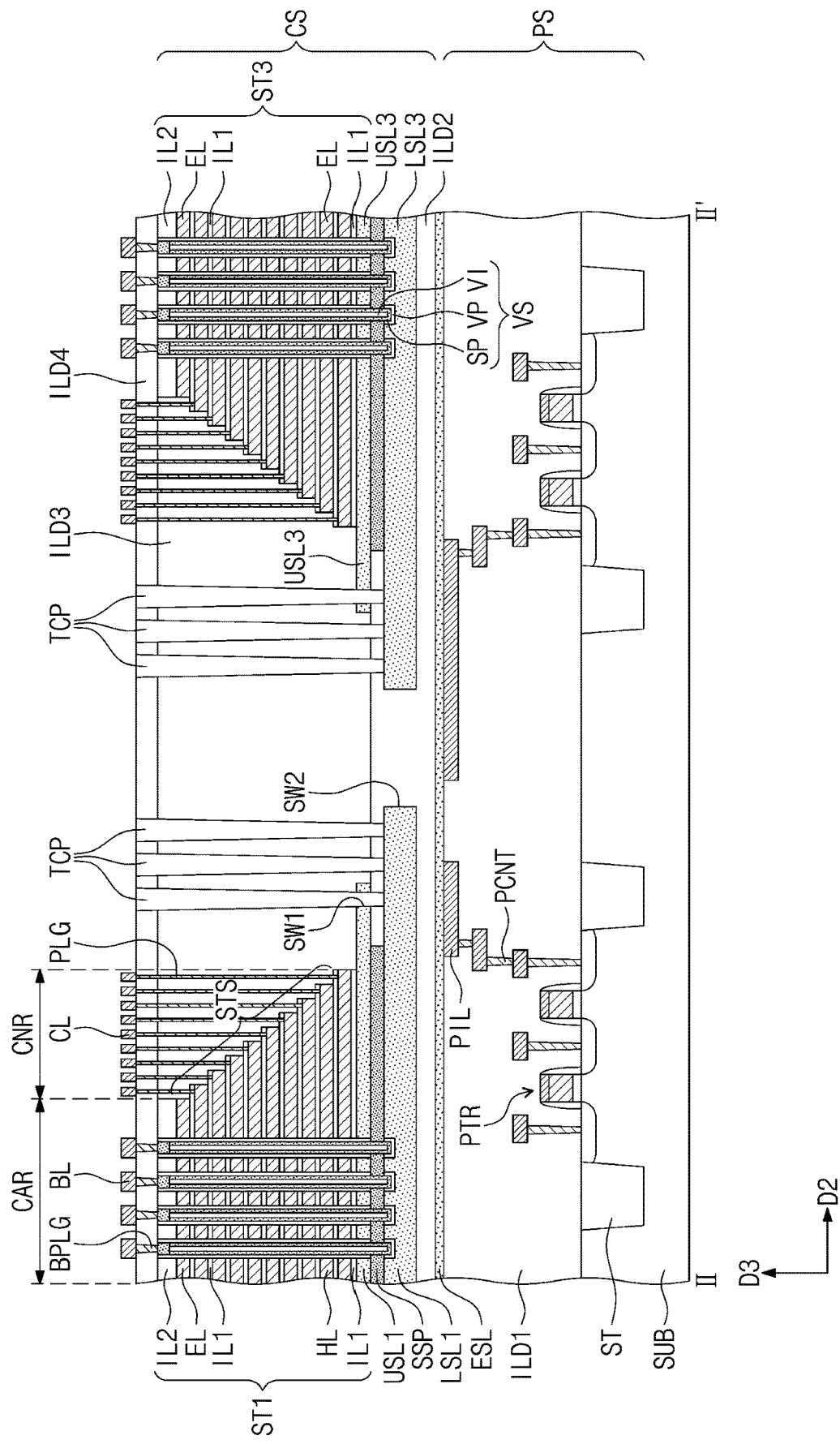

FIGS. 22A and 22B illustrate cross sectional views respectively taken along lines I-I' and II-II' of FIG. 20, showing a three-dimensional semiconductor memory device according to example embodiments of the present inventive concepts.

Referring to FIGS. 20, 22A, and 22B, a plurality of cutting structures TCP may be provided on the first lower semiconductor layer LSL1. For example, three cutting structures TCP may be provided on the first lower semiconductor layer LSL1. The three cutting structures TCP on the first lower semiconductor layer LSL1 may penetrate the connection pattern CNL. The first upper semiconductor layer USL1 may have a third sidewall SW3 between adjacent two of the three cutting structures TCP.

Figure 23:
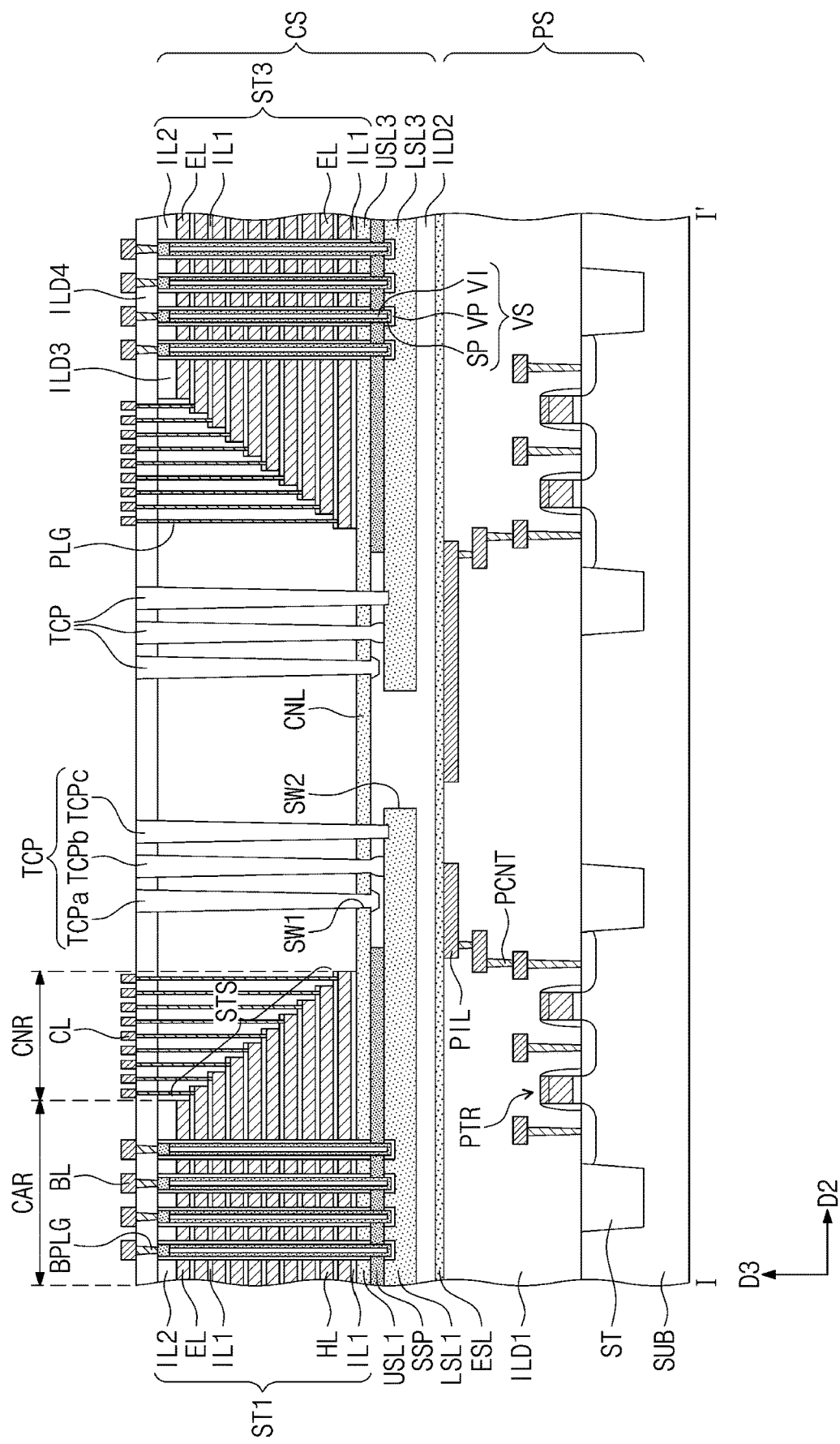
FIG. 23 illustrates a cross-sectional view taken along line I-I' of FIG. 20, showing a three-dimensional semiconductor memory device, according to example embodiments of the present inventive concepts.

FIG. 23 illustrates a cross-sectional view taken along line I-I' of FIG. 20, showing a three-dimensional semiconductor memory device according to example embodiments of the present inventive concepts.

Referring to FIGS. 20 and 23, a plurality of cutting structures TCP may be provided on the first lower semiconductor layer LSL1. The cutting structures TCP may include a first cutting pattern TCPa, a second cutting pattern TCPb, and a third cutting pattern TCPc.

The first cutting pattern TCPa may have a bottom surface between the upper semiconductor layer USL and the first lower semiconductor layer LSL1. Similar to the expansion part P1 discussed above with reference to FIG. 13A, the first cutting pattern TCPa may horizontally expand at a lower portion thereof.

The second cutting pattern TCPb may have a bottom surface in contact with a top surface of the first lower semiconductor layer LSL1. Similar to the expansion part P1 discussed above with reference to FIG. 13, the second cutting pattern TCPb may horizontally expand at a lower portion thereof.

The third cutting pattern TCPc may have a bottom surface between top and bottom surfaces of the first lower semiconductor layer LSL1. Different from the first and second cutting patterns TCPa and TCPb, the third cutting pattern TCPc may include no expansion part.

Figure 24:
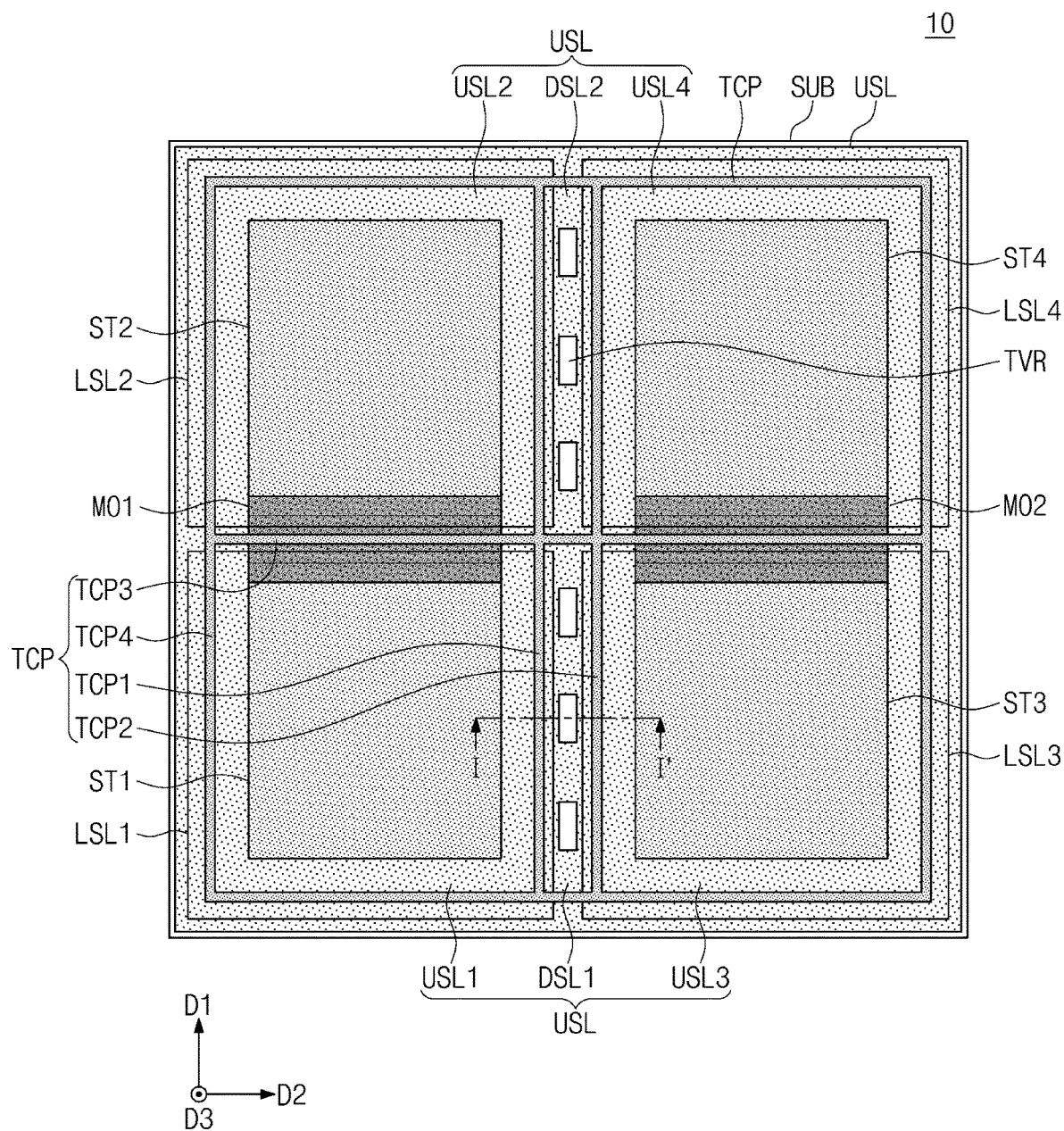
FIG. 24 illustrates a simplified plan view showing a cell array structure of a three-dimensional semiconductor memory device, according to example embodiments of the present inventive concepts.
Figure 25:
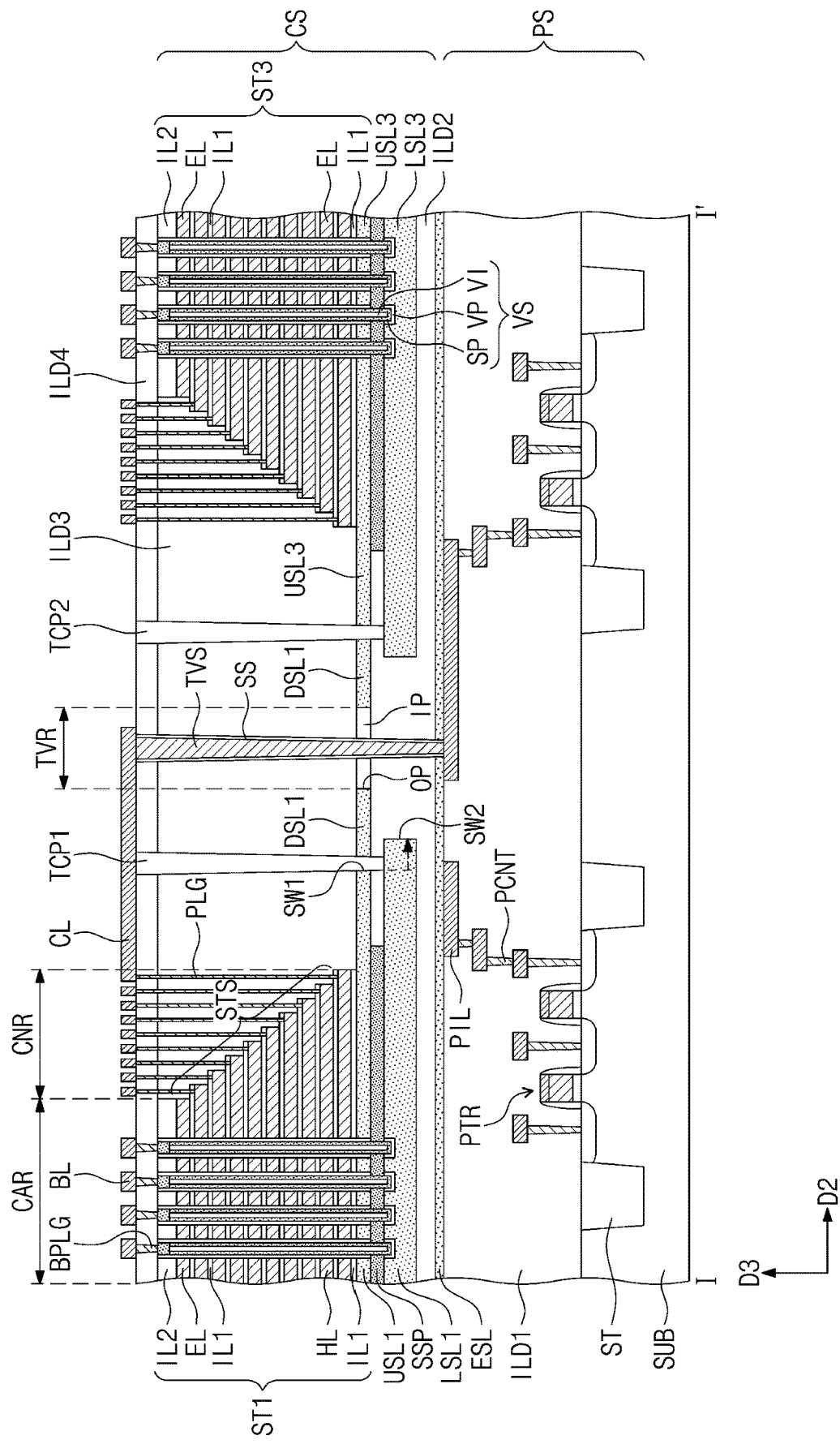
FIG. 25 illustrates a cross-sectional view taken along line I-I' of FIG. 24.

FIG. 24 illustrates a simplified plan view showing a cell array structure of a three-dimensional semiconductor memory device according to example embodiments of the present inventive concepts. FIG. 25 illustrates a cross-sectional view taken along line I-I' of FIG. 24. In the embodiment that follows, a detailed description of technical features repetitive to those discussed above with reference to FIGS. 5, 6A, 6B, and 6C will be omitted, and a difference thereof will be discussed in detail.

Referring to FIGS. 24 and 25, the first lower semiconductor layer LSL1 may have a second sidewall SW2 that protrudes in the second direction D2 beyond a first sidewall SW1 of the first upper semiconductor layer USL1, which first sidewall SW1 is defined by the first cutting structure TCP1. Accordingly, the first cutting structure TCP1 may be positioned on the first lower semiconductor layer LSL1. The first cutting structure TCP1 may not penetrate the first lower semiconductor layer LSL1.

As discussed above, one or more of the lower semiconductor layers LSL1 to LSL4B may prevent the cutting structure TCP from being over-etched, and thus it may be possible to avoid process defects and to increase device reliability.

Figure 26:
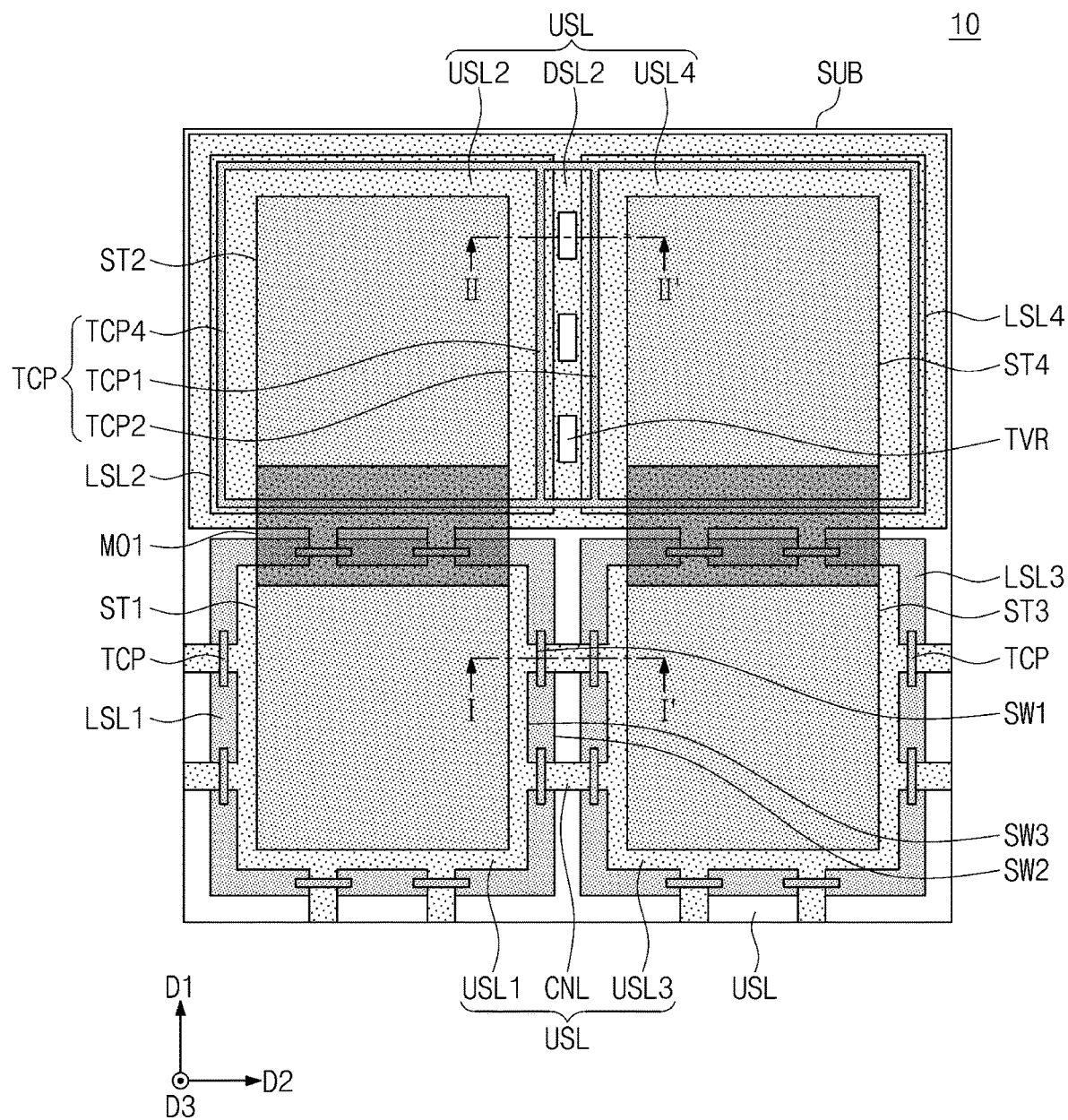
FIG. 26 illustrates a simplified plan view showing a cell array structure of a three-dimensional semiconductor memory device, according to example embodiments of the present inventive concepts.

FIG. 26 illustrates a simplified plan view showing a cell array structure of a three-dimensional semiconductor memory device according to example embodiments of the present inventive concepts. A cross-section taken along line I-I' of FIG. 26 may be substantially the same as that of FIG. 21A, and a cross-section taken along line II-II' of FIG. 26 may be substantially the same as that of FIG. 25.

Referring to FIG. 26, the first and third upper semiconductor layers USL1 and USL3 may be respectively provided on the first and third lower semiconductor layers LSL1 and LSL3. Each of the first and third upper semiconductor layers USL1 and USL3 may have a tetragonal tile shape. The connection patterns CNL may be interposed between the first and third upper semiconductor layers USL1 and USL3.

The second and fourth upper semiconductor layers USL2 and USL4 may be respectively provided on the second and fourth lower semiconductor layers LSL2 and LSL4. The second and fourth upper semiconductor layers USL2 and USL4 may each be formed to have a plate shape. The first and second cutting structures TCP1 and TCP2 may separate the upper semiconductor layer USL shaped like a plate, and thus the second dummy semiconductor layer DSL2 may be defined between the second and fourth upper semiconductor layers USL2 and USL4.

The connection patterns CNL may be interposed between the first and second upper semiconductor layers USL1 and USL2 and between the third and fourth upper semiconductor layers USL3 and USL4.

The cutting structures TCP may separate the first to fourth upper semiconductor layers USL1 to USL4 from each other. When viewed in plan, a bar shape may be given to the cutting structure TCP that penetrates the connection pattern CNL. When viewed in plan, a linear shape may be given to each of the first, second, and fourth cutting structures TCP1, TCP2, and TCP4.

Figure 27:
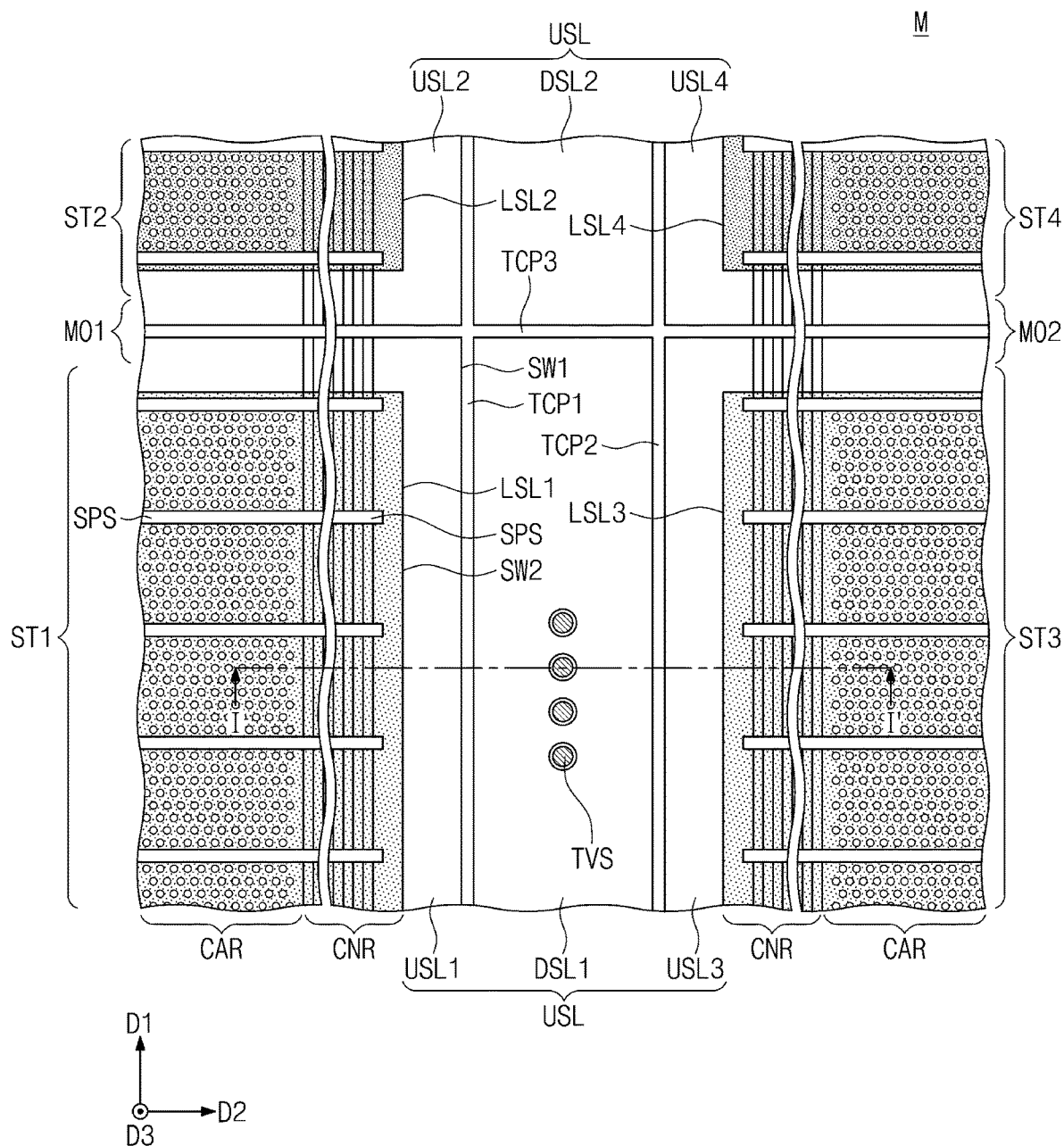
FIG. 27 illustrates an enlarged plan view of section M in FIG. 4, showing a three-dimensional semiconductor memory device, according to example embodiments of the present inventive concepts.
Figure 28:
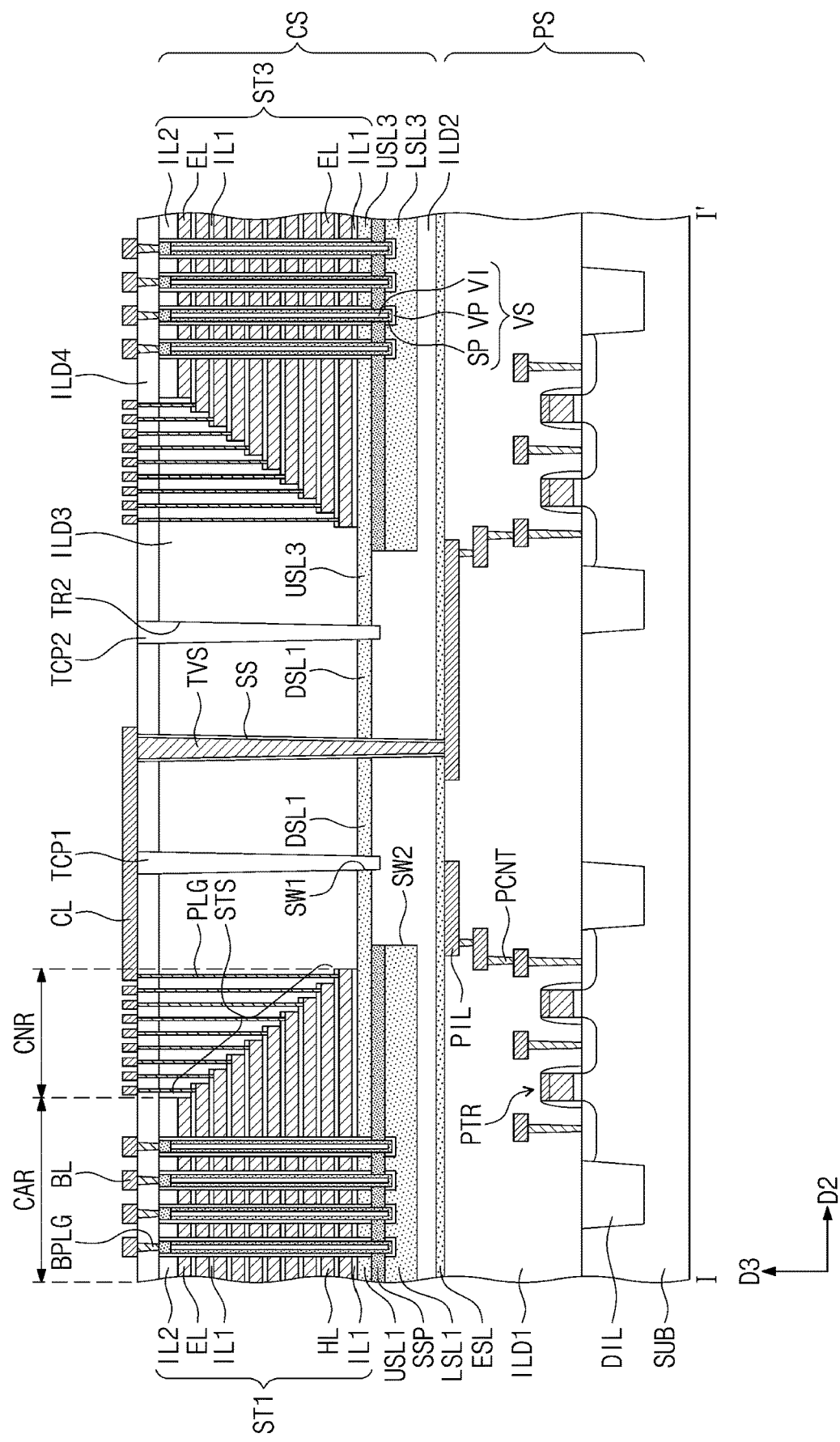
FIG. 28 illustrates a cross-sectional view taken along line I-I' of FIG. 27.

FIG. 27 illustrates an enlarged plan view of section M in FIG. 4, showing a three-dimensional semiconductor memory device according to example embodiments of the present inventive concepts. FIG. 28 illustrates a cross-sectional view taken along line I-I' of FIG. 27. In the embodiment that follows, a detailed description of technical features repetitive to those discussed above with reference to FIGS. 5, 6A, 6B, and 6C will be omitted, and a difference thereof will be discussed in detail.

Referring to FIGS. 27 and 28, differently from the embodiment discussed above in FIGS. 5 and 6A, the dielectric pattern IP may be omitted on the contact region TVR. For example, the through contact TVS may directly penetrate the upper semiconductor layer USL, or the first dummy semiconductor layer DSL1.

The spacer SS may be interposed between the first dummy semiconductor layer DSL1 and the through contact TVS, and may separate the through contact TVS from the first dummy semiconductor layer DSL1. Since the first dummy semiconductor layer DSL has no function for circuitry, no process defects may occur even when the through contact TVS and the first dummy semiconductor layer DSL1 are in direct contact with each other.

According to some example embodiments of the present inventive concepts, during execution of processes that use radio-frequency power, an upper semiconductor layer formed on an entire surface of a first substrate may be electrically grounded through the first substrate. It may be possible to prevent arching caused by accumulation of positive charges on the upper semiconductor layer in the processes that use radio-frequency power. As a result, a three-dimensional semiconductor memory device may be fabricated without process defects due to the arching.

After the processes that use radio-frequency power, a cutting structure may divide the electrically grounded upper semiconductor layer into a plurality of sections (e.g., tiles). Therefore, memory stack structures formed on the sections may be electrically and physically separated from each other. In conclusion, the memory stack structures may be independently performed in operating the three-dimensional semiconductor memory device such as a NAND Flash memory.

Although the present inventive concepts have been described in connection with some example embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the present inventive concepts.

What is claimed is:

1. A semiconductor memory device, comprising:
a second substrate on a first substrate, the second substrate including a lower semiconductor layer and an upper semiconductor layer on the lower semiconductor layer;
an electrode structure including a plurality of electrodes that are stacked on the upper semiconductor layer;
a vertical channel structure that penetrates the electrode structure and is connected to the second substrate;
an interlayer dielectric layer that covers the electrode structure and directly contacts the upper semiconductor layer; and
a cutting structure that penetrates the interlayer dielectric layer and the upper semiconductor layer,
wherein the cutting structure is spaced apart from the electrode structure in a horizontal direction and at least a portion of the interlayer dielectric layer is interposed between the cutting structure and the electrode structure in the horizontal direction,
wherein the upper semiconductor layer has a first sidewall defined by the cutting structure,
wherein the lower semiconductor layer has a second sidewall adjacent to the first sidewall, and wherein the first sidewall and the second sidewall are horizontally offset from each other.

2. The device of claim 1, wherein the first sidewall protrudes in one direction beyond the second sidewall.

3. The device of claim 1,
wherein the second sidewall protrudes in one direction beyond the first sidewall,
wherein the cutting structure penetrates the upper semiconductor layer and is provided on the lower semiconductor layer, and
wherein a bottom surface of the cutting structure is at a higher vertical level than a bottom surface of the lower semiconductor layer.

4. The device of claim 1, wherein the second substrate further includes a source semiconductor layer between the lower semiconductor layer and the upper semiconductor layer,
wherein the vertical channel structure is connected to the source semiconductor layer.

5. The device of claim 1,
wherein, when viewed in plan, the upper semiconductor layer has a tile shape defined by the cutting structure, and
wherein, when viewed in plan, the tile shape corresponds to the electrode structure.

6. The device of claim 1, wherein the upper semiconductor layer includes:
a first upper semiconductor layer;
a second upper semiconductor layer adjacent to the first upper semiconductor layer; and
a connection pattern between the first and second upper semiconductor layers,
wherein the cutting structure separates the connection pattern from the first and second upper semiconductor layers, and
wherein a bottom surface of the cutting structure is at a lower vertical level than a bottom surface of the upper semiconductor layer.

7. The device of claim 1, further comprising:
a peripheral circuit structure between the first substrate and the second substrate; and
a through contact that penetrates the interlayer dielectric layer and is electrically connected to the peripheral circuit structure,
wherein the through contact is spaced apart from the first sidewall.

8. The device of claim 1,
wherein the cutting structure includes an expansion part and an extension part on the expansion part, the expansion part being at a lower portion of the cutting structure, and
wherein a maximum width of the expansion part is greater than a maximum width of the extension part.

9. The device of claim 1,
wherein the cutting structure includes a plurality of dummy contacts and a spacer that surrounds the dummy contacts,
wherein the dummy contacts are arranged along one direction, and
wherein each of the dummy contacts includes a horizontal part and a vertical part on the horizontal part, the horizontal part penetrating the upper semiconductor layer.

10. The device of claim 1, wherein the second substrate further includes a metal pattern below the lower semiconductor layer.

11. A semiconductor memory device, comprising:
a peripheral circuit structure on a substrate, the peripheral circuit structure including a peripheral transistor on the substrate, a peripheral line on the peripheral transistor, and a peripheral contact that electrically connects the peripheral transistor to the peripheral line;
a lower semiconductor layer on the peripheral circuit structure;
an upper semiconductor layer on the lower semiconductor layer;
a cutting structure that penetrates the upper semiconductor layer, a bottom surface of the cutting structure being at a vertical level between a bottom surface of the upper semiconductor layer and a bottom surface of the lower semiconductor layer;
a source semiconductor layer between the lower semiconductor layer and the upper semiconductor layer;
an electrode structure including a plurality of electrodes that are stacked on the upper semiconductor layer;
a vertical channel structure that penetrates the electrode structure and is electrically connected to the source semiconductor layer;
an interlayer dielectric layer that covers the electrode structure and directly contacts the upper semiconductor layer; and
a through contact that penetrates the interlayer dielectric layer and is electrically connected to the peripheral line,
wherein the upper semiconductor layer has a first sidewall defined by the cutting structure, and
wherein the through contact is spaced apart from the first sidewall.

12. The device of claim 11,
wherein the lower semiconductor layer has a second sidewall adjacent to the first sidewall, and
wherein the first sidewall and the second sidewall are offset from each other in one direction.

13. The device of claim 11, wherein the vertical channel structure includes:
a vertical semiconductor pattern having a pipe shape whose top end is opened; and
a vertical dielectric pattern having a data storage layer between the vertical semiconductor pattern and the electrode structure.

14. The device of claim 11, further comprising:
a dummy semiconductor layer that is disposed adjacent to the upper semiconductor layer,
wherein the cutting structure is interposed between the upper semiconductor layer and the dummy semiconductor layer,
wherein the through contact penetrates a through contact region of the dummy semiconductor layer,
wherein the dummy semiconductor layer has both sidewalls opposite to each other, and
wherein one of the both sidewalls is in contact with the cutting structure, and the other of the both sidewalls is spaced apart from the through contact.

15. The device of claim 11, wherein the cutting structure includes a first cutting structure and a second cutting structure that are disposed in parallel in one direction.

* * * * *